US010353295B2

(12) United States Patent
Dmitriev et al.

(10) Patent No.: US 10,353,295 B2
(45) Date of Patent: Jul. 16, 2019

(54) METHOD AND APPARATUS FOR GENERATING A PREDETERMINED THREE-DIMENSIONAL CONTOUR OF AN OPTICAL COMPONENT AND/OR A WAFER

(71) Applicants: Carl Zeiss SMS Ltd., Karmiel (IL); Carl Zeiss SMT GmbH, Oberkochen (DE)

(72) Inventors: Vladimir Dmitriev, Karmiel (IL); Bernd Geh, Scottsdale, AZ (US)

(73) Assignees: Carl Zeiss SMS Ltd., D.N. Misgav (IL); Carl Zeiss SMT GmbH, Oberkochen (DE)

(*) Notice: Subject to any disclaimer, the term of this patent is extended or adjusted under 35 U.S.C. 154(b) by 122 days.

(21) Appl. No.: 15/272,936

(22) Filed: Sep. 22, 2016

(65) Prior Publication Data
US 2017/0010540 A1    Jan. 12, 2017

Related U.S. Application Data
(63) Continuation of application No. PCT/EP2015/056250, filed on Mar. 24, 2015.
(Continued)

(51) Int. Cl.
G03F 1/72    (2012.01)
G03F 7/20    (2006.01)
(Continued)

(52) U.S. Cl.
CPC ............ *G03F 7/70283* (2013.01); *G03F 1/60* (2013.01); *G03F 1/72* (2013.01); *G03F 7/0002* (2013.01);
(Continued)

(58) Field of Classification Search
CPC ... G03F 1/60; G03F 7/72; G03F 7/002; G03F 7/70283; G03F 7/70316; G03F 7/70591;
(Continued)

(56) References Cited

U.S. PATENT DOCUMENTS

2007/0224522 A1    9/2007  Lee et al.
2008/0032206 A1    2/2008  Lee et al.
(Continued)

FOREIGN PATENT DOCUMENTS

JP    2008-096741    4/2008    ............... G03F 1/08
JP    2009-170458    7/2009    ........... H01L 21/027
(Continued)

OTHER PUBLICATIONS

Korean Notice of Reasons for Rejection for Korean Application Serial No. 10-2016-7028830 by Examiner Jongmin Park dated Feb. 1, 2018 (19 pages).
(Continued)

*Primary Examiner* — John A McPherson
(74) *Attorney, Agent, or Firm* — Fish & Richardson P.C.

(57) ABSTRACT

A method for generating a predetermined three-dimensional contour of a component and/or a wafer comprises: (a) determining a deviation of an existing three-dimensional contour of the component and/or the wafer from the predetermined three-dimensional contour; (b) calculating at least one three-dimensional arrangement of laser pulses having one or more parameter sets defining the laser pulses for correcting the determined existing deviation of the three-dimensional contour from the predetermined three-dimensional contour; and (c) applying the calculated at least one three-dimensional arrangement of laser pulses on the component and/or the wafer for generating the predetermined three-dimensional contour.

58 Claims, 27 Drawing Sheets

Related U.S. Application Data

(60) Provisional application No. 61/970,289, filed on Mar. 25, 2014.

(51) Int. Cl.
  *G03F 1/60* (2012.01)
  *G03F 7/00* (2006.01)
  *G21K 1/06* (2006.01)
  *H01L 21/66* (2006.01)
  *B82Y 40/00* (2011.01)

(52) U.S. Cl.
  CPC ...... *G03F 7/70316* (2013.01); *G03F 7/70591* (2013.01); *G21K 1/062* (2013.01); *H01L 22/20* (2013.01); *B82Y 40/00* (2013.01); *H01L 22/12* (2013.01)

(58) Field of Classification Search
  CPC . G03F 1/72; H01L 1/062; H01L 22/12; H01L 22/20; B82Y 40/00
  USPC ................................................ 430/5, 945
  See application file for complete search history.

(56) References Cited

U.S. PATENT DOCUMENTS

| | | |
|---|---|---|
| 2010/0003830 A1 | 1/2010 | Itoh |
| 2011/0255065 A1 | 10/2011 | Oshemkov et al. |
| 2012/0009511 A1 | 1/2012 | Dmitriev |
| 2012/0084044 A1 | 4/2012 | Dmitriev |

FOREIGN PATENT DOCUMENTS

| | | | | |
|---|---|---|---|---|
| JP | 2010-044287 | 2/2010 | ............... | G03F 1/14 |
| JP | 2012-022323 | 2/2012 | ............... | G03F 1/72 |
| JP | 2012-088712 | 5/2012 | ............... | G03F 1/00 |
| WO | WO 2012/103933 | 8/2012 | ............. | B23K 26/00 |
| WO | WO 2013/030820 | 3/2013 | ............... | G03F 1/72 |

OTHER PUBLICATIONS

Notification of Reasons for Refusal from the Japanese Patent Office for Japanese Application No. 2016-559363 by Examiner Hayato Akao dated Oct. 23, 2017 (13 pages including English Translation).
International Search Report and Written Opinion of the International Searching Authority for International Application No. PCT/EP2015/056250 by Examiner Jens Weckesser dated Sep. 30, 2015 (11 pages).
Tran, et al., "Femtosecond laser processing of crystallin silicon", DSpace@MIT (2005).

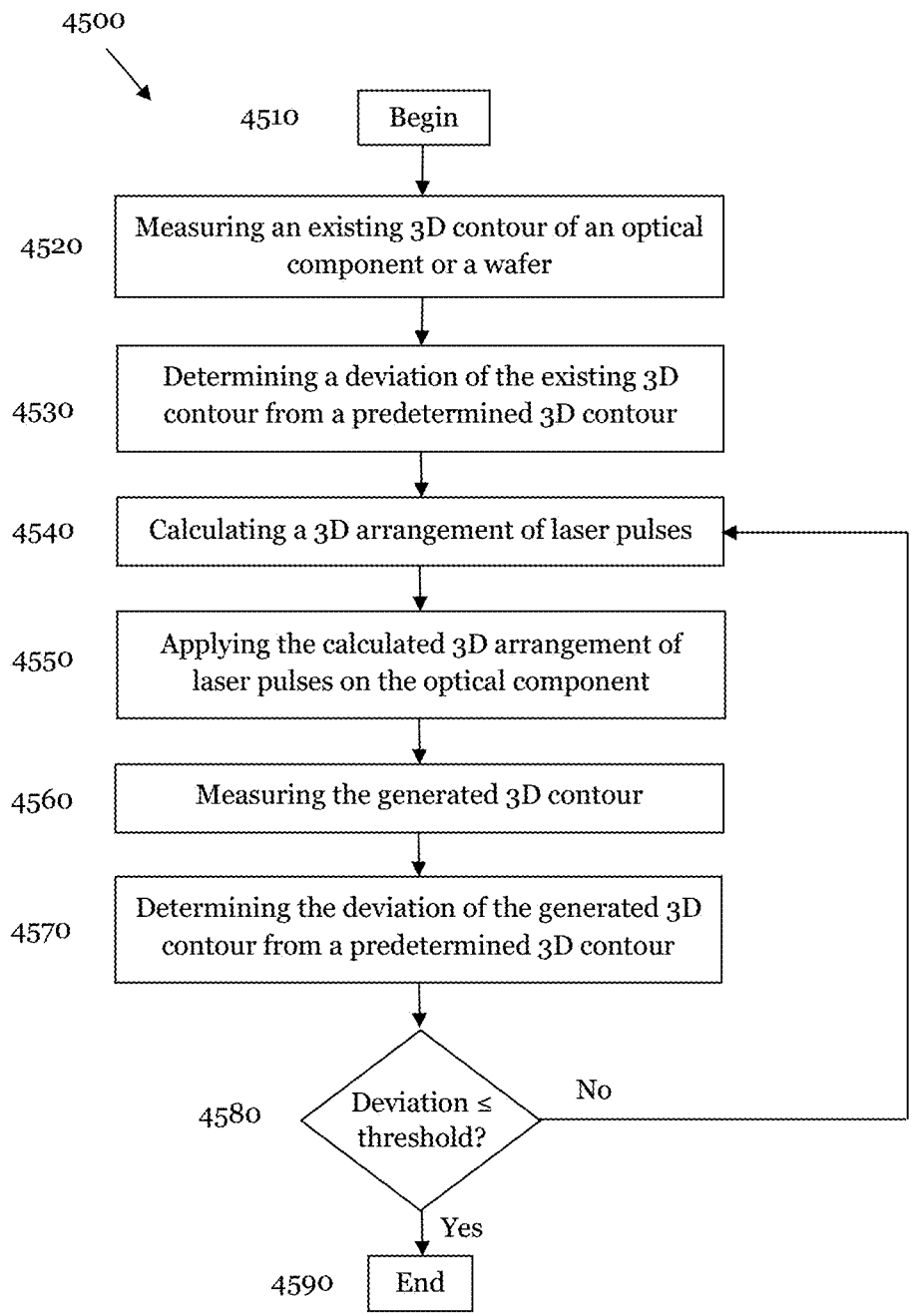

METHOD AND APPARATUS FOR GENERATING A PREDETERMINED THREE-DIMENSIONAL CONTOUR OF AN OPTICAL COMPONENT AND/OR A WAFER

CROSS-REFERENCE TO RELATED APPLICATIONS

This application is a continuation of PCT/EP2015/056250, filed on Mar. 24, 2015, which claims priority to U.S. Provisional Application 61/970,289, filed on Mar. 25, 2014. The contents of the above applications are herein incorporated by reference in their entirety.

TECHNICAL FIELD

The present invention relates to the field of generating a predetermined three-dimensional contour of an optical component and/or a wafer.

BACKGROUND

Optical systems have to fulfil increasing demands with respect to their performance. For example, the size of optical components of telescopes steadily increases in order to collect a limited number of photons originating from far distant objects. Slightest deviations of optical components from their predefined surface forms result in a reduction of optical capabilities of the telescopes or generally of optical systems.

On the other hand, microscopes have for example to resolve objects having a very low contrast compared to their surroundings. Moreover, it is requested that projection systems of lithography devices resolve smaller and smaller structures.

Integrated circuits (ICs) are another kind of devices which has to also fulfil steadily increasing demands. According to Moore's law the minimum dimension of structural elements generated on wafers in order to fabricate ICs continuously shrinks.

In the following, the increasing demand on optical systems is exemplified for projection systems, in particular photolithographic projection exposure systems.

As a result of the constantly increasing integration density in the semiconductor industry, photolithographic projection exposure systems and photolithographic masks have to project smaller and smaller structures onto the photoresist arranged on a wafer. In order to fulfil this demand, the exposure wavelength of projection exposure systems has been shifted from the near ultraviolet across the mean ultraviolet into the deep ultraviolet region of the electromagnetic spectrum. Presently, a wavelength of 193 nm is typically used for the exposure of the photoresist on wafers.

As a consequence, the manufacturing of optical components of projection exposure systems is becoming more and more complex, and thus more and more expensive as well. In the future, projection exposure systems will use significantly smaller wavelengths in the extreme ultraviolet (EUV) wavelength range of the electromagnetic spectrum (e.g. in the range of 10 nm-15 nm).

In such a wavelength range, EUV optical elements, as for example mirrors or photolithographic masks, have to fulfil highest demands with respect to planarity, pureness and temperature stability. The tolerable deviation of the substrates of these optical elements regarding the planarity is only a portion of a wavelength of the exposure wavelength in order to not significantly disturb the phase front of the electromagnetic wave reflected from a multi-layer structure arranged on a surface of the substrate. Larger deviations of the planarity of the substrate of EUV mirrors and masks may lead to variations of the optical intensity distribution in the photoresist due to a (partial) constructive or destructive addition of the wave front in the photoresist of the wafer. At the further processing of the wafer, the variations of the optical intensity may result in the fabrication of defective semiconductor devices as for examples ICs.

EUV substrates as supplied from the manufacturer may not even fulfil the planarity condition for EUV mirrors and masks. Further, the manufacturing process of mirrors and masks which forms a multilayer structure and fine patterns on one surface of the multilayer structure, respectively, may even deteriorate the planarity of the substrate.

The applications U.S. Ser. No. 13/179,799, filed on Jul. 11, 2011, and U.S. Ser. No. 13/252,480, filed on Oct. 4, 2011, of the applicant describe a two-dimensional model to correct registration errors, transmission errors of transmissive masks, and overlay errors of different masks. They are hereby incorporated herein in their entirety by reference.

The U.S. application Ser. No. 13/084,991, filed on Apr. 12, 2011, of the applicant discloses a method for locally correcting a substrate thickness defect of an EUV mask by the generation of color centers inside the substrate surface. This document is also incorporated herein in its entirety by reference.

Furthermore, a curvature of the substrate of a photolithographic mask may also lead to imaging errors of an EUV mask. The U.S. 2008/0 032 206 A1 describes a method to improve the planarity of a manufactured photolithographic mask. To adjust a curvature of the substrate or to smooth an unevenness of the substrate, this document proposes forming expansion stress and/or compaction stress generation portions in a predetermined region of the substrate which includes the curved region. The expansion stress and compaction stress generation portions are generated by focussing femtosecond laser pulses in this region which locally modify the bonding state of the substrate.

The documents outlined above provide approximations for the correction of defects of existing optical components. However, the ever increasing defect correction requirements of future high performance optical components are still not met.

Moreover it is observed that wafers sometimes bend during the manufacturing process so that it is difficult to clamp the wafers with a vacuum chuck. The bending seems to be caused by stress which is introduced into the wafer during the manufacturing process of ICs. Presently, wafer bending occurring during the processing of the wafer can only be lowered by reducing the stress induced by various processing steps of the manufacturing process. For this purpose, the processing steps have to be modified. This is an involved task due to the highly complex sequence of processing steps required to fabricate modern ICs. Additionally, it may also be necessary to tolerate performances losses in the electrical function of the fabricated ICs.

As an alternative approach, layers are at the moment developed which can be applied to the rear surface of a wafer and which reduce the bending effect of various processing steps. Adding an additional layer to the rear wafer side would introduce further processing step in an already involved manufacturing process of modern ICs.

SUMMARY

In a general aspect, the present invention provides an improved method and apparatus for generating high performance optical components and/or wafers.

According to a further general aspect of the invention, a method for generating a predetermined three-dimensional contour of an optical component and/or a wafer comprises: (a) determining a deviation of an existing three-dimensional contour of the optical component from the predetermined three-dimensional contour; (b) calculating at least one three-dimensional arrangement of laser pulses having one or more parameter sets defining the laser pulses for correcting the determined existing deviation of the three-dimensional contour from the predetermined three-dimensional contour; and (c) applying the calculated at least one three-dimensional arrangement of laser pulses on the optical component and/or the wafer for generating the predetermined three-dimensional contour.

The three-dimensional (3D) approach of the present invention establishes a relation between the laser beam parameters and the parameters of the 3D arrangement of laser pulses on the one hand and the volume deformations induced by a 3D arrangement of laser pulses in an optical component and/or a wafer on the other hand. The establishment of such a relation allows the determination of parameters of the laser beam and the 3D arrangement of laser pulses necessary of the generation of a predetermined 3D contour of the optical component and/or the wafer.

Thus, the approach of the inventive method for the calculation of a 3D arrangement of laser pulses takes into account the 3D nature of optical components and/or wafers. Therefore, it overcomes most of the drawbacks of a two-dimensional approximation as well as of a phenomenological approach typically used up to now. Thus, the inventive method allows calculating one or more 3D arrangements of laser pulses having a single or several parameter sets defining the laser pulses which correct a determined deviation of an optical component and/or a wafer from its predetermined 3D contour. In one embodiment, the inventive method enables the simultaneous correction of deviations of a 3D contour parallel and perpendicular to a surface of an optical component and/or a wafer. Moreover, the inventive method does not only allow correcting of defects of an optical component or a wafer, but also the fabrication of specific optical components from a blank or from a standard optical component.

According to a further aspect, method step (b) further comprises determining elementary volume deformations induced in the optical component and/or the wafer by predefined three-dimensional arrangements of laser pulses having predefined parameter sets and/or having predefined distances of laser pulses in three directions in the arrangements of laser pulses, wherein the three directions are not within a plane.

According to a further aspect, step (b) further comprises determining elementary volume deformations induced in the optical component and/or the wafer by sequentially applying predefined three-dimensional arrangements of laser pulses, the predefined three-dimensional arrangements of laser pulses comprising laser pulses having predefined parameter sets and/or having predefined distances of laser pulses in three directions in the three-dimensional arrangements of laser pulses, wherein the three directions are not within a plane.

For specific materials and/or for specific deviations it may be beneficial to determine the effect of specific predefined arrangements of laser pulses by writing specific predefined 3D arrangements in the material of the optical component and/or the wafer. From the measured volume deformations induced by a number of predefined 3D arrangements of laser pulses, the parameters of the laser pulses and the parameters of the 3D arrangement of laser pulses are calculated for correcting a determined deviation of a 3D contour of an optical component and/or a wafer from their predetermined contours. This approach avoids the determination of deformation volumes from material parameters and complex calculations.

The situation is illustrated in a simple example. For example, a first 3D arrangement of laser pulses is applied to the optical component and/or the wafer in which a (linear) density of laser pulses is higher in the x-direction than in the y-direction. Then in a next step a second 3D arrangement of laser pulses is applied to the optical component and/or the wafer in which the (linear) density of laser pulses is higher in the y-direction than in the x-direction. Alternatively, the density may be kept fixed within the 3D arrangement of laser pulses and a parameter of the laser pulses may be varied.

In another aspect, calculating the at least one three-dimensional arrangement of laser pulses comprises: (d) setting up a target functional comprising deviations of the existing three-dimensional contour of the optical component and/or the wafer from the predetermined three-dimensional contour and volume deformations induced by the at least one three-dimensional arrangement of laser pulses; and (e) minimizing the target functional by varying the at least one three-dimensional arrangement of laser pulses. Varying the at least one three-dimensional arrangement of laser pulses comprises varying at least one parameter of the laser pulses.

A further aspect comprises using a Lagrange variational principle for minimizing the target functional.

According to still another aspect, the parameter set defining the laser pulses comprises: an energy of the laser beam, a pulse length, a repetition rate, a number of pulses directed onto one location of the optical component and/or the wafer, a beam polarization, a numerical aperture, a focus size, a beam shape, and/or an astigmatism.

In still a further aspect, parameters of the at least one three-dimensional arrangement of laser pulses comprises a size of the arrangement in three directions and a distance between locations of two or more incident laser pulses in three dimensions. In one aspect different laser pulses generate pixels which do not overlap in an area normal to a beam direction in the three-dimensional arrangement of laser pulses. In an alternative aspect, laser pulses generate two or more pixels which partially or essentially fully overlap in the area normal to the beam direction in the three-dimensional arrangement of laser pulses. In a further aspect two or more pixels overlapping in the area normal to the beam direction fully or partially overlap in the beam direction.

In the case of non-overlapping pixels the effect of the arrangement of laser pulses on an optical component and/or the wafer can be calculated by summing up the effects of the individual pixels. In case of partially or fully overlapping pixels, it is not possible to determine the effect of the three-dimensional arrangement of laser pulses by simply adding the effects of individual laser pulses forming a pixel.

Yet another aspect further comprises modifying a mass density and/or an optical transmission of the optical component and/or the wafer by a stress distribution induced by a strain distribution caused by laser pulses, and wherein the stress distribution and the strain distribution are connected by Hooke's law.

A further favourable aspect comprises introducing a three-dimensional grid with nodes $N_i$ penetrating the optical component and/or the wafer, the three-dimensional grid nodes $N_i$ defining elementary volumes $\alpha$. In the present application the terms elementary volumes and elementary cells are used as synonyms.

According to still another aspect, a displacement $\xi_i$ of the three-dimensional grid node $N_i$ is a function of the parameter set of the laser pulses and/or the parameters of the at least one arrangement of laser pulses. Another aspect further comprises determining at least one three-dimensional writing density $\alpha^\alpha$ and a plurality of writing mode signatures $MS_i^m$, wherein $MS_i$ denotes the components of a single writing mode signature and the index m counts the plurality of writing mode signatures. In case of several three-dimensional writing densities $\alpha_m^\alpha$ the index m also counts the number of writing densities.

In a preferred aspect, the three-dimensional writing density $\alpha^\alpha$ in an elementary volume $\alpha$ and the writing mode signature $MS_i$ introduce a displacement $\xi_n$ given by $$\xi_n = \sum_{o=0}^{8 \cdot K_x \cdot L_y \cdot M_z} \sum_{k=0}^{7} \sum_{s=0}^{2} \sum_{a=1}^{K_x \cdot L_y \cdot M_z} \sum_{i=0}^{17} (P_{no}^g)^{-1} P_{oksa}^w a^\alpha \eta_{(3k+s)i} MS_i,$$

wherein the tensor $(P_{no}^g)^{-1}$ is the inverse tensor of a potential energy operating in a displacement space, and $P_{oksa}^w$ is an element of the tensor describing the potential operating in a space of normal elementary volume deformation modes, both tensors comprising material parameters of the optical component and/or the wafer, and wherein $$\sum_{j=0}^{17} \eta_{ij} MS_j$$

are projections of equilibrium deformation displacements for unity writing to the writing mode signature $MS_i$.

This equation connects parameters of the laser pulses and/or the 3D arrangement of laser pulses with their effect onto the optical component and/or the wafer. This means that the inventive method uses material parameters of the optical component and/or the wafer and basic physical law in order to determine the effect that a beam of light pulses induces in a substrate material of the optical component and/or the wafer.

In another aspect, a three-dimensional writing density $\alpha^\alpha$ of an arrangement of laser pulses across the optical component and/or the wafer induces a displacement $\xi_n$ of the grid nodes $N_n$ of the optical component and/or the wafer given by $$\xi_n = \sum_{0=1, a=1}^{8 \cdot K_x \cdot L_y \cdot M_z, K_x \cdot L_y \cdot M_z} (P_{no}^g)^{-1} A_{o\alpha} a^\alpha,$$

wherein the tensor $(P_{no}^g)^{-1}$ is the inverse tensor of a potential operating in the displacement space, and $$A_{n\alpha} = \sum_{l=0, t=0}^{7,2} P_{nlt\alpha}^w e_{lt},$$

wherein $P_{nlt\alpha}^w$ is an element of the tensor describing the potential operating in the space of normal elementary volume deformation modes, both tensors comprise material parameters of the optical component and/or the wafer, and wherein $e_{lt}$ are equilibrium deformation displacements of the grid nodes $N_i$ of the elementary volume $\alpha$ for a unity writing density.

According to still a further aspect, the three-dimensional writing densities $\alpha_m^\alpha$ of R arrangements of laser pulses across the optical component and/or the wafer superimposed in an elementary volume $\alpha$ introduce a displacement $\xi_n$ given by $$\xi_n = \sum_{0=1, a=1, m=1}^{8 \cdot K_x \cdot L_y \cdot M_z, K_x \cdot L_y \cdot M_z, R} (P_{no}^g)^{-1} A_{o\alpha} a_m^\alpha.$$

In a further aspect, the at least one writing density of the laser beam is below a damage threshold of the optical component and/or the wafer. In an alternative aspect, the at least one writing density of the laser beam is above the damage threshold of the optical component and/or the wafer.

Another aspect further comprises determining a displacement $\xi_n$ of the three-dimensional grid $N_n$ in an elementary volume $\alpha$ of the optical component and/or the wafer without interactions of the elementary volume $\alpha$ with other elementary volumes of the optical component and/or the wafer. Still a further aspect comprises determining a total deformation of the optical component and/or the wafer by combining the elementary volumes of the optical component and/or the wafer by combining the elementary volumes and minimizing an accumulated potential energy of the combined elementary volumes.

The approach of the last aspect facilitates the complex calculation of the parameters of the laser pulses and the 3D arrangement of laser pulses. Furthermore, the effects of the laser pulses are small in the material of an optical component and/or the wafer and as the experimental resolution is presently limited this approach may be very useful.

According to another aspect, step (a) further comprises measuring the existing three-dimensional contour of the optical component and/or the wafer. In another aspect measuring the existing three-dimensional contour further comprises using a contact profilometer, a pseudo-contact profilometer, a non-contact profilometer, an interferometer, a white light interferometer, a confocal microscope, a photomask metrology tool, a scanning electron microscope and/or a combination of these devices.

According to a further aspect, step (a) further comprises determining deviations $\Delta \varphi_i$ of the three-dimensional contour of the optical component and/or the wafer at positions i from the difference of the determined existing locations $\varphi_i^{d\ et.}$ and the predetermined locations $\varphi_i^{pred\ et.}$. In a further aspect, step (b) further comprises minimizing the target functional $$\min \left\{ \sum_{i=1}^{L} (\Delta \varphi_i + \zeta_i)^2 + \sum_{m=1, j=1}^{R, K_x \cdot L_y \cdot M_z} \lambda_m^a a_j^{m2} \right\},$$

wherein $\zeta_i$ is the displacement at the position i generated by R writing densities $\alpha_j^m$, and wherein the last term is a Tikhonow regularization with the regulation coefficients $\lambda$.

A beneficial aspect further comprises applying laser pulses to the optical component and/or the wafer which can essentially transmit the optical component and/or the wafer.

In this context as well as on further positions of this description the term "essentially" means a numeric value of a quantity within its measurement limit.

Another aspect further comprises selecting a wavelength of the laser pulses so that a photon energy of the laser pulses is lower than a band gap energy of the optical component and/or the wafer.

In still a further aspect, the photon energy of the laser pulses is lower than 0.95, preferred lower than 0.9, more preferred lower than 0.8, and most preferred lower than 0.7 the band gap energy of the optical component and/or the wafer.

According to an advantageous aspect, the photon energy of the laser pulses is lower than 0.95, preferred lower than 0.9, more preferred lower than 0.8, and most preferred lower than 0.7 the band gap energy of the material of a processed wafer having the lowest band gap energy, and wherein the processed wafer comprises one or more integrated circuits or at least a part of the one or more integrated circuits.

In a further aspect, the optical component comprises an optical component for extreme ultraviolet wavelength radiation, in particular a mirror or a photolithographic mask for extreme ultraviolet radiation.

According to another aspect, the optical component for extreme ultraviolet wavelength radiation comprises a transparent conductive coating on a rear surface which is opposite to a front surface having a multilayer structure, and wherein the transparent conductive layer is optically transparent in the near infrared, the visible, and/or the near ultraviolet wavelength range. In still a further aspect, the transparent conductive coating comprises tin oxide, indium tin oxide, antimony tin oxide, aluminium zinc oxide, or a combination of these materials.

In still another aspect, step (a) comprises determining a flatness deviation of the rear surface of the optical component for extreme ultraviolet radiation, and step (c) comprises applying the calculated at least one three-dimensional arrangement of laser pulses for flattening the rear surface of the optical component for extreme ultraviolet radiation. According to yet a further aspect, step (a) comprises determining the flatness deviation of the rear surface of a photolithographic mask for extreme ultraviolet radiation after arranging the multilayer structure and an absorber layer on the front surface, but before patterning the absorber layer, and step (c) comprises applying the calculated at least one three-dimensional arrangement of laser pulses for flattening the rear surface of the photolithographic mask for extreme ultraviolet radiation.

In yet another aspect, step (a) comprises determining the flatness deviation of the rear surface of the optical component for extreme ultraviolet radiation after removing the multilayer structure from a peripheral area of the front surface, and step (c) comprises applying the calculated at least one three-dimensional arrangement of laser pulses for flattening the rear surface of the optical component for extreme ultraviolet radiation. According to still a further beneficial aspect, step (a) comprises determining the flatness deviation of the multilayer structure of the optical component for extreme ultraviolet radiation from a predetermined flatness of the multilayer structure, and step (c) comprises applying the calculated at least one three-dimensional arrangement of laser pulses for generating the predetermined flatness of the multilayer structure of the optical component for extreme ultraviolet radiation.

The inventive method can be applied between various steps in the fabrication process of an EUV mask in order to avoid the generation of defects during the mask fabrication process.

According to another aspect, step (a) comprises determining the deviation of pattern elements of a transmissive photolithographic mask from a predetermined pattern, and step (c) comprises applying the calculated at least one three-dimensional arrangement of laser pulses for generating the predetermined pattern. According to a beneficial aspect, step (a) comprises determining the deviation of an optical transmission across a transmissive photolithographic mask from a predetermined optical transmission, and step (c) comprises applying the calculated at least one three-dimensional arrangement of laser pulses for generating the predetermined optical transmission. In another aspect, step (a) comprises determining the deviation of pattern elements and the optical transmission across a transmissive photolithographic mask from the predetermined pattern and the predetermined optical transmission, and step (c) comprises applying the calculated at least one three-dimensional arrangement of laser pulses for simultaneously generating the predetermined pattern and the predetermined optical transmission across the transmissive photolithographic mask.

It is one of the advantages of the 3D approach of the inventive method to enable the correction of several deficits of an optical component by the application of a single 3D arrangement of laser pulses or by a single writing step.

In a further aspect, step (a) comprises determining the deviation of a flat optical component from a predetermined three-dimensional optical contour, and step (c) comprises applying the calculated at least one three-dimensional arrangement of laser pulses for generating the predetermined three-dimensional optical contour of the originally flat optical component.

By using a 3D approach the inventive method has the potential to fabricate specific optical components from a given blank.

In still another aspect, step (a) comprises determining a deviation of a spherical contour of an optical component from a predetermined aspherical contour, and step (c) comprises applying the calculated at least one three-dimensional arrangement of laser pulses for generating the predetermined aspherical contour of the optical component.

Moreover, the inventive method allows fabricating of specific optical components from standard cost-effective optical components. If the 3D contour of the standard optical component is provided by the manufacturer of the standard component, step (a) of the inventive method does not have to be performed.

According to another preferred aspect, step (a) comprises determining the deviation of a contact surface of a frustrated total internal reflection shutter from a predetermined contact surface of the frustrated total internal reflection shutter, and step (c) comprises applying the calculated at least one three-dimensional arrangement of laser pulses for generating the predetermined contact surface of the frustrated total internal reflection shutter.

In a further aspect, step (a) comprises determining the deviation of the three-dimensional contour of a nanoimprint lithography template from the predetermined three-dimensional contour of the nanoimprint lithography template, and step (c) comprises applying the calculated at least one three-dimensional arrangement of laser pulses for generating the predetermined three-dimensional contour of the nanoimprint lithography template.

According to another beneficial aspect, the wafer comprises a semiconductor material, or the wafer comprises compound semiconductor material. In an advantageous aspect, the semiconductor material comprises silicon. In a preferred aspect, the wafer comprises at least a portion of one or more integrated circuits.

Apart from optical components, wafers are a second kind of components or devices to which the above defined method can be applied. As already mentioned in the second part of this description, wafers may bend during the fabrication steps in a semiconductor factory. The bending gets worse with shrinking structural elements and more complex ICs. The method described above can be used within the production process of ICs to correct a bending of processed or partly processed wafers accumulated during the manufacturing process in a semiconductor factory. Thus, the defined method can at least partly avoid performance losses of future ICs.

In another aspect, the wafer comprises silicon and the wavelength of the laser pulses are in the range of 1.0 µm-8.0 µm, preferred 1.3 µm-7.0 µm, and most preferred from 1.5 µm-6.0 µm.

A further aspect comprises selecting a wavelength for the laser pulses so that the energy of the laser pulses is close to the band gap energy of the wafer. In still another aspect, the wafer comprises silicon and the wavelength of the laser pulses is <1300 nm, more preferred <1200 nm, and most preferred <1100 nm.

According to a preferred aspect, the introduction of the calculated at least one three-dimensional arrangement of laser pulses into the wafer bends the wafer. In a beneficial aspect, the introduction of the calculated at least one three-dimensional arrangement of laser pulses into the wafer compensates the bending of the wafer occurring during processing the wafer.

In another aspect, the at least one three-dimensional arrangement of laser pulses is asymmetrically introduced into the wafer with respect to the depth of the wafer.

In still a further aspect, the wafer comprises a microelectromechanical system (MEMS) and/or a photonic integrated circuit.

A further aspect comprises introducing the calculated at least one three-dimensional arrangement of laser pulses into the wafer through a front side of the wafer, wherein the wafer is processed on the front side to generate one or more integrated circuits. According to yet another aspect, the energy of the laser pulses is lower than the material of the integrated circuits having the lowest band gap energy.

Another aspect comprises introducing the calculated at least one three-dimensional arrangement of laser pulses into the wafer through a rear side of the wafer, which is opposite to the front side on which the wafer is processed to generate one or more integrated circuits.

A further beneficial aspect further comprises: (f) determining a remaining deviation of a generated three-dimensional contour of the optical component and/or the wafer from the predetermined three-dimensional contour; (g) ending the method if the remaining deviation is smaller than a predetermined threshold; and (h) repeating steps (b) and (c) if the remaining deviation is larger or equal than the predetermined threshold.

In another advantageous aspect, the optical component is optically transparent in the near infrared, the visible and/or the near ultraviolet wavelength range.

This aspect secures that step (c) of the inventive method can actually be performed on the optical component and/or the wafer.

According to a further aspect, an apparatus for generating a predetermined three-dimensional contour of an optical component and/or a wafer comprises: (a) a metrology tool operable to determine a deviation of an existing three-dimensional contour of the optical component and/or the wafer from the predetermined three-dimensional contour; (b) a computing unit operable to calculate at least one three-dimensional arrangement of laser pulses having one or more parameter sets defining the laser pulses for correcting the determined existing deviation of the three-dimensional contour from the predetermined three-dimensional contour; and (c) a light source operable to apply the calculated at least one three-dimensional arrangement of laser pulses for generating the predetermined three-dimensional contour of the optical component and/or the wafer.

In another aspect, the metrology tool comprises a contact profilometer, a pseudo-contact profilometer, a non-contact profilometer, an interferometer, a white light interferometer, a confocal microscope, a photomask metrology tool, and/or a scanning electron microscope.

According to a further beneficial aspect, the computing unit comprises a microprocessor, a general purpose processor, a special purpose processor, a central processing unit and/or a combination thereof.

In still another aspect, the light source comprises a laser source operable to generate a beam of ultra-short laser pulses and a scanning means operable to generate the at least one arrangement of laser pulses. In yet a further aspect, the laser source comprises a Ti: sapphire laser system and/or a YAG laser system doped with at least one element of the group which comprises: neodymium (Nd), thulium (Tm), holmium (Ho), and erbium (Er). Finally, the apparatus is adapted to be integrated in a semiconductor manufacturing equipment in a semiconductor factory.

DESCRIPTION OF DRAWINGS

In order to better understand the present invention and to appreciate its practical applications, the following Figures are provided and referenced hereafter. It should be noted that the Figures are given as examples only and in no way limit the scope of the invention.

FIG. 45 presents a flow chart of the inventive method;

DETAILED DESCRIPTION

This part of the specification is organized as follows: It begins with the description of some optical components and some exemplified apparatuses used for the determination of an existing three-dimensional (3D) contour of the optical component for the calculation of a 3D arrangement of laser pulses and for the application of the calculated 3D arrangement of laser pulses onto an optical element in order to bring the existing 3D contour in accordance with a predetermined 3D contour. In the second part entitled "application examples" the inventive method is applied in part a. to generate predetermined 3D contours of photolithographic masks and in part b. of wafers. Finally, the theoretical and/or mathematical background of the inventive method necessary for the discussion of the various examples in this section is presented in an own section entitled "theoretical background".

Examples of an Optical Component, a Metrology Tool and a Laser System

In the following, the present invention will be more fully described hereinafter with reference to the accompanying Figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

In the following, the present invention is described by taking photolithographic masks and wafers as examples. However, the present invention can also be applied to optical elements used in telescopes, microscopes and/or laser system to just mention a few examples. Further, the operation wavelength range of optical components is not restricted to the wavelengths used in lithography. Rather, the optical components may be processed with the inventive method across the entire optical range. Moreover, the present invention is not restricted to silicon wafers as described below. Rather, it can be applied to all kind of wafers during the fabrication processes of any kind of integrated circuits.

Finally, the method defined in the third section of this description can be applied to all components whose material(s) is (are) transparent for a specific wavelength range of the electromagnetic spectrum. If a material of a component fulfils this requirement pixels can be introduced into the material of the component. The transparent wavelength range needs only to be small (<100 nm) since laser systems are typically utilized to generate the laser pulses for writing pixels into the material of the component. It is presently preferred that the transparent wavelength range of a material of a component is in the ultra-violet, the visible and/or the infrared part of the electromagnetic spectrum as numerous laser sources are available for these spectral ranges.

Figure 1:
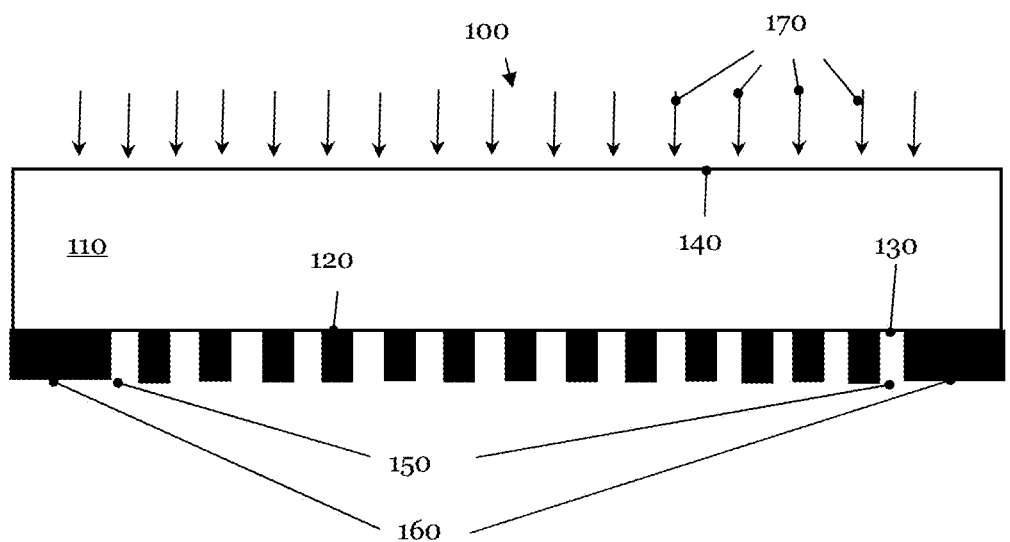
FIG. 1 shows in cross-section a schematic view of a transmissive photolithographic mask.

FIG. 1 represents a schematic cross-section view of a transmissive photolithographic mask 100. The mask 100 comprises a substrate 110 having a first or front surface 130 and a second or rear surface 140. The substrate 110 has to be transparent for the wavelength used for the illumination of a photoresist on a wafer. The exposure wavelength may be in the deep ultraviolet (DUV) spectral range of the electromagnetic spectrum, in particular around 193 nm. The substrate material comprises typically quartz. The substrate has typical lateral dimensions of 152 mm×152 mm and a thickness or height of essentially 6.35 mm. The substrate 110 of the photolithographic mask 100 has on its front surface 130 pattern elements 120 normally fabricated from chromium which form on the photoresist the predetermined structure elements from which semiconductor devices are produced. The portion of the substrate 110 of the photolithographic mask 100 carrying pattern elements 120 is called active area 150 of the mask, whereas the boundary portion or the peripheral part which does not have pattern elements 120 is called non-active area 160. A laser beam 170 at the exposure wavelength illuminates the substrate 110 of the mask 100 through the second or rear surface 140 of the substrate 110.

Figure 2:
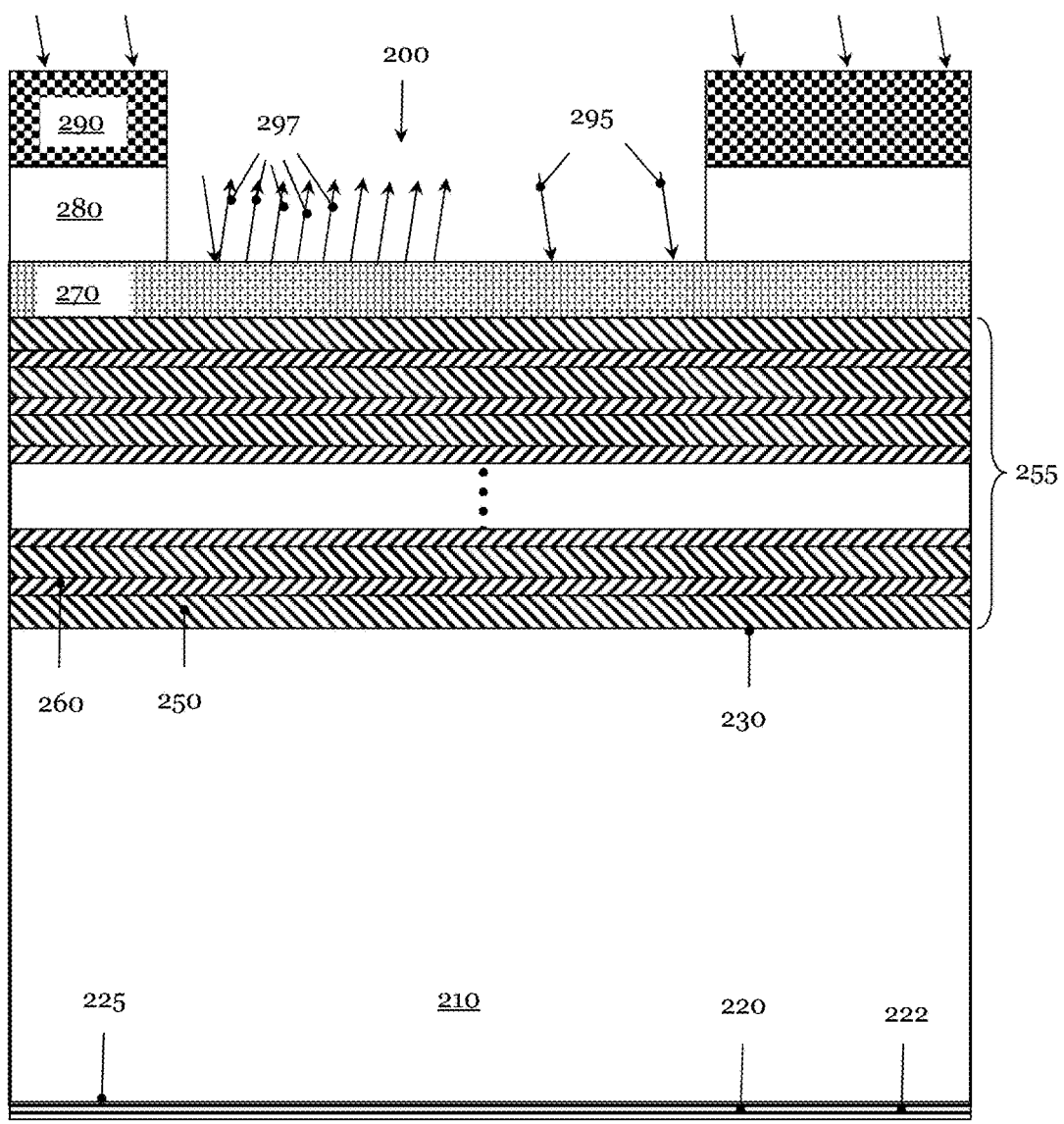
FIG. 2 shows in cross-section a schematic view of a reflective photolithographic mask.

FIG. 2 shows a schematic cross-sectional view of a reflective photolithographic mask 200 for future use in the extreme ultraviolet (EUV) spectral range of the electromagnetic spectrum, in particular for an exposure wavelength in the range of 10 nm to 15 nm. Different from the photolithographic mask 100 of FIG. 1, the mask 200 is a reflective optical component based on a multi-layer mirror structure 255. The multi-layer mirror system 255 of the photolithographic mask 200 is deposited on a front substrate surface 230 of a suitable substrate 210, such as a fused silica substrate. Other transparent dielectrics, glass materials or semiconducting materials may also be applied as substrates for EUV photolithographic masks as for example ZERODUR®, ULE® or CLEARCERAM®.

The multi-layer mirror system 255 comprises, for example, approximately 40 pairs of alternating molybdenum (Mo) 250 and silicon (Si) layers 260. The thickness of each Mo layer 250 is 4.15 nm and that of the Si layer 260 amounts to 2.80 nm. In order to protect the multi-layer structure 255, a capping layer 270 of silicon with a native oxide of 7 nm depth is arranged on top of the structure 255. In the multi-layer mirror system 255, the Mo layers 250 act as scattering layers, whereas the silicon layers 260 function as separation layers. For the scattering layers instead of Mo other elements with a high Z number may utilized, such as cobalt (Co), nickel (Ni), tungsten (W), rhenium (Re) and iridium (Ir).

The multi-layer structure 255 on the substrate 210 acts as a mirror for EUV electromagnetic radiation. In order to become a photolithographic mask 200, a buffer structure 280 and an absorbing structure 290 are additionally deposited on the capping layer 270. The buffer layer 280 may be deposited to protect the multi-layer mirror structure 255 during processing, for example during etching of the absorbing structure 290. Possible buffer structure materials are for example fused silica ($SiO_2$), silicon-oxygen-nitride (SiON), ruthenium (Ru), chromium (Cr), and/or chromium nitride (CrN). The absorbing structure 290 comprises a material having a large absorption constant for photons in the EUV wavelength range. Examples of these materials are chromium (Cr) and/or tantalum nitride (CrN). Typically, a thickness of about 50 nm is sufficient to absorb essentially all EUV photons 295 incident on the absorbing structure 290. In contrast, the majority of the photons 295 incident on the capping layer 270 is reflected as photons 297.

Typically, the substrate 210 of the EUV mask 200 also has lateral dimensions of 152 mm×152 mm and a thickness or height of essentially 6.35 mm. The rear surface 225 of the substrate 210 or the rear substrate surface 225 has a thin metallic coating 220. Typically this coating 220 comprises chromium. The metallic coating 220 is used to fix the photolithographic mask 200 at the EUV scanner by the application of electrostatic forces.

In the methods for generating a predetermined 3D contour of an optical component, as for example an EUV mask 200 described in the following, energy from light pulses of a light beam is locally deposited in the substrate 210 of the EUV mask 200. However, the light pulses of the light beam can neither penetrate the front substrate surface 230, as they are absorbed by the multi-layer mirror structure 255, nor the rear substrate surface 225, as they are also absorbed by the metallic coating 220 on the rear substrate surface 225.

Therefore, the metallic coating 220 on the rear substrate surface 225 of the EUV mask 200 is replaced by a transparent conductive coating 222, as it is shown in FIG. 2. Such a transparent conductive coating 222 may for example comprise indium tin oxide (ITO). The term transparent conductive coating means that the coating 222 is optically transparent for light in the near-infrared, and/or the visible, and/or the near-ultraviolet wavelength range.

Alternative materials for transparent conductive coatings are for example fluorine tin oxide (FTO) and/or aluminium zinc oxide (AZO) and/or antimony tin oxide (ATO). These materials can easily be applied to the rear substrate surface 225 of a fused silica substrate 210 and have a conductivity which is high enough to fix the mask 200 to the EUV scanner. The transparent conductive coating 222 enables to irradiate the completely manufactured EUV mask 200 with light pulses of a laser beam through the rear substrate surface 225. The transparent conductive coating 222 also allows applying ultra-short laser pulses to the EUV mask 200 during its manufacturing process if the coating 222 is arranged on the mask blank or on the rear substrate surface 225 in a first step of the mask manufacturing process.

An EUV mirror may have the structure of the photolithographic mask 200 unless it does not have the buffer layer 280 and the absorbing structure 290. Therefore, also for an EUV mirror the metallic coating 220 may be replaced by a transparent conductive coating 222, so that the light pulses are able to enter into the substrate from the rear substrate surface (not shown in FIG. 2).

Figure 3:
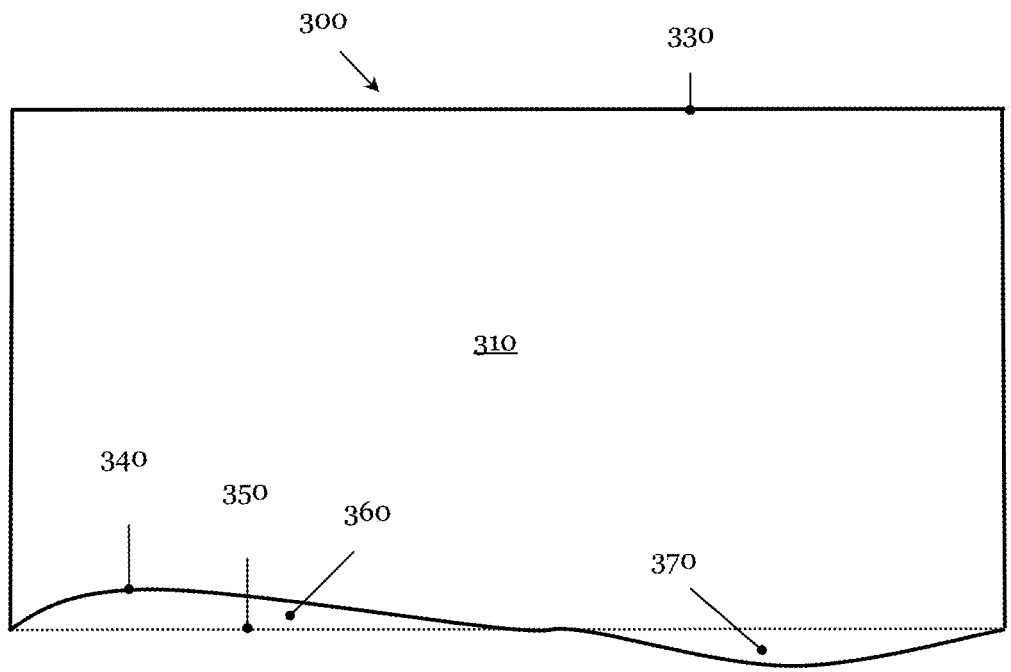
FIG. 3 schematically depicts a cross-sectional view of an extreme ultraviolet (EUV) mask blank having an uneven rear surface.

The diagram 300 of FIG. 3 schematically shows a mask blank or a substrate 310 of an EUV mask 300 where the rear substrate surface 340 is not flat but has two deviations 360 and 370 from a predetermined surface contour 350. When fixing the mask blank 310 to a chuck for depositing a multilayer structure 255, the chuck may flatten the rear surface 340 of the blank 300 which results in a distortion of the front surface 330. Thus, the multilayer structure 255 is deposited on an uneven front surface 330 of the substrate 310. This will finally lead to an uneven surface of the multilayer structure 255.

When fixing the blank 310 with a chuck so that its rear surface 340 is not flattened during the generation of an EUV mask from the substrate 310, an even or a predetermined front surface contour of the EUV mask may be fabricated. However, when fixing the mask manufactured from the substrate 310 on an EUV scanner, the electrostatic forces of its stage will flatten the deviations 360 and 370 of the rear substrate surface 340 to an essentially flat surface 350. This in turn will lead to aberrations of the multilayer structure 255 arranged on the substrate 310 compared with the essentially ideal EUV mask 200 of FIG. 2. The aberrations caused by the deviations 360 and 370 can neither be removed by varying the position of the wafer nor by changing the reproduction scale. As already discussed, deviations of the flatness of the front substrate surface 330 in the range of 1 nanometer are already sufficient to induce aberrations.

Presently, the absorbing structure 290 of an EUV mask 200 is typically generated by patterning a layer of absorbing material with an electron beam writer. In this process, the EUV mask 200 is not fixed by an electrostatic chuck. This means that the non-flat rear surface 340 of the mask blank 310 is essentially not changed during the patterning process. Therefore, an EUV mask having a rear substrate surface contour 340 as indicated in FIG. 3 will have a different shape when it is fixed on an electrostatic chuck during an illumination process. This results in distortions of the image placement of a wafer. For standard mask bending this problem is partly mathematically solved by controlling the electron beam writer with corrected coordinates. However, there still exists a problem as the bending of the rear substrate surface of an EUV mask may have a complex shape. Moreover, the patterning process itself is not ideal on a non-flat surface.

Figure 4:
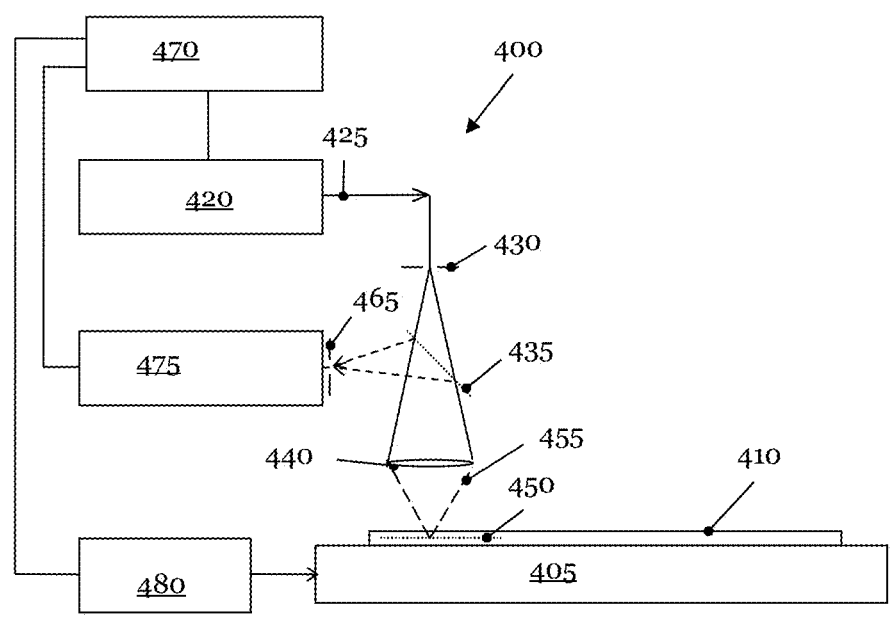
FIG. 4 schematically depicts a cross-sectional view of a confocal microscope for a determination of an existing three-dimensional contour (3D) of an optical component.

FIG. 4 schematically illustrates an example of a metrology tool 400 which can be used to determine a two-dimensional (2D) or a 3D image of an optical component or a wafer. The confocal microscope 400 of FIG. 4 is only an example of a class of metrology tools which can be applied to measure the 3D contour of an optical component or of a wafer. For example, a profilometer can be used to analyze a surface profile or a 2D or 3D microscopic or sub-microscopic contour of an optical component as well as of a wafer. Profilometers are available which utilize contact or pseudo-contact methods. Stylus profilometers or mechanical profilometers, atomic force microscopes, scanning tunnelling microscopes are examples of this type of profilometer. Further, a number of non-contacting profilometers which apply for example optical methods are also available. Examples of this type of profilometers are vertical scanning interferometers, white-light interferometers, phase shift interferometers and/or differential interference contrast microscopes.

In the following, the operational principle of a confocal sensor 400 or a confocal microscope 400 is outlined. A confocal microscope 400 uses a point illumination of a pinhole in an optically conjugate plane in front of a detector to eliminate out-of-focus signal components. In the example of FIG. 4, the point illumination is generated with a light source 420, an optical fiber 425 which couples the light of the light source 420 through the pinhole 430 via the objective 440 into a focal plane 450 of an photomask 410. Light reflected from the focal plane 450 is directed by a dichroic mirror 435 to the pinhole 465 which is arranged in front of the detector 475. The portion of light which is reflected from outside of the focal plane 450 is significantly smaller than light reflected from the focal plane 450. Furthermore, light reflected from outside the focal plane is not focussed onto the pinhole 465.

For example, the light source 420 may be a laser source. If an optical fiber 425 is used for guiding the electromagnetic radiation from the light source to the pinhole 430, the pinhole 430 may be omitted as the fiber 425 has a similar effect as the pinhole 430. The detector 475 may for example be a photodiode, an avalanche photodiode, or a photomultiplier.

A photomask or generally an optical component 410 may be arranged on a sample stage 405. The sample stage 405 may be movable and is moved by a scan unit 480 in a plane which is perpendicular to the incident light beam (x- and/or y-direction). For example, micromanipulators or servomotors can be used for moving the sample stage 405 (not shown in FIG. 4). By moving the sample stage 405 parallel to the beam direction and/or by shifting the objective 440 the focal plane can be scanned through the optical component 410. In an alternative implementation the sample stage is fixed and the light beam 455 is scanned across the photomask 410. This implementation is called confocal laser scanning microscope (CLSM) (not depicted in FIG. 4).

A control unit 470 controls the light source 420, the detector 475 as well as the scan unit 480. It is also possible that the control unit 470 controls the movement of the objective 440 (not shown in FIG. 4). Further, the control unit 470 may be embedded in a computer system having at least a processor, a storage unit, I/O (input/output) unit(s), and a display (not represented in FIG. 4). The control unit or the computer system stores data received from the detector 475. Moreover, a processing unit of the control unit or the processor of the computer system (also not shown in FIG. 4) is able to process the measurement data of the detector 475. Finally, the control unit 470 or the computer system may have a connection to the apparatus 500 of FIG. 5 in order to transmit the measured and/or the processed data to the apparatus 500.

The resolution of the confocal microscope 400 in lateral direction is limited by diffraction. This means that the lateral resolution depends on the diameter or opening of the pinholes 430 and 465, the numerical aperture (NA) of the objective 440 as well as on the wavelength of the light source 420. In lateral direction the resolution is in the range of the wavelength of the light source 420. The resolution in the beam direction is not diffraction limited, but limited by the determination of the position of the maximum intensity. The resolution in beam direction reaches the one digit nanometer range.

Figure 5:
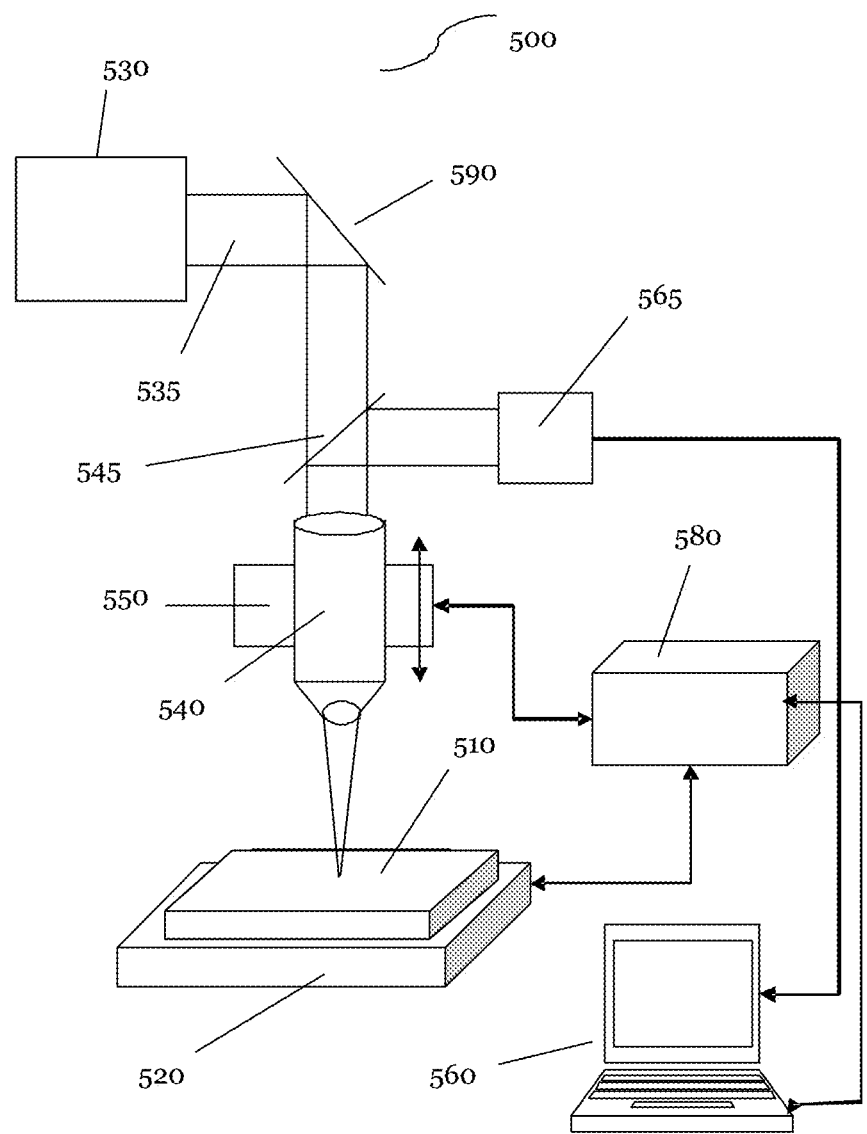
FIG. 5 schematically represents a block diagram of an apparatus for calculating a three-dimensional (3D) arrangement of laser pulses and for applying the calculated 3D arrangement of laser pulses to an optical component for generating a predetermined contour.

FIG. 5 depicts a schematic block diagram of an apparatus 500 which can be used to calculate and to apply an arrangement of laser pulses to an optical component and/or a wafer. The principle is illustrated for the examples of the masks of FIGS. 1 and 2. Other examples of optical components may be templates used in the nanoimprint technique and/or lenses of an optical system. Further examples are wafers on which integrated circuits (ICs) are generated. The apparatus 500 comprises a chuck 520 which may be movable in three dimensions. The optical component 510, for example a mask 510, may be fixed to the chuck 520 by using various techniques as for example clamping. The photolithographic mask 510 may be the transmissive mask 100 of FIG. 1 mounted upside down, so that its rear substrate surface 140 is directed towards the objective 540.

The apparatus 500 includes a pulse laser source 530 which produces a beam or a light beam 535 of pulses or light pulses. The laser source 530 generates light pulses of variable duration. The pulse duration may be as low as 10 fs but may also be continuously increased up to 100 ps. The pulse energy of the light pulses generated by the pulsed laser source 530 can also be adjusted across a huge range reaching from 0.001 µJ per pulse up to 10 mJ per pulse. Further, the repetition rate of the light pulses comprises the range from 1 Hz to 100 MHz. In a preferred embodiment the light pulses may be generated by a Ti:sapphire laser operating at a wavelength of about 800 nm. However, the methods described in the following are not limited to this laser type, principally all laser types may be used having a photon energy which is smaller than the band gap of the optical component 510 and which are able to generate ultra-short pulses with durations in the femtosecond range. This criterion also holds for wafers. Generally, the emission wavelength of the apparatus 500 has to be adapted for the band gap of the optical component 510 or of a wafer.

Therefore, for example YAG laser systems doped with at least one of the elements neodymium (Nd), thulium (Tm), holmium (Ho), and erbium (Er) can also be used. As a further example dye laser systems may also be applied. The apparatus 500 may also comprise more than one pulse laser source 530 of the same type or of different types (not shown in FIG. 5).

The requirement that the band gap of the optical component 510 is larger than the emission wavelength of the laser source used to apply ultra-short laser pulses is typically equivalent to the requirement that the optical component 510 is optically transparent in the near-infrared, the visible, and/or the near-ultraviolet wavelength range. In these wavelength ranges laser sources are available which can generate ultra-short pulses having a large energy density.

The following table represents an overview of laser beam parameters of a frequency-doubled Nd-YAG laser system which is used in an embodiment of the inventive method.

TABLE 1

Numerical values of selected laser beam parameters for a Nd-YAG laser system
Overview

| Parameter | Numerical value | Unit |
| --- | --- | --- |
| Pulse energy | 0.05-5 | µJ |
| Pulse length | 0.05-100 | ps |
| Repetition rate | 1-10 000 | kHz |
| Pulse density (2D, lateral) | 1 000-10 000 000 | mm$^{-2}$ |
| NA | 0.1-0.9 | |
| Wavelength | 532 | nm |

The pulse density refers to a 2D density in a plane perpendicular to the beam direction (lateral plane).

As indicated in table 1, the parameter ranges of laser pulses used for the generation of pixel are large. Hence, the properties of pixels are also quite different. Typically, a laser pulse does not generate a pixel in the form of a sphere but creates a pixel having a form similar to an ellipsoid or a spheroid. The length of the spheroid is in a range of 1 µm to 50 µm and its width or thickness extends for examples from 0.5 µm to 10 µm. Characteristic lengths to thickness ratios are in the range of 2 to 10. As indicated in table 1, pixel densities in the lateral plane are $10^3$ to $10^7$ pixels per square mm. One-dimensional pixel densities in beam direction cover a range of 1 to 100 pixel(s) per mm.

The following tables indicate parameters of differently influencing the density and/or the optical transmission distribution of the substrate 110 of the photomask 100. Table 2 presents parameters of an embodiment using a frequency-doubled Nd-YAG laser system for a mode of introducing or writing pixels called standard process window (std PW).

TABLE 2

Numerical values of selected laser beam parameters for a Nd-YAG laser system for a standard process window
Std PW (standard process window)

| Parameter | Numerical value | Unit |
| --- | --- | --- |
| Pulse energy | 0.45 | µJ |
| Pulse length | 8 | ps |
| Repetition rate | 50 000 | kHz |
| Pulse density (2D, lateral) | 1 000-100 000 | mm$^{-2}$ |
| NA | 0.3 | |
| Wavelength | 532 | nm |

Table 3 summarizes parameters of a mode called low registration process window (LowReg PW) again of an embodiment using a frequency-doubled Nd-YAG laser system. This operation mode of the laser system 530 uses light pulses having a lower energy than the std PW, but introduces a higher pixel density.

TABLE 3

Numerical values of selected laser beam parameters for a Nd-YAG laser system for a low registration process window (LowReg PW)
Low Reg PW (low registration process window)

| Parameter | Numerical value | Unit |
| --- | --- | --- |
| Pulse energy | 0.32 | µJ |
| Pulse length | 8 | ps |
| Repetition rate | 50 000 | kHz |
| Pulse density (2D, lateral) | 5 000-500 000 | mm$^{-2}$ |
| NA | 0.3 | |
| Wavelength | 532 | nm |

The following table lists parameters for a mode called no registration process window (NoReg PW) which is characterized by further reducing the energy of the light pulses of the laser system 530.

TABLE 4

Numerical values of selected laser beam parameters for a Nd-YAG laser system for a no registration process window (NoReg PW)
NoReg PW (no registration process window)

| Parameter | Numerical value | Unit |
| --- | --- | --- |
| Pulse energy | 0.19 | µJ |
| Pulse length | 8 | ps |
| Repetition rate | 80 000 | kHz |
| Pulse density (2D, lateral) | 1 000-100 000 | mm$^{-2}$ |
| NA | 0.4 | |
| Wavelength | 532 | nm |

Table 5 presents parameters of a mode called pixelless process window (pixelless PW). In this case, a Ti: Sapphire laser system is used for the modification of the density and/or the optical transmission distribution of an optical component. This laser system generates ultra-short laser pulses at an emission wavelength of about 800 nm. The pulse density of the pixelless PW is very high.

TABLE 5

Numerical values of selected laser beam parameters for a Ti:sapphire laser system for a pixelless process window (Pixelless PW)
Pixelless PW (pixelless process window)

| Parameter | Numerical value | Unit |
| --- | --- | --- |
| Pulse energy | 0.1-0.5 | µJ |
| Pulse length | 0.15 | ps |
| Repetition rate | 10 000 | kHz |
| Pulse density (2D, lateral) | 1 000 000-100 000 000 | mm$^{-2}$ |
| NA | 0.33 | |
| Wavelength | 800 | nm |

The steering mirror 590 directs the pulsed laser beam 535 into the focusing objective 540. The objective 540 focuses the pulsed laser beam 535 through the rear substrate surface into the substrate of the photolithographic mask 510. The NA (numerical aperture) of the applied objective depends on the predetermined spot size of the focal point and the position of the focal point within the substrate of the transmissive mask 510 relative to the rear substrate surface. As indicated in table 1, the NA of the objective 540 may be up to 0.9 which results in a focal point spot diameter of essentially 1 µm and a maximum intensity of essentially $10^{20}$ W/cm$^2$.

The apparatus 500 also includes a controller 580 and a computer 560 which manage the translations of the two-axis positioning stage of the sample stage 520 in the plane perpendicular to the laser beam (x- and y-direction). The controller 580 and the computer 560 also control the translation of the objective 540 perpendicular to the plane of the chuck 520 (z-direction) via the one-axis positioning stage 550 to which the objective 540 is fixed. It should be noted that in other implementations of the apparatus 500 the chuck 520 may be equipped with a three-axis positioning system in order to move the optical component 510 or the mask 510 to the target location and the objective 540 may be fixed, or the chuck 520 may be fixed and the objective 540 may be moveable in three dimensions. Although presently not preferred, it is also conceivable to equip both the objective 540 and the chuck 520 with three-axis positioning systems. It should be noted that manual positioning stages can also be used for the movement of the optical component 510 as for example the transmissive mask to the target location of the pulsed laser beam 535 in x-, y- and z-directions and/or the objective 540 may have manual positioning stages for a movement in three dimensions.

Further, the apparatus 500 may also provide a viewing system including a detector 565 as for example a CCD (charge-coupled device) camera which receives light from an illumination source arranged to the chuck 520 (not shown in FIG. 5) via the dichroic mirror 545. The viewing system facilitates navigation of the optical component 510 to a target position. Further, the viewing system may also be used to observe the formation of a modified area in the optical component 510 by writing the arrangement of laser pulses with the laser beam 535 of the light source 530 into the optical component 510.

The computer 560 may be a microprocessor, a general purpose processor, a special purpose processor, a CPU (central processing unit), a GPU (graphic processing unit), or the like. It may be arranged in the controller 580, or may be a separate unit such as a PC (personal computer), a workstation, a mainframe, etc. The computer 560 may further comprise I/O (input/output) units like a keyboard, a touchpad, a mouse, a video/graphic display, a printer, etc. Moreover, the computer 560 may comprise one or several connection ports through which it may send a request for experimental data to the control unit 470 of the confocal microscope 400 of FIG. 4. In addition, the computer 560 may also comprise a volatile and/or a non-volatile memory. The computer 560 may be realized in hardware, software, firmware, or any combination thereof. Moreover, the computer 560 may control the laser source 530 (not indicated in FIG. 5).

A non-volatile storage of the computer 560 may store a three-dimensional contour of an optical component. The computer 560 may receive experimental raw data from the control unit 470 of the confocal microscope 400. Alternatively, it may receive processed data from the control unit 470. The computing unit of the computer 560 determines from the predetermined 3D contour of the optical component 510 and the data received from the control unit 470 one or several deviations of the measured or existing 3D contour of an optical component from its predetermined 3D contour. It is also possible that the supplier of an optical component provides the deviation of the existing 3D contour from a predetermined contour.

The computer 560 calculates from these data and from algorithms explained in section 6 ("theoretical background") at least one arrangement of laser pulses which is appropriate to bring the existing 3D contour of the optical component 510 in accordance with its predetermined 3D contour.

Figure 6:
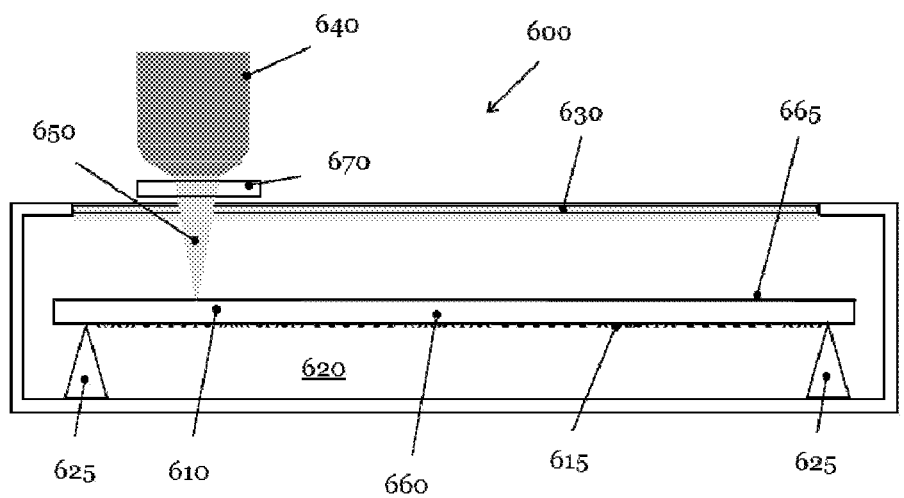
FIG. 6 schematically depicts a configuration for applying a calculated 3D arrangement of laser pulses to an EUV mask.

The diagram 600 of FIG. 6 schematically shows the application of one or more arrangements of laser pulses to an EUV mask 610. The EUV mask 610 has on its front surface an EUV pattern 615 and on its rear surface an optically transparent conductive coating 665. The mask 610 is arranged in a specific housing 620 and mounted with the mask pattern 615 down on brackets 625. The housing 620 is sealed which a protection glass window 630. The specific housing 620 allows controlling the environment of the mask 610. In particular, it may enable to evacuate the housing 620 (not indicated in FIG. 6). The laser beam 650 is focused by an objective 640 into the substrate 660 of the EUV mask 610. An exchangeable compensating glass plate 670 adjusts the focus of the laser beam 650 to the depth in the substrate 660 of the mask 610. The housing 620 does not have any movable parts.

Application Examples

Photolithographic Masks

Figure 7:
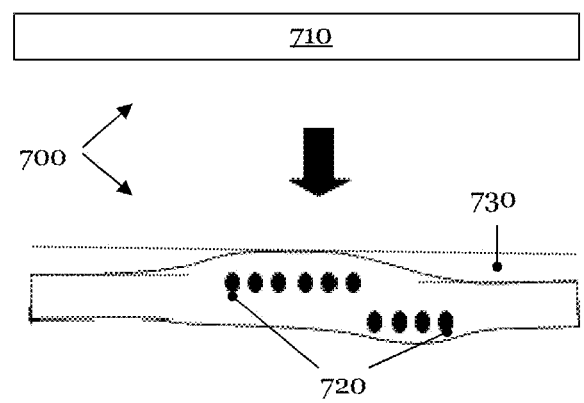
FIG. 7 schematically depicts an expansion of an initially flat mask blank perpendicular to a mask blank surface by applying two two-dimensional (2D) arrangements of laser pulses generating pixels which locally expand the mask blank predominantly in vertical direction.

The illustrations 700 of FIG. 7 schematically represent a local variation of a height of a mask blank 710. The mask blank 710 is flat in its initial state. By applying a 2D arrangement of laser pulses 720 the height of the surface is locally modified. Expressed in physical terms, a height variation or a vertical deformation or a deformation in z-direction is a combination of an expansion or contraction in z-direction and a bending. A local deformation generates a localized effect, whereas a bending results in a global effect. A local deformation in z-direction 730 can be the result of the application of a 2D or 3D arrangement of laser pulses 720 and can also result from an interaction of a local area having a local deformation with an area in which a 2D or 3D arrangement of laser pulses has been written which is expressed by Poisson's ratio (see section 5.3: "theoretical background"). The theoretical considerations in section 5.3 also reveal that in most cases a bending in z-direction and a (local) deformation in z-direction can be decoupled as they have a significantly different magnitude.

FIG. 7 clearly indicates that the flatness control of an optical component requires controlling of both the bending and the surface contour induced by arrangements of laser pulses. Thus, the generation of a predefined bending or the correction of a determined bending of an optical component is a good example to demonstrate the capabilities of a 3D deformation model which leads to the calculation of 3D arrangements of laser pulses.

It is a target of the experiments described in the following to verify the concept of the bending of an optical component. Further, it is also a goal to check the 3D deformation model and to demonstrate the benefits of a multi-mode approach for the generation of a 3D arrangement of laser pulses.

The exemplary optical component used in the experiments described in the following is a 6 inch (152 mm) mask blank. Most of the results are also applicable to many other optical components having other shapes which allow the application of 3D arrangements of laser pulses into the volume of the optical components, i.e. optical components which are optically transparent in the near-infrared, the visible, and/or the near-ultraviolet wavelength range.

The application of different 2D arrangements of laser pulses is performed in planes parallel to the mask blank front and rear surface in different depths from the respective surface and using different writing modes, i.e. using 2D arrangements of laser pulses which have different parameters for the laser pulses and/or different pulse densities. The sizes of the 2D arrangements comprise the entire active area of the mask blank. The deformations resulting from the arrangements were measured in an area of 146 mm×146 mm, wherein the measurement grid was about 30×30 nodes.

The confocal microscope 400 used in the application examples described in this section is a Micro Epsilon IFS 3401-10 confocal sensor with a working distance of 10 mm and a resolution in beam direction or in z-direction of 400 nm. The noise of the measurement sensor is around 1000 nm. At every sampling point 100 distance samplings have been added in order to reach a distance sampling repeatability (in z-direction) of about 100 nm. The positioning stage (of Schneeberger) of the objective 440 of FIG. 4 has a repeatability in z-direction of approximately 200 nm. In order to reduce the contribution of the positioning stage to the variance in z-direction five sequential scans are acquired. Thus, the repeatability of the determination of an existing 3D contour of an optical component could be reduced to about 200 nm. A tilt of a mask blank is always mathematically corrected.

The following application examples demonstrate the result of the application of 3D arrangements of laser pulses which lead to a local expansion of a mask blank. However, this is not a limitation of the inventive method. All results described in this section can also be applied with 3D arrangements of laser pulses resulting in a local contraction of the mask blank. Further, it is also possible to define 3D arrangements of laser pulses which lead to a local compaction in a first area of a mask blank and to an expansion in a second area of the mask blank.

As a first application example a one-dimensional (1D) bending of a mask blank is described. It is obvious that if a 2D arrangement of laser pulses is applied which induces an isotropic expansion in the plane of a mask blank (x-/y-plane), this will induce a bending in the mask blank described above with the same curvature in all directions of the mask blank plane (x-/y-plane). Hence, a 2D arrangement of laser pulses resulting in a locally isotropic expansion does not allow to generate a 1D bending, i.e. for example a defined bending in x-direction and no bending of the mask blank in y-direction. This is a principal or fundamental limitation of an approach using a 2D arrangement of laser pulses which lead to an isotropic expansion in the mask blank plane.

However, apart from the pulse density, the shape of a laser pulse is an efficient parameter to introduce an anisotropic expansion of a mask blank, or generally an optical component.

Figure 8:
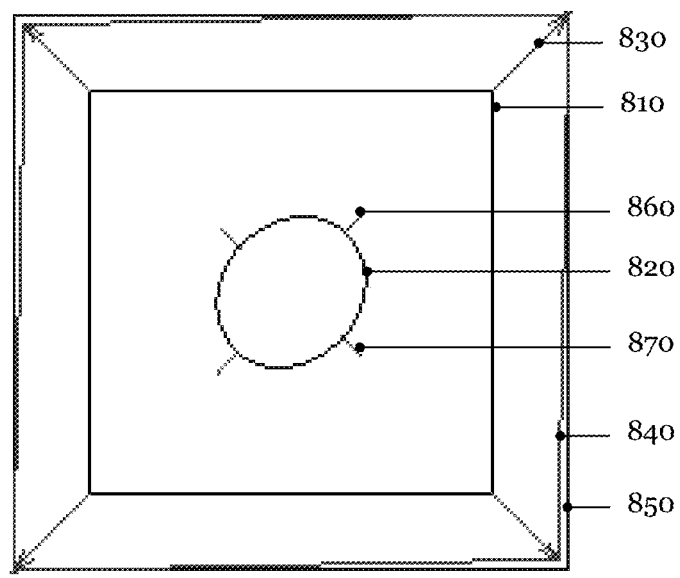
FIG. 8 schematically presents the deformation induced in the elementary area by the application of a laser pulse leading to an essentially isotropic expansion in a plane perpendicular to the beam direction.

This assumption is now experimentally proved. 2D arrangements of laser pulses are written in a mask blank close to its upper surface. As indicated in FIG. 8, a 2D arrangement of laser pulses leading to an isotropic expansion in the lateral plane is written in a mask blank. An isotropic expansion in a plane perpendicular to the beam direction can for example be generated by laser pulses having a circular shape. The ellipse 820 of FIG. 8 describes the resulting expansion of the mask blank. The two lines 860 and 870 show the magnitude of the expansion versus the direction in space. The two axes 860 and 870 illustrate the main axes of the expansion. The eccentricity of the ellipse 820 is very low which indicates that the expansion of the mask blank in the lateral plane is almost uniform.

As the ellipse 820 is not able to visualize all possible expansions of the mask blank, the square indicates an elementary area 810 of the mask blank prior to writing an arrangement of laser pulses in the elementary area 810. The elementary area 810 is a 2D projection of an elementary volume α introduced in section 5.3. As already illustrated with the ellipse 820 an isotropic expansion is introduced in the elementary area 810 by writing a homogeneous 2D arrangement of laser pulses in the mask blank. The deformation of the elementary area 810 is described by eight parameters which are the length and the directions of the arrows 830 at the four corner points of the elementary area 810. Five of the eight parameters are independent, since a rotation of the elementary area 810 around an axis perpendicular to the mask blank surface and translations in the mask blank plane do not change the deformation. The parallelepiped 840 indicates the deformations introduced in the elementary area 810 by a homogeneous 2D arrangement of laser pulses having laser pulses with an essentially a circular beam shape. The square 850 represents a normalized deformation of the elementary area 810 by an ideal isotropic expansion. FIG. 8 reveals that an isotropic 2D arrangement of laser pulses having an essentially circular shape results essentially in an isotropic expansion of the elementary area 810.

Figure 9:
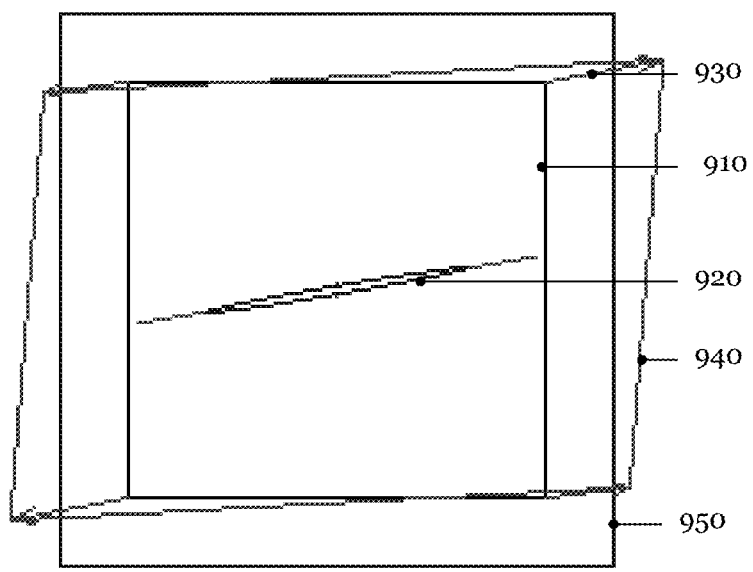
FIG. 9 schematically represents the deformation induced in the elementary area by the application of a laser pulse resulting in an essentially one-dimensional expansion in x-direction.

FIG. 9 depicts the situation when a homogeneous 2D arrangement of laser pulses is written in a mask blank, wherein the laser pulses result in an essentially 1D expansion of the elementary area 910. A strongly anisotropic expansion as shown in FIG. 9 can for example be generated by a laser beam having a slit-like beam shape as for example generated by a cylinder lens. Alternatively, an anisotropic expansion of an elementary area 910 can also be generated by writing overlapping pulses in the mask blank which lead to pixels overlapping in one direction or create an anisotropic pixel. In FIG. 9 the anisotropic expansion of the mask blank is symbolized by the ellipse 920. In contrast to the ellipse 820 of FIG. 8, the ellipse 920 has a large eccentricity and is almost degenerated to a line. The arrows 930 again symbolize the deformations induced at the corner points in the elementary area 910. As indicated in FIG. 9 by the parallelepiped 940, the anisotropic beam shape of laser pulses results in a high anisotropic or a nearly 1D deformation of the elementary area 910. Again, the square 950 represents a normalized deformation of the elementary area 910.

Figure 10:
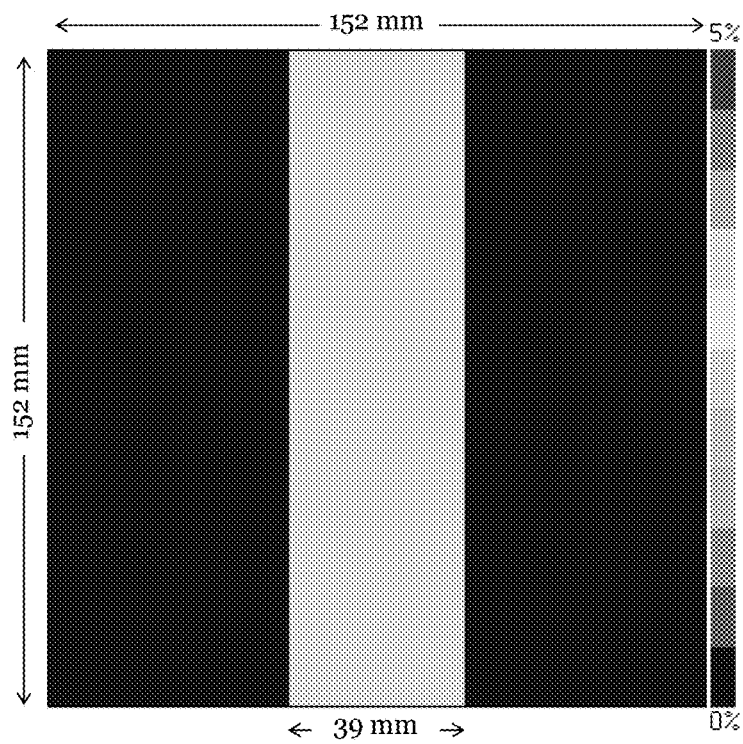
FIG. 10 shows a portion of a mask blank to which a 3D arrangement of laser pulses is applied.

FIG. 10 shows a mask blank having dimensions of 152 mm×152 mm. In the center of the mask blank a stripe with a width of approximately 39 mm is covered by a 2D arrangement of laser pulses. A single layer of the 2D arrangement of laser pulses is written close to the upper surface of the mask blank which facilitates the interpretation of the obtained results. As indicated on the right scale of FIG. 10, the optical transmission of the mask blank is changed (reduced) in the vertical stripe by essentially 4.5%. The change of the optical transmission or the increase of the optical attenuation introduced in an optical component by writing pixels into the optical component is a historic measure to quantify the amount of the writing of pixels into an optical component. An attenuation of 4.5% means an aggressive writing of pixels in the stripe covered by the 2D arrangement of laser pulses.

Figure 11:
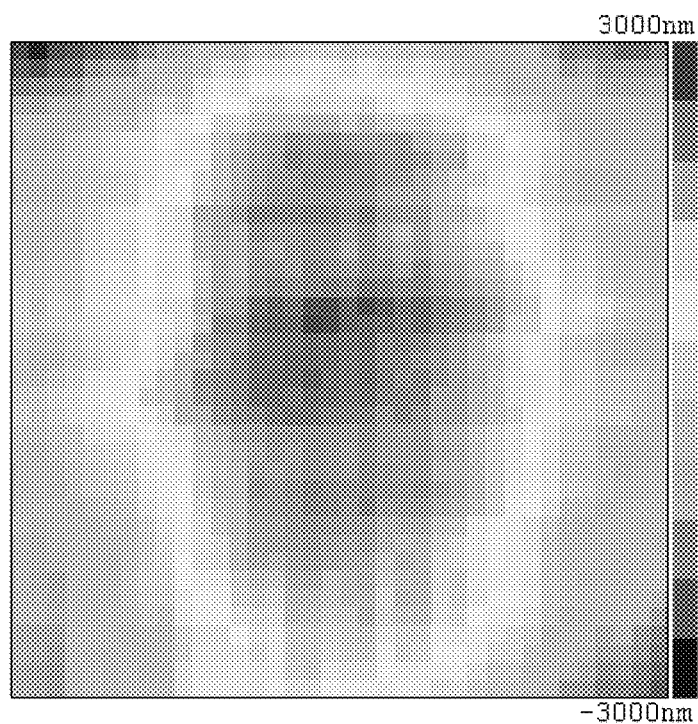
FIG. 11 illustrates the deformation of a mask blank in beam direction (z-direction) induced by the 2D arrangement of laser pulses using laser pulses resulting in a deformation of an elementary area as indicated in FIG. 8.
Figure 12:
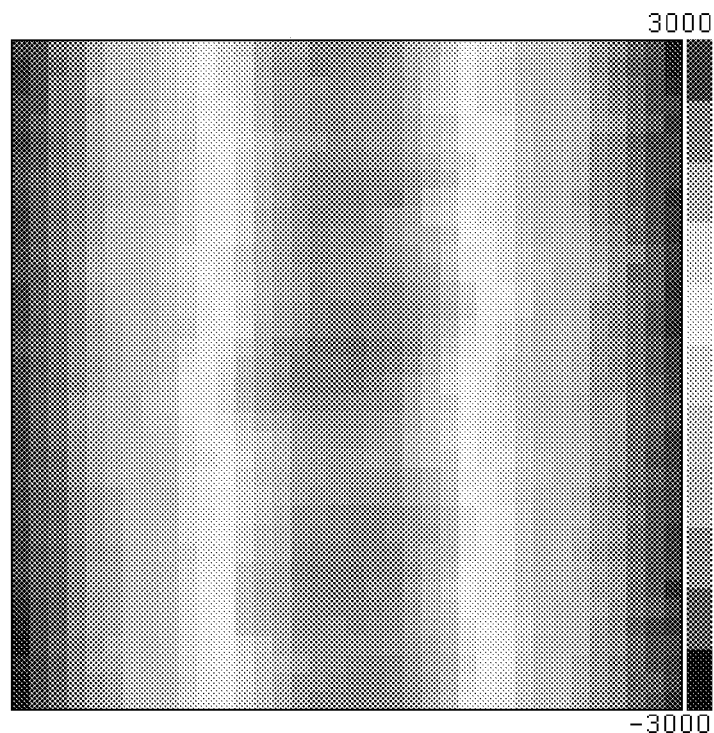
FIG. 12 represents the deformation of a mask blank in beam direction induced by the 2D arrangement of laser pulses using laser pulses resulting in the deformation of an elementary area as indicated in FIG. 9.

FIG. 11 presents the height variation induced by the homogeneous 2D arrangement of FIG. 8, wherein the laser pulses have parameters which essentially lead to an isotropic expansion. FIG. 12 depicts the variation in beam direction or in z-direction induced by the homogeneous 2D arrangement of laser pulses of FIG. 9, wherein the laser pulses have parameters which result in a strongly anisotropic expansion. For both Figures, the height variation scales from −3000 nm to +3000 nm resulting in a total height change of the mask blank of about 6 μm across a length of 152 mm. At the same time, the presented method allows to control the surface contour at a nanometer level which results in an inaccuracy in the per mille range. A preciseness in the nanometer range is necessary at the treatment of EUV masks as already deviations of their 3D contour from a predetermined contour lead to aberrations which significantly reduce the capability of this optical component.

Finally, a comparison of FIGS. 11 and 12 confirms the assumption that it is not possible to use an isotropic expansion 820 in an elementary area 810 in order to generate a bending which has different curvatures in different directions. In the example of FIGS. 11 and 12 the pixels are introduced far from the mask blank surface and the contribution from the pixel writing to a change of the surface profile or contour is low. In the discussed example the surface profile is modified by less than 1 nm. Hence, the ratio of surface change to bending is less than 1% in this example. Consequently, an anisotropic or a strongly isotropic expansion of an elementary area is well suited in order to generate an anisotropic or an almost 1D bending of an optical component with minimal effect of the surface contour of the optical element.

Figure 13:
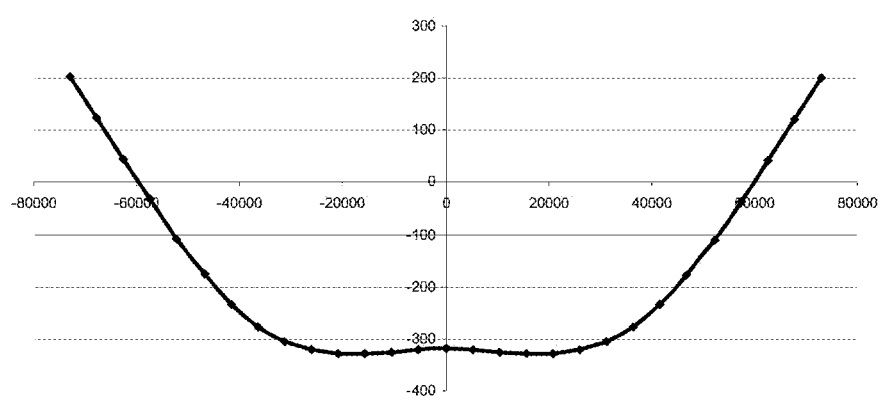
FIG. 13 shows a cross-section of a rotational symmetric 3D target contour to be generated.

In the next application example it is demonstrated that the defined method can generate a predetermined 3D contour or a predetermined bending profile which has a rotational symmetry even if the initial optical component does not have a rotational symmetry. A mask blank is again used as an initial optical component. The mask blank has again dimensions of 152 mm×152 mm. FIG. 13 shows the cross-section of the target profile. The units in the x-direction are μm and are nm in the y-direction. The center portion of the mask blank is almost flat. The total bending from the edge of the central portion of the mask blank to the outer edge symmetrically raises by approximately 500 nm.

In FIG. 10 the bending is adapted to the symmetry of the mask blank. This restriction is removed in the following example. This means a rotationally symmetric bending is applied to a square mask blank. This target is selected as the flat top 3D contour of FIG. 13 has in different parts of the bending profile different bending curvatures in the x- and the y-direction. This means that the 3D contour of FIG. 13 cannot be obtained with an arrangement of laser pulses having one expansion property.

Figure 14:
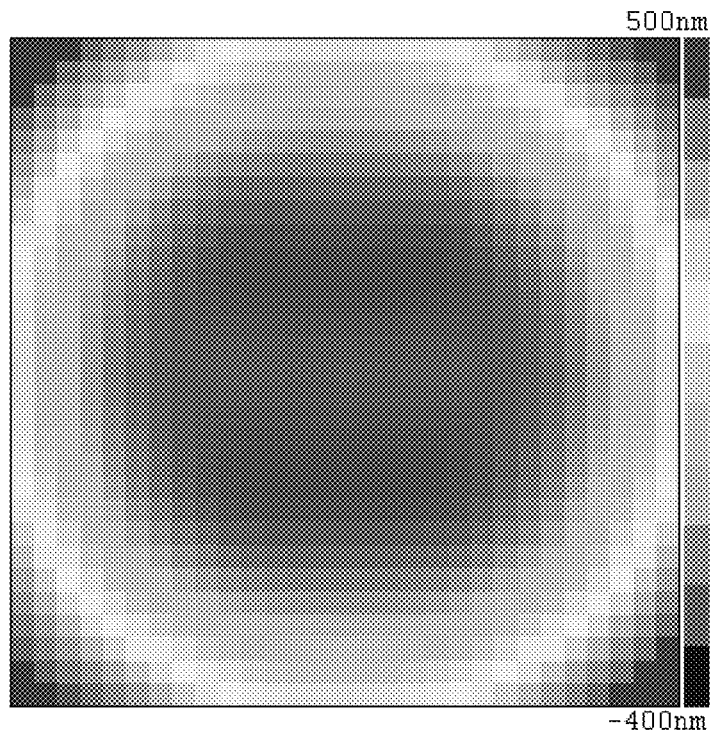
FIG. 14 presents the 3D target contour of FIG. 13 as a 2D representation on a mask blank.

FIG. 14 presents a 2D map representing the 3D target contour of FIG. 13. As indicated in the scale on the right side of the mask blank, the overall height variation amounts to 900 nm. A 10×10 equidistant step grid is used for computations. The profile of the mask blank plane is sampled at 29×29 locations.

It is the plan to bend the center portion or the bottom of rear surface of the mask blank according to the selected 3D target contour by using two expansion writing modes in two different 2D arrangements of laser pulses. In order to deform the mask blank in the desired direction, it is necessary to write or to apply the 3D arrangement of laser pulses below the geometrical center of the mask blank. In the discussed example the 3D arrangement of laser pulses is written 250 μm above the bottom surface of the mask blank. This distance from the bottom surface is large enough in order to avoid a damage of the bottom surface.

The 2D arrangements of laser pulses for two selected writing modes are calculated using information on known 2D mode signatures. In the case of using 2D arrangements of laser pulses which are not overlapping, this is a reasonable assumption because the contribution of the 2D arrangements of laser pulses to an expansion in the beam direction or in z-direction is about 0.01 nm per layer of 2D arrangement of laser pulses or per writing layer. This contribution is negligible.

Figure 15:
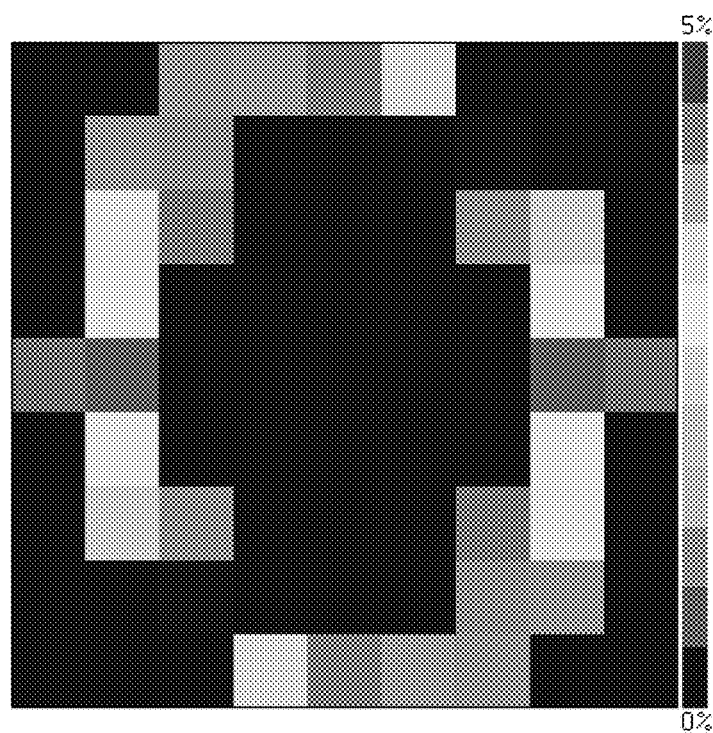
FIG. 15 illustrates a calculated 2D arrangement of laser pulses or writing map used to perform an expansion of the mask blank of FIG. 14 in x-direction.
Figure 16:
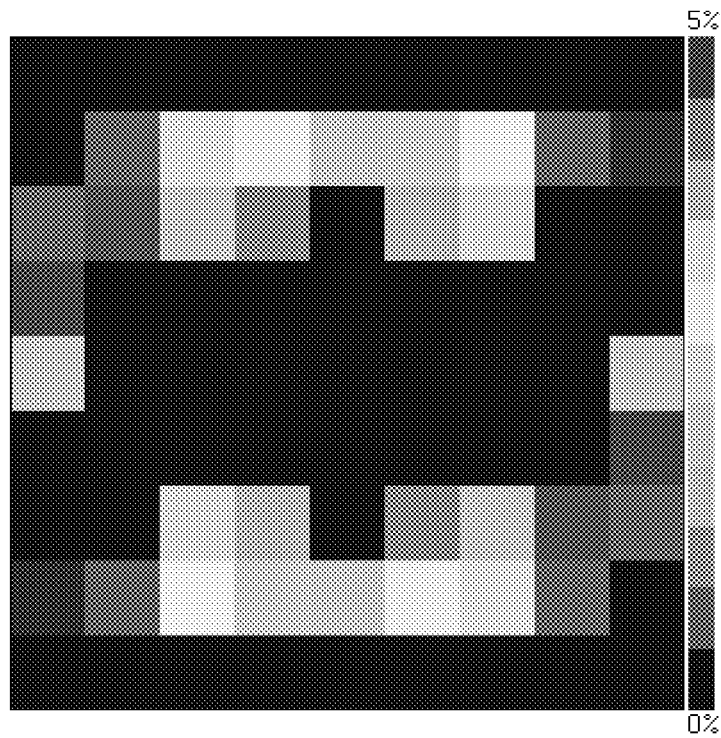
FIG. 16 represents a calculated 2D arrangement of laser pulses used to perform an expansion of the mask blank of FIG. 14 in y-direction.

FIG. 15 shows the calculated writing map or the 2D arrangement of laser pulses used for the expansion of the mask blank in x-direction, and FIG. 16 presents the corresponding writing map for the expansion of the mask blank in the y-direction.

FIG. 15 illustrates that the 2D arrangement of laser pulses or the 2D writing map responsible for the expansion in x-direction has a higher density in the area of the mask blank where the resulting 3D contour has to have a maximum bending curvature in x-direction. This symmetry is also reflected in FIG. 16 presenting the 2D writing map for the expansion in y-direction. Further, the 2D arrangements of laser pulses or the 2D writing maps show a 180° rotational symmetry, because the mask blank and mode signatures of the two 2D writing modes have this symmetry. Moreover, also due to these symmetry relations, the 2D writing modes of FIGS. 15 and 16 show a kind of 90° rotational symmetry. The symmetry is not perfect due to the absence of a 90° symmetry between the writing mode signatures of FIGS. 15 and 16. The two 2D writing modes of FIGS. 15 and 16 forming a 3D arrangement of laser pulses are separated in vertical direction by approximately 15 µm.

Figure 17:
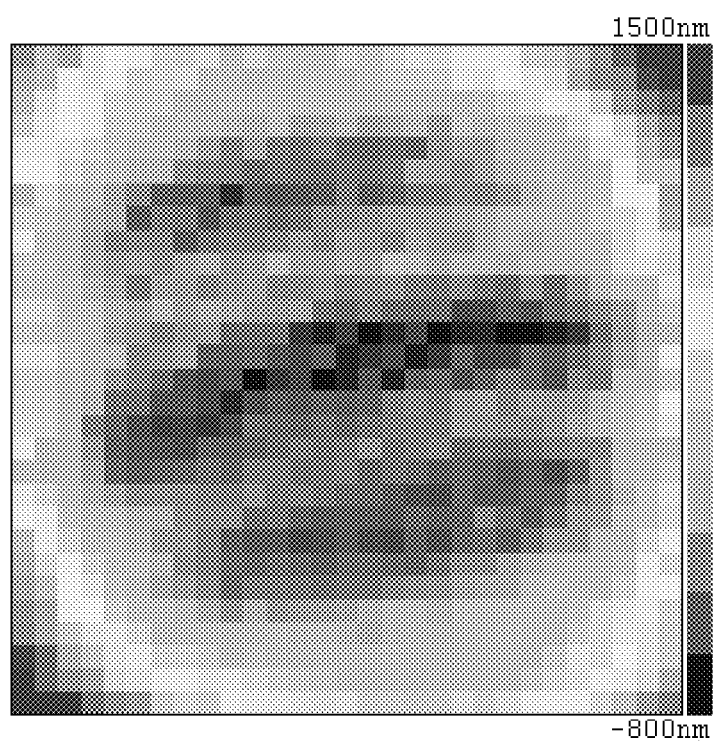
FIG. 17 shows the measured 3D contour induced in the mask blank by the application of the 3D arrangement of laser pulses comprising the writing maps of FIGS. 15 and 16.

The resulting change of the 3D contour of the bottom surface of the mask blank is depicted in FIG. 17. The variation range of the 3D contour of the mask blank after writing the 3D arrangement of laser pulses comprising the writing layers of the two writing modes of FIGS. 15 and 16 extends from −800 nm to +1500 nm or 2.3 µm as it is indicated by the scale on the right side of FIG. 17. This differs by approximately a factor of 2.5 with respect to the 3D target contour presented in FIG. 13. This results from a mistake in the normalization for the conversion of the mode signature (MS) from a 2D to a 3D representation.

The measurement data contain a noise magnitude of about 200 nm. Measurements are performed on the initial mask blank prior to the application of the 3D arrangement of laser pulses comprising the writing maps indicated in FIGS. 15 and 16. The resulting change of the 3D contour inherently contains a noise component with a magnitude of 300 nm. To compare the experimental results with the 3D target contour of FIG. 13 a smoothing thin plate spline (TPS) fit is applied which removes data variations having a magnitude smaller than 300 nm.

Figure 18:
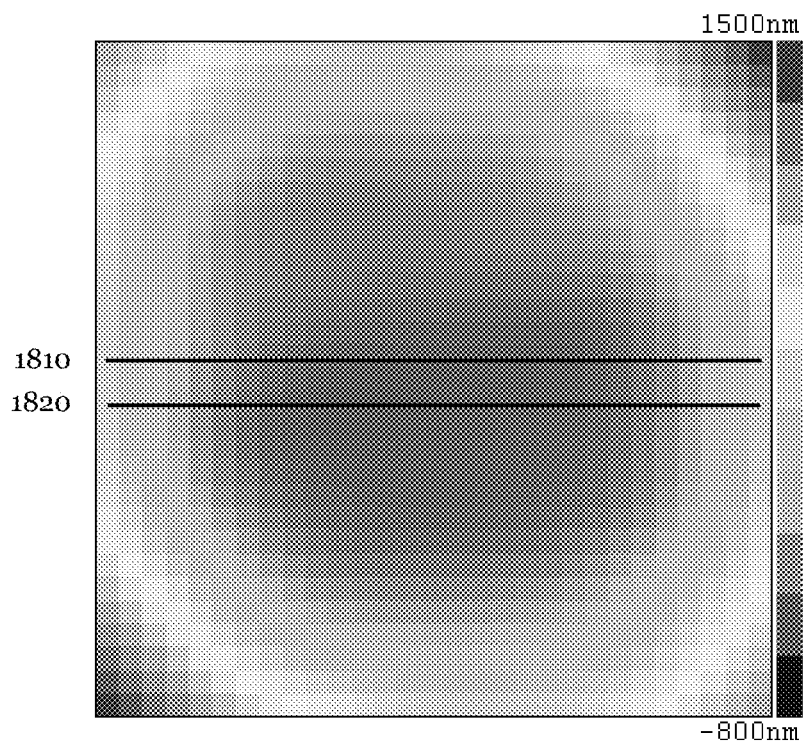
FIG. 18 represents the measured 3D contour of FIG. 17 after applying a smoothing thin plate spline (TPS) fit.

FIG. 18 shows a TPS fit of the measured bending of the mask blank induced by the 3D arrangement of laser pulses. To compare the measured results with the 3D target contour of FIG. 13, two cross section plots across the modified mask blank are prepared at the positions indicated by the lines 1810 and 1820.

Figure 19:
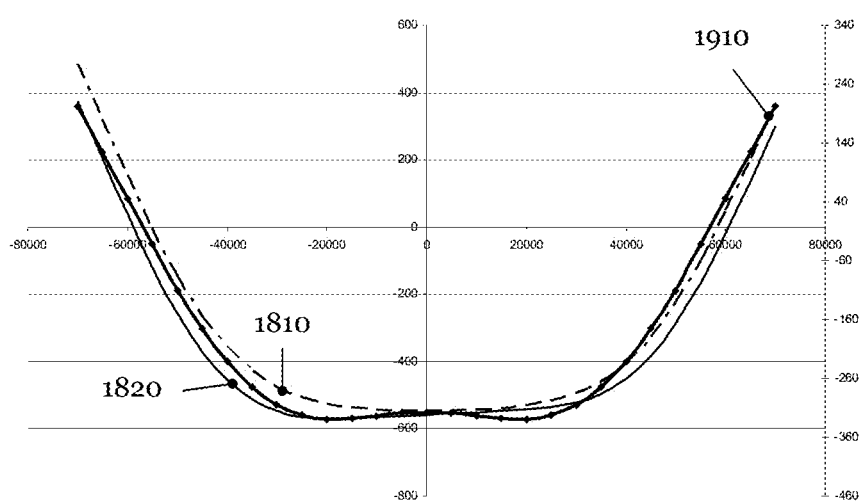
FIG. 19 compares the 3D target contour of FIG. 13 (scale in y-direction indicated by the y-axis) with two plots obtained at cross-sections indicated in FIG. 18 (scale in y-direction indicated on the right side of FIG. 19)

FIG. 19 presents a comparison between the 3D target contour 1910 with the two cross-section plots at positions 1810 and 1820 of FIG. 18. The 3D target contour 1910 uses the scale indicated at the y-direction. The two cross-section plots 1810 and 1820 use the scale indicated on the right side of FIG. 19 which has a different scale than that of the y-axis. This is due to the above mentioned normalization problem.

Apart from this problem the 3D target contour 1910 and the two measured 3D contours 1810 and 1820 are in good agreement. The target profile 1910 contains a small elevation in the center of rotational symmetry. The bending resulting from the pixel writing cannot have this elevation, as only expanding writing modes are used which are arranged in one side of the mask body. From the presented example it is estimated that curvatures leading to a height variation in the range from about 1 nm to 50 µm can be induced in an optical component by writing one or more 3D arrangements of laser pulses in the volume of the optical component. As in the first example the variation of the surface contour is again below 1 nm.

Figure 20:
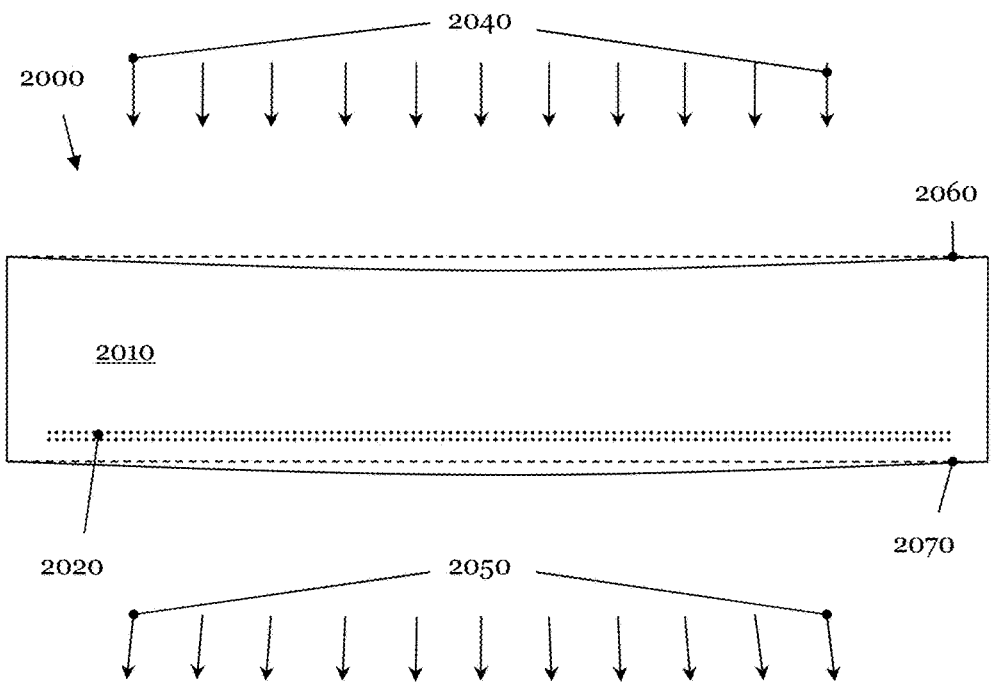
FIG. 20 schematically illustrates the fabrication of a lens with a large focal length from an initially flat mask blank by the application of a 3D arrangement of laser pulses.

As it is schematically illustrated in FIG. 20, the process of bending an optical component allows for example to fabricate lenses 2010 which have an extremely large focal length from an initially flat optical component 2000. Similar to the discussion in the context of FIGS. 14 to 18, a 3D arrangement of laser pulses 2020 is written close to the rear surface 2070 of the optical component 2000 which induce a bending with a rotational symmetry, and thus transforming the flat component 2000 into a lens 2010 having a large focal length. Parallel light 2040 incident on the front surface 2060 of the lens 2010 leaves the rear surface 2070 of the lens 2010 as slightly divergent light 2050. Conversely, parallel light incident on the rear surface 2070 leaves the front surface slightly convergent (not indicated in FIG. 20).

The next application example presents the generation of an optical component having a predetermined arbitrary shape. This means it is the purpose of the following example to demonstrate the ability to fabricate a 3D target contour which has an arbitrary bending shape by writing one or more 3D arrangements of laser pulses into the optical component. A target is selected with a shape which has curvatures with two different signs in different directions. This specific 3D contour cannot be performed by using a single plane 2D arrangement of laser pulses which predominantly induces an expansion in the plane of the 2D arrangement of laser pulses.

A single 3D contour having curvatures with different signs can be computed from a second order polynom. The following polynom is selected:

$$F(x,y) = a \cdot x^2 + b \cdot x \cdot y + c \cdot y^2 \tag{61}$$

wherein the constants are given the numerical values:

$$a = -1.6 \cdot 10^{-10}, b = +1.6 \cdot 10^{-10}, c = +4.0 \cdot 10^{-11} \tag{62}$$

Figure 21:
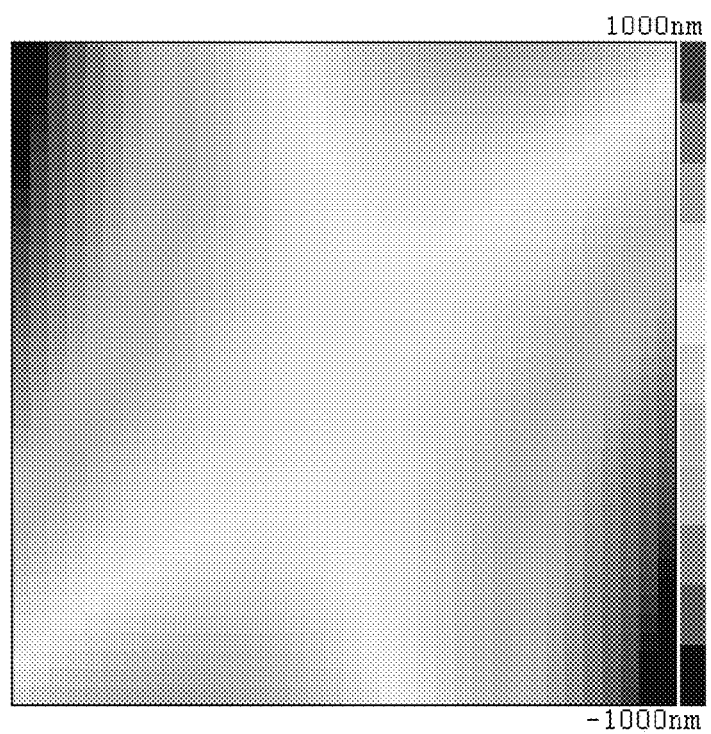
FIG. 21 shows a 2D representation of a 3D target contour having a profile of a saddle.

As it is indicated in FIG. 21, equation 61 describes a 3D contour having a saddle shape with different magnitudes of curvature in x- and in y-direction. In order to increase the complexity of the 3D contour, the term x·y is added to equation 61 that slightly rotates the saddle around the vertical axis.

The following two paragraphs define some technical terms in detail in order to again emphasize the important point of an anisotropic expansion of an elementary volume or elementary area of an optical component or of a wafer. Only in case of pixel overlapping or in any kind of pixel dubbing or by pixelless writing, it is possible to obtain an anisotropic expansion of an elementary area. In case of a dubbing pair or in a group of two or more overlapping pixels one or more laser pulses are shot to a side of an already existing pixel, and thus resulting in an anisotropic pixel. The entire complex group of overlapping pixels may again be called pixel as it is an element of a global writing process. A group of overlapping or partly overlapping pixels is denoted as writing mode in this application. 2D arrangements of writing modes (or overlapping or anisotropic pixels) are then selected in order to generate a desired expansion profile for an optical component or a wafer.

However, the computation and the given examples are still based on a more specific variant as pixels created by a single laser pulse and having a specific elementary expansion are used as a tool to generate a required deformation. This means that it is a new feature that individual pixels generated by a single laser pulse by their own induce an asymmetric or anisotropic expansion of an elementary volume. A quantitative representation of a single pixel is a writing mode signature, abbreviated as MS for mode signature, which describes the amount of a resulting expansion in case of using pixels of a single type (cf. also section 5.3). One writing mode uniformly processes an area of 1 mm×1 mm.

Figure 22:
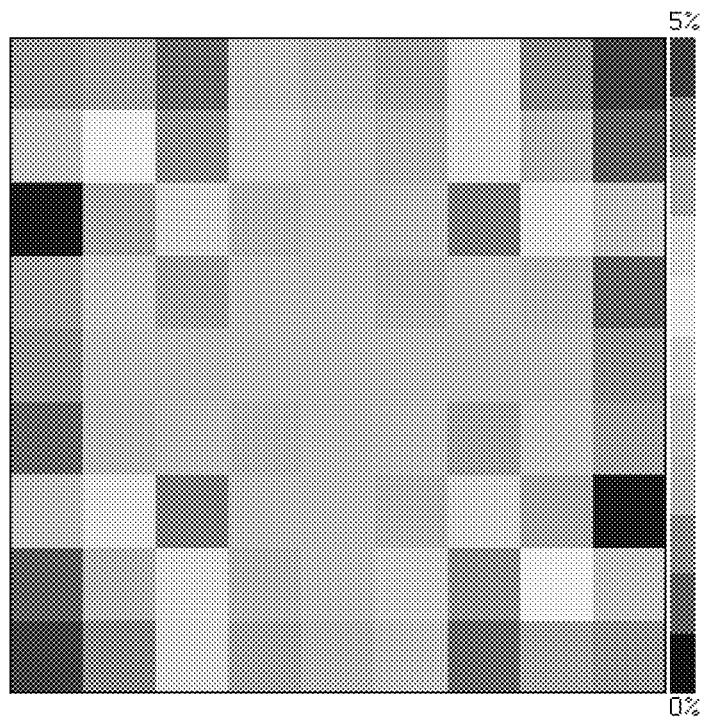
FIG. 22 presents a calculated 2D arrangement of laser pulses used to expand an initially flat mask blank in horizontal direction (x-direction) close to the front surface of the mask blank.
Figure 23:
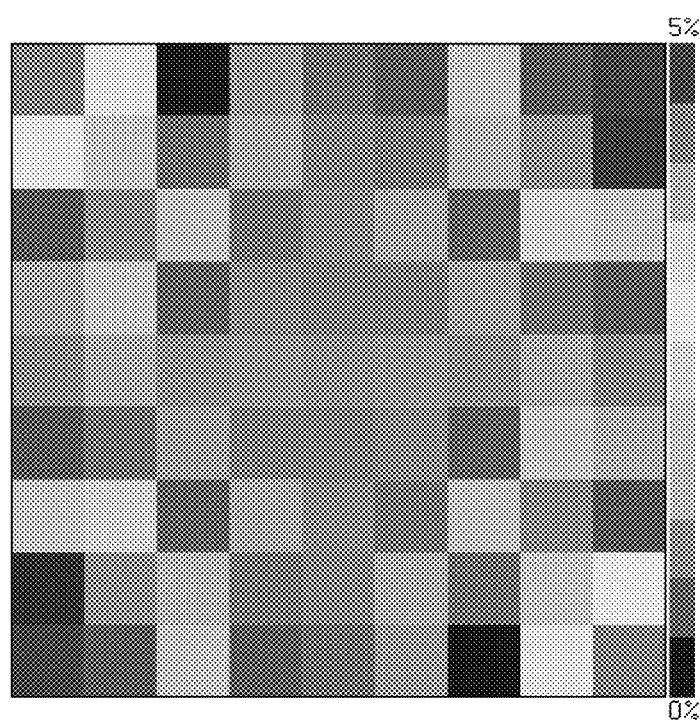
FIG. 23 shows a calculated 2D arrangement of laser pulses used to expand the initially flat mask blank in vertical direction (y-direction) close to the front surface of the mask blank.
Figure 24:
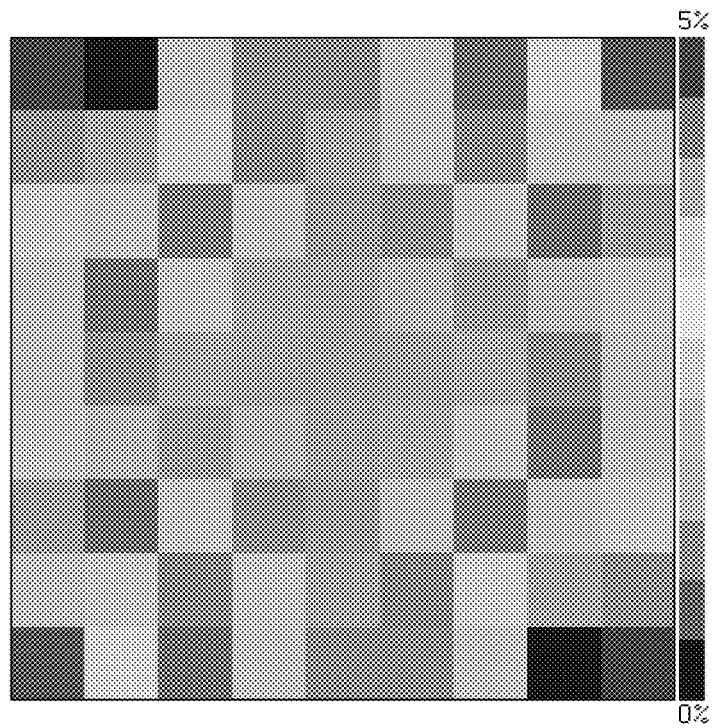
FIG. 24 depicts a calculated 2D writing mode used to expand the initially flat mask blank in horizontal direction close to the rear mask blank surface.
Figure 25:
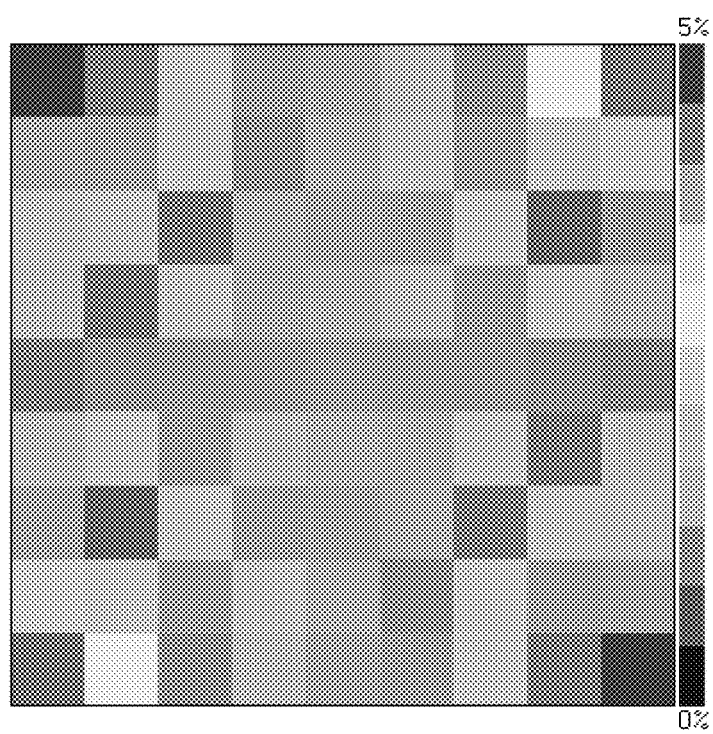
FIG. 25 represents a calculated 2D writing mode used to expand the initially flat mask blank in vertical direction close to the rear mask blank surface.

FIGS. 22 and 24 show calculated writing maps or 2D arrangements of laser pulses for writing modes which essentially lead to an expansion in x-direction. Similarly, FIGS. 23 and 25 represent computed 2D writing maps for writing modes which predominantly result in an expansion in y-direction. The 2D arrangements of laser pulses of FIGS. 22 and 23 are written close to the rear or bottom surface of a mask blank. On the other hand the 2D writing modes of FIGS. 24 and 25 are introduced close to the front or upper surface of the mask blank. In this example, the term "close to" describes a range of 100 µm to 800 µm from the respective surface. The two 2D writing modes close to the respective surface of the mask blank are separated in beam direction by a range of 15 µm to 50 µm. The four writing maps of FIGS. 22 to 25 form the 3D arrangement of laser pulses used to generate the 3D target contour.

As can be taken from FIG. 21, on the one hand, and from FIGS. 22 to 25, on the other hand, it is not easy to associate for equation 61 details of the 2D writing maps and the 3D contour or the target bending profile. This is a consequence of the minor rotation introduced by the 3D contour of equation 61 that destroys a covariation between the 3D contour, the shape of a mask blank (or generally an optical component in its initial state) and the 2D writing modes forming the 3D arrangement of laser pulses. The specific 3D contour, i.e. the saddle having different curvatures in the horizontal and the vertical direction can only be obtained by a 3D arrangement of laser pulses which combines the different writing modes, wherein in each case two of different writing modes are applied close to each surface of the mask blank.

On the other hand, the 180° rotational symmetry of the mask blank and the saddle of equation 61 (FIG. 21) is still reflected in a 180° rotational symmetry of the 2D arrangements of laser pulses indicated in FIGS. 22 to 25.

It can be seen from FIGS. 22 to 25 that most of the 9×9 cells or squares into which the mask blank is separated are occupied by the 2D arrangements of laser pulses so that the writing density is modified across a larger portion of the mask blank area. This means that at every specific position or location of the mask blank the resulting bending is a combination of all possible elementary deformations added with different weights. If it would be easily possible to flexibly select arbitrary orientations of the expansion directions of the writing modes (see FIG. 9), it would be optimal to apply writing modes in the 3D arrangement of laser pulses which have expansions along and normal to the saddle main axis. This would significantly reduce the amounts of the writing modes. Thus, in an ideal case, it would be possible to have a writing mode in which the orientation of the expansion direction can be controlled on a local basis. As long as this is difficult to achieve, the addition of more predefined writing modes to the 3D arrangement of laser pulses brings the generated 3D contour closer to the predetermined 3D target contour of FIG. 21.

Figure 26:
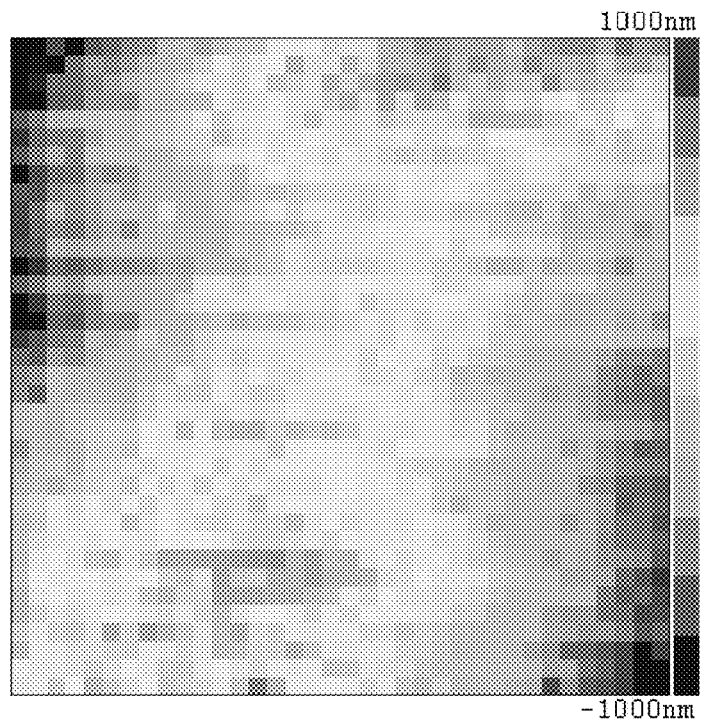
FIG. 26 shows the measured 3D contour of the mask blank induced by the application of the 3D arrangement comprising the writing maps of FIGS. 23 to 26.

FIG. 26 presents the measured 3D contour introduced in the mask blank by the 3D arrangement of laser pulses containing the arrangement of writing modes of FIGS. 22 to 25. In order to verify the induced 3D contour for the function of equation 61, the coefficients of this function are derived from the measured data. The computed numerical values for the coefficients are:

$$\alpha=-1.69\cdot 10^{-10}, b=+1.61\cdot 10^{-10}, c=+3.8\cdot 10^{-11} \quad (63)$$

The agreement of equations 62 and 63 is better than expected in light of the experimental difficulties discussed above for the precise measurement of the generated 3D contour. Typically, a writing density varies the optical transmission in the range of 3% to 5%. In the experiment, the focusing objective 540 is used far from its compensated depth. This may lead to errors in the determination of the writing depth of the writing modes contained in the 3D arrangement of laser pulses. Furthermore, the application examples described here rely on the repeatability of the placement of the mask blank in z-direction. The variation of the mask blank placement in the z-direction is estimated to be approximately 50 µm. Moreover, it is assumed that the variation of the mask blank thickness is also about 50 µm. These factors may add a writing repeatability error of 10% to 15% for each of the writing modes used to form the 3D arrangement of laser pulses. Thus, the generated 3D contour or the induced bending of the mask blank is a result of the combination of the deformations induced by all 2D arrangements of pixels of different modes which lead to a possible bending error of about 20% to 30%.

In the following example, the inventive method is applied to demonstrate its ability to improve the flatness of a surface of an optical component by applying a 3D arrangement of laser pulses in the optical component. A degraded quartz plate or mask blank having a pronounced bending is used in this application example in order to have a reasonable signal to noise ratio. For example, the specification of ASAHI for the flatness of a mask blank defines that a flatness deviation is ≤2 µm and ≤0.5 µm for advanced mask blanks.

Figure 27:
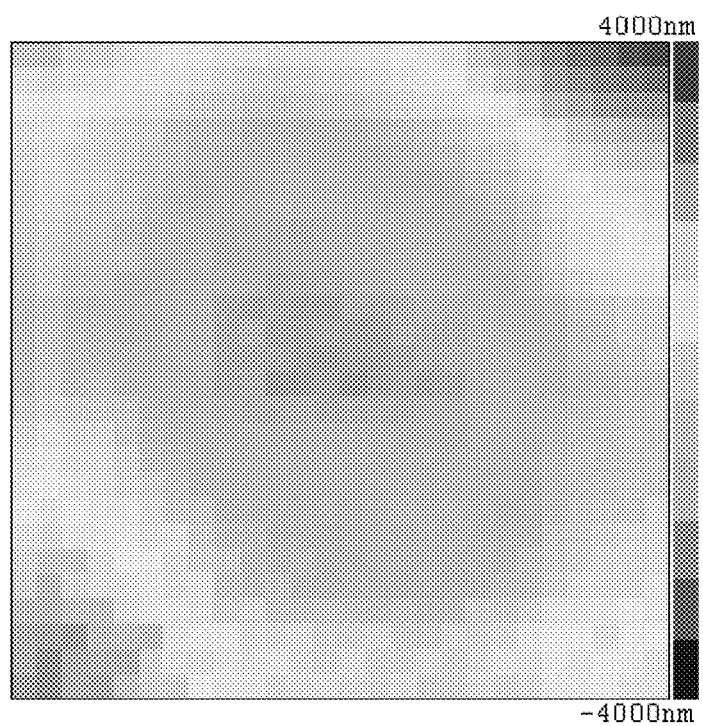
FIG. 27 presents a measured 3D contour of a mask blank.

FIG. 27 shows a measured 3D contour or a 3D profile of a mask blank. The total variation of the height covers a range of 8 µm (from −4000 nm to +4000 nm) so that the measured mask blank does not fulfill any of the ASAHI specifications. The measured 3D contour or the surface curvature does not change its sign across the mask blank. Therefore, the surface of the mask blank can be corrected by applying a 3D arrangement of laser pulses close to the front or upper surface. It is intended to reduce the flatness deviation to about 300 nm for two reasons: (a) a flatness deviation of about 300 nm fulfills the ASAHI specification of advanced mask blanks, and (b) as discussed above, the noise of the metrology tool used to determine the 3D contour of the mask blank is in the range of 300 nm.

Figure 28:
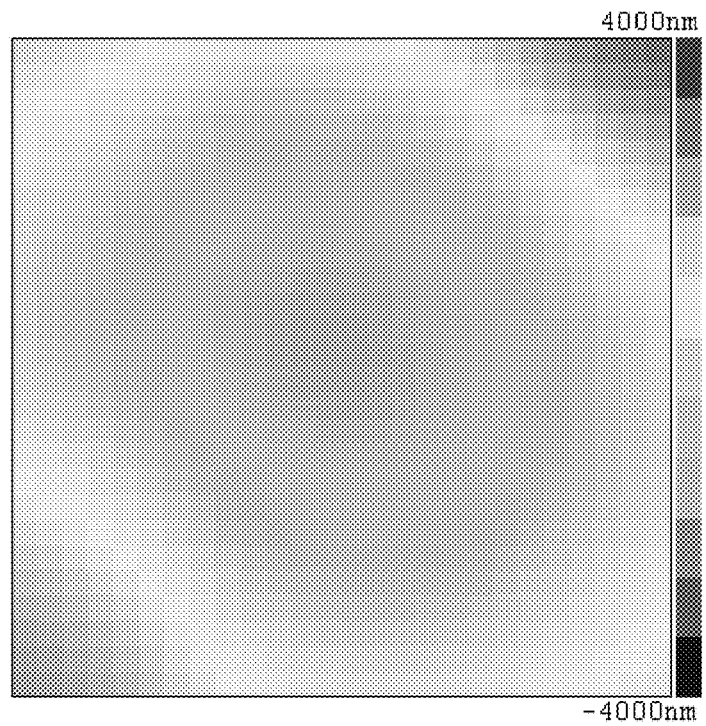
FIG. 28 shows the measured 3D contour of FIG. 27 after applying a TPS fit.

Similar to FIG. 18, a smoothing thin plate spline (TPS) fit is applied to the 3D contour of FIG. 27 which removes variations of the 3D contour having a magnitude of less than 300 nm. FIG. 28 presents the mask blank of FIG. 27 after performing a TPS fit of the measured 3D contour.

Figure 29:
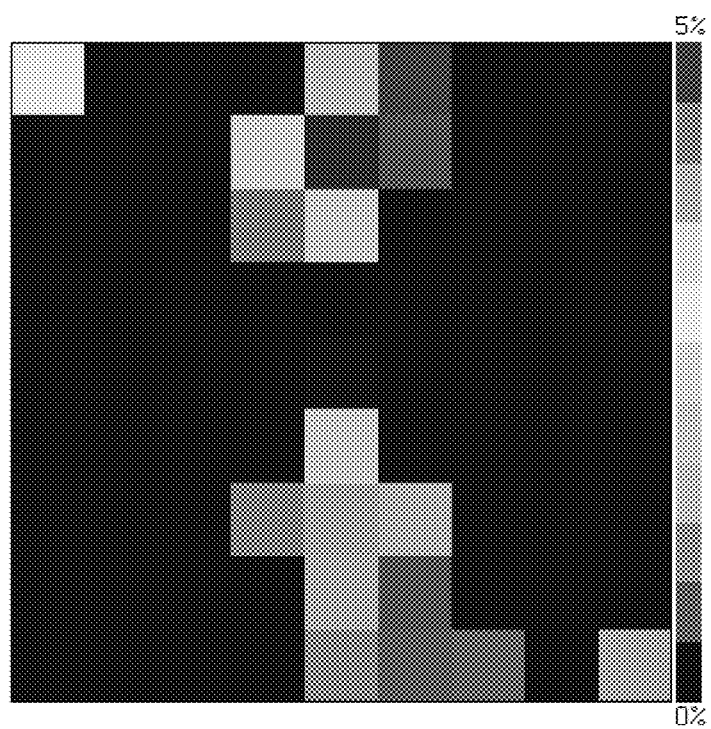
FIG. 29 represents a calculated 2D arrangement of laser pulses or writing map for expanding the 3D contour of FIG. 27 in horizontal direction in order to remove the 3D contour, i.e. to flatten the mask blank surface.
Figure 30:
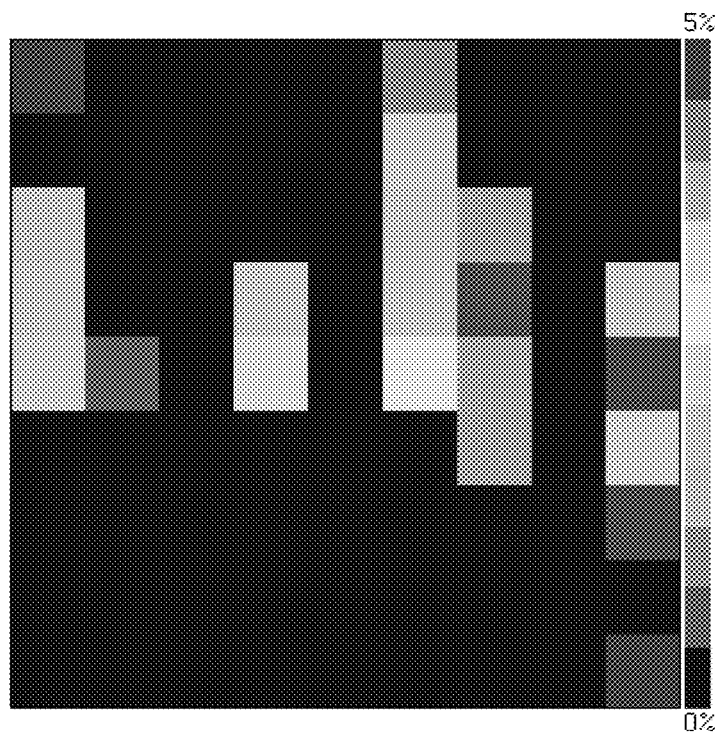
FIG. 30 depicts a calculated 2D arrangement of laser pulses for expanding the 3D contour of FIG. 27 in vertical direction in order to remove the 3D contour, i.e. to flatten the mask blank surface.

FIGS. 29 and 30 depict the two writing modes contained in the 3D arrangement of laser pulses and used for flattening the 3D contour of FIG. 28. For the computation of the 3D arrangement a grid of 9×9×3 is used across the mask blank. The two writing modes may induce a variation of the optical transmission in the range of 0% to 5%. Both 2D arrangements of laser pulses predominantly locally expand the mask blank in a plane perpendicular to the laser beam. A simulation shows that it is possible to flatten up to 94% of the 3D contour of the smoothed TPS fit.

Figure 31:
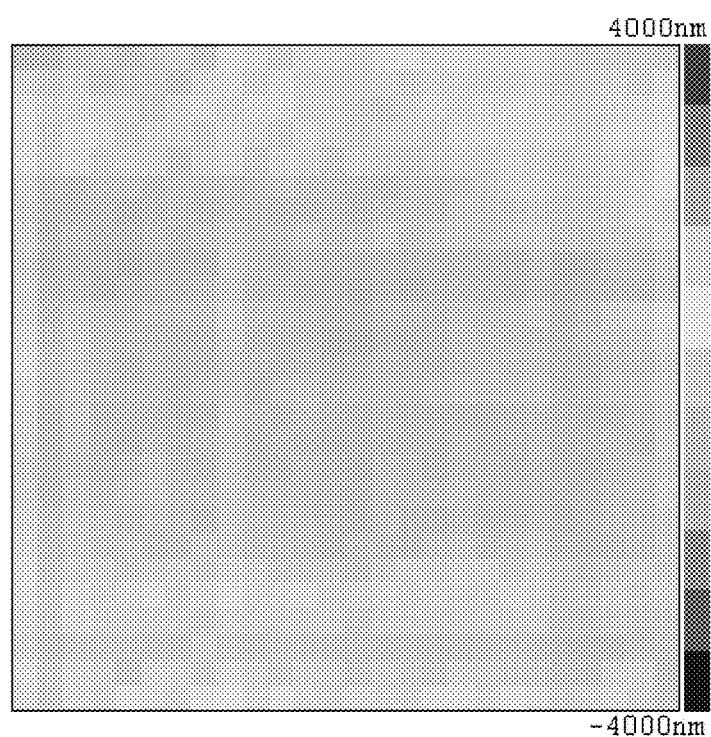
FIG. 31 presents the 3D contour of FIG. 27 after applying the 3D arrangement of laser pulses comprising the writing maps of FIGS. 29 and 30.

FIG. 31 shows the 3D contour of FIGS. 27 and 28 after the application of the 3D arrangement which contains two writing modes. The flatness variation is reduced from a range of 6500 nm with a standard deviation (1σ) of 1000 nm of FIG. 27 to a flatness deviation of about 1300 nm with a standard deviation of about 250 nm. This means that the 3D contour of FIG. 27 could be flattened by a factor of 4.

Figure 32:
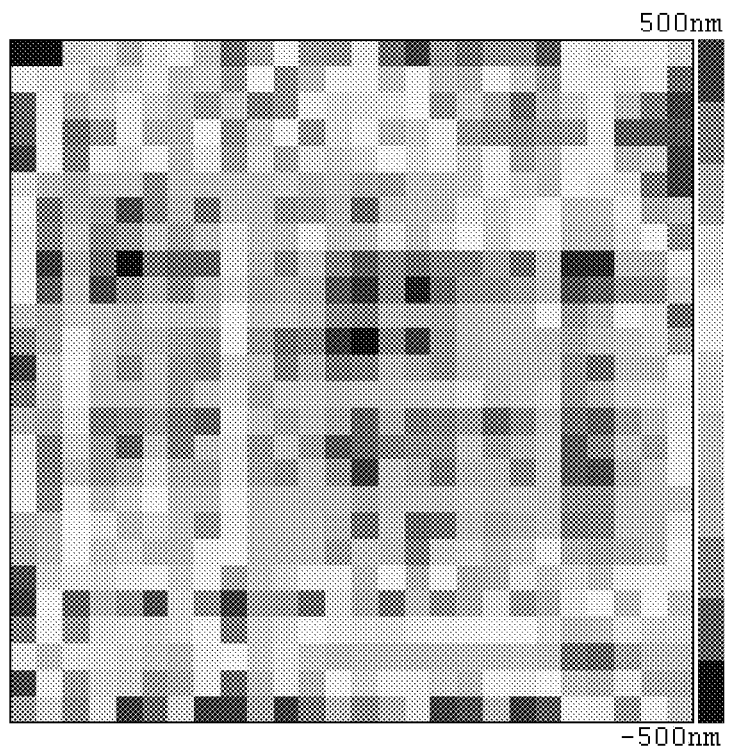
FIG. 32 shows the 3D contour of FIG. 31 after reducing the height scale from 8 µm (−4000 nm to +4000 nm) to 1 µm (−500 nm to +500 nm)

FIG. 32 represents again the measured 3D contour of FIG. 31 wherein the scale of the height is reduced from 8 µm (−4000 nm to +4000 nm) to 1 µm (−500 nm to +500 nm). FIG. 32 reveals that the writing mode responsible for the expansion of the mask blank in y-direction shows some undershoot and that there is some room for improvement. On the other hand, the expansion of the mask blank in x-direction is near the target expansion in this direction.

Further, as it can be clearly seen in FIG. 32, the measured 3D contour contains a significant contribution of the measurement noise of FIG. 27. It is again assumed that the initial 3D contour of the mask blank has a smooth curvature. Further, it is not possible to induce a front surface modulation with a high frequency by applying a 3D arrangement of laser pulses as far as 6 mm (or $10^6$ nm) from the front surface (or 350 nm from the rear surface of the mask blank). Based on these assumptions a smoothing TPS fit is applied to the measured 3D contour of FIG. 32 in order to eliminate the measurement noise of the metrology tool from FIG. 32.

Figure 33:
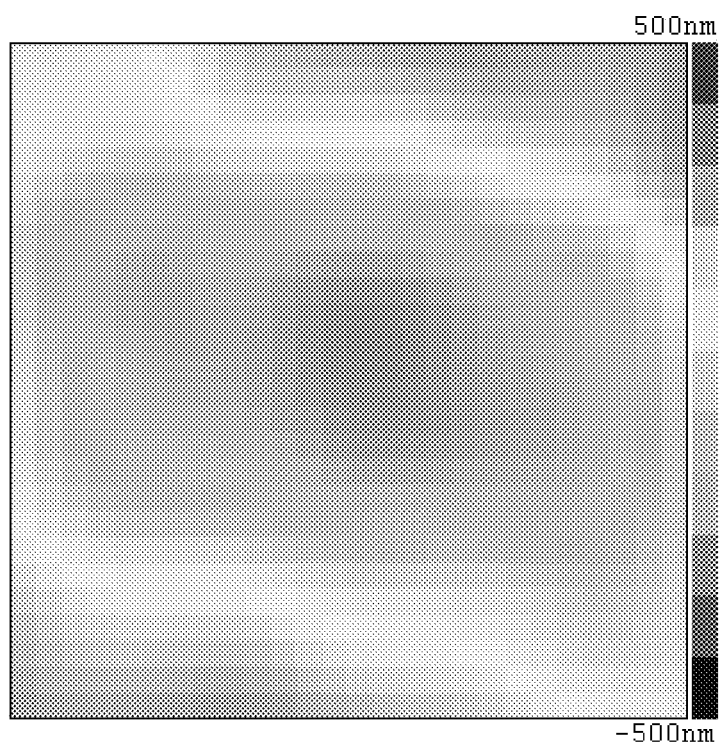
FIG. 33 represents the 3D contour of FIG. 32 after applying a smoothing TPS fit.

FIG. 33 presents the residual 3D contour of FIG. 32 after the smoothing TPS fit. The 3D contour shows a height variation of about 700 nm with a standard deviation of 180 nm. The correct way to compare the result of the application of the 3D arrangement of laser pulses is to compare TPS data of the initial 3D contour and the TPS data of the remaining 3D contour after finalization of the application of the 3D arrangement of laser pulses. This approach allows to some extent to eliminate the noise of the metrology tool 400 and to distill the characteristics of the initial and the remaining 3D contour.

The standard deviation of the 3D contour could be reduced from 1000 nm to 180 nm which results in an improvement of 82%. This means that the initially rejected mask blank (as it does not fulfill the ASAHI specification for regular mask blanks) is brought in the range of the ASAHI specification for advanced mask blanks.

If measurement data of a 3D contour are available having a low noise contribution (expressed for example by its standard deviation) the described method can improve the 3D contour by more than one order of magnitude, and thus bringing an existing 3D contour in close accordance with a predetermined 3D contour.

Wafers

In a second application example the defined method is applied to write one or more three-dimensional (3D) arrangements of laser pulses into a wafer. In a first part of this section, parameters of the laser pulses are estimated which can be used to write pixel in a silicon wafer. Silicon is used in the following example as it is a popular semiconductor material. However, the use of the method defined in this application is not restricted to silicon (Si) wafers. Rather, the method can also be used for wafers which comprise different semiconductor materials, as for example germanium (Ge). Further, it can also be applied to wafers comprising compound semiconductors having two or more semiconducting elements. Examples of binary compound semiconductors are gallium arsenide (GaAs), indium phosphide (InP), and gallium nitride (GaN), just to name a few.

In the following the term "wafer" is used in the meaning that it comprises the input to a semiconductor manufacturing process, i.e. typically a semiconductor disc and the output of the semiconductor process, i.e. a fabricated component just before it is separated from the wafer. Moreover, the term "wafer" comprises all intermediate stages of the wafer in the semiconductor manufacturing process.

Figure 34:
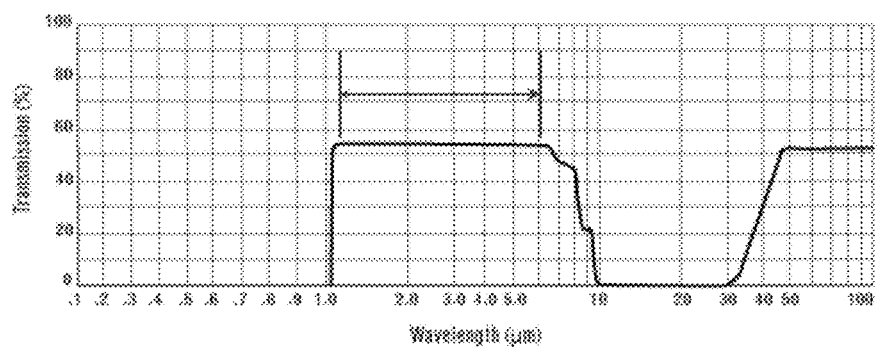
FIG. 34 presents an overview of the transmission spectrum of silicon (Si) in the wavelength range from 0.1 µm to 100 µm.

FIG. 34 presents an overview of the transmission spectrum of silicon for the wavelength range of 0.1 µm to 100 µm in a semi-logarithmic representation, i.e. covering four orders or magnitude for the wavelength. This spectrum has been taken from the Internet: http://micro.com/technical-notes/bk7-quartz-ge-si. The band gap energy of the indirect transition of pure Si is approximately 1.14 eV at 300 K which corresponds to a wavelength of 1.09 µm. This band gap energy is indicated by the shape increase of the transmission in the wavelength region around 1 µm. For electromagnetic radiation having an energy which is higher than the band gap energy, the absorption coefficient of silicon is high in the wavelength range from 0.1 µm to 1.0 µm. Silicon is used as a detector material for ultraviolet and visible radiation.

Silicon is transparent for electromagnetic radiation in the wavelength ranges from approximately 1.1 µm to 6.0 µm and silicon and again from approximately 40 µ//m to 100 µm. The arrow in FIG. 34 indicates the interesting wavelength range from 1.2 µm to 7.0 µm which can be used for writing pixels into pure silicon.

Figure 35:
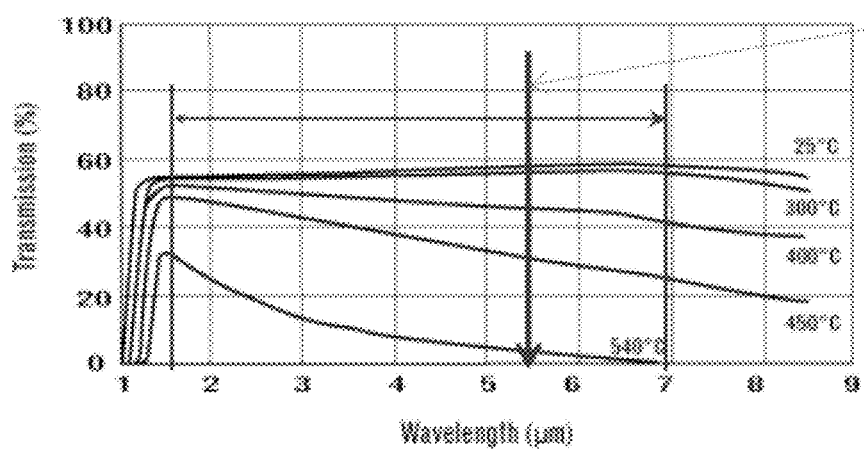
FIG. 35 depicts the transmission spectrum of Si in the wavelength range from 1 µm to 9 µm and additionally shows the temperature behaviour of the transmission in this wavelength range.

FIG. 35 depicts the wavelength range of 1 µm to 9 µm with a higher spectral resolution. This curve has been taken from the Internet: http://micro.com/technical-notes/bk7-quartz-ge-si. FIG. 35 additionally indicates the variation of the transmission as a function of temperature. It clearly shows that the optical transmission significantly reduces when heating silicon. This effect is more pronounced for the larger wavelength. Using a wavelength of around 5 µm may be beneficial.

Figure 36:
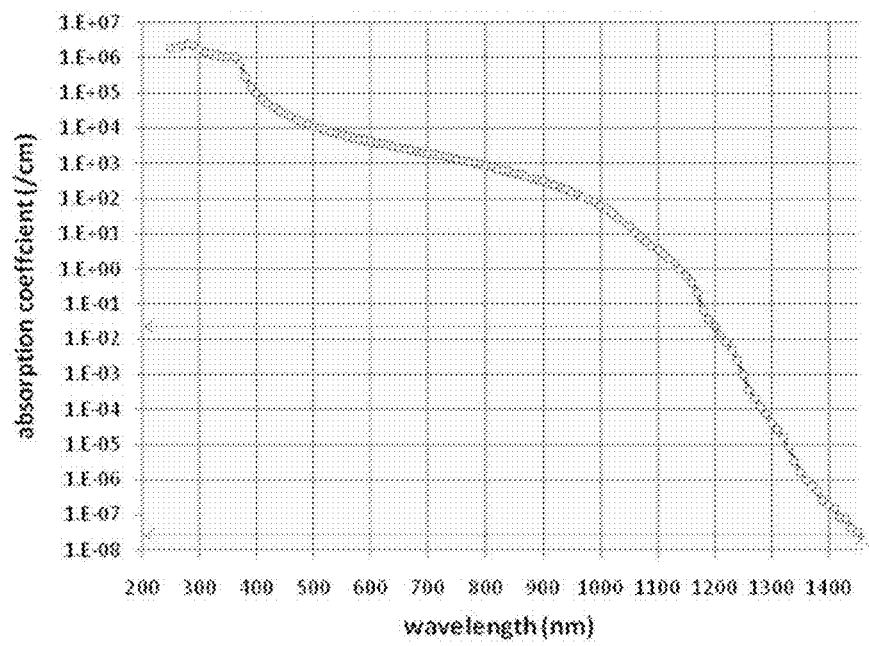
FIG. 36 shows the variation of the absorption coefficient across the wavelength range from 250 nm to 1400 nm.

FIG. 36 shows the absorption coefficient of Si as a function of the wavelength in the range of 200 nm to 1400 nm in a semi-logarithmic representation. This diagram again indicates that silicon can be used as a detector material for electromagnetic radiation in the wavelength range from 200 nm to approximately 1000 nm. In the wavelength range from 1000 nm (approximately the band edge of pure Si at 300 K) to 1400 µm the absorption drops by more than 8 orders of magnitudes. As can be taken from FIG. 36, the absorption coefficient is about $\alpha=100$ cm$^{-1}$ at 1000 nm, it is about a=2 cm$^{-1}$ at 1100 nm, and is approximately $\alpha=0.02$ cm$^{-1}$ at 1200 nm.

FIG. 35 suggests that wavelengths in the range of 5 µm are preferred for the writing of pixels into a Si wafer with respect to the requirement that Si needs to be transparent for the electromagnetic radiation or for the laser pulses used to introduce pixel in Si. However, looking at the absorption coefficient of Si as shown in FIG. 36 it seems that the wavelength of the laser pulses needs to stay below 1300 µm.

TABLE 6

Silicon material parameters at 293 K

| Parameter | Numerical value | Unit | Source |
| --- | --- | --- | --- |
| Melting point | 1683 | K | a |
| Density (crystalline) | 2.336 | g/cm$^3$ | a |
| Density (amorphous) | 2.29 | g/cm$^3$ | b |
| Specific heat capacity | 703 | J/(kg · K) | a |
| Absorption coefficient | 0.01 (at 3 µm) | cm$^{-1}$ | c |
| Thermal conductivity | 150 | W/(m · K) | a | a: http://de.wikipedia.org/wiki/Silizium
b: P. D'Antonio and J. H. Konnert, Appl. Phys. Lett., Vol. 64, issue 4, p. 437-439, January 1994, ISSN: 0003-6951, Digital Object Identifier: 10.1063/11.111121
c: M. A. Green, Solar cell research and development in Australia, Solar Cells, Vol. 26, pp. 1-166 (1989)

In order to locally melt Si it is necessary to locally generate a temperature >1683 K or 1410° C. within a silicon wafer. Once the Si crystal is locally melted, it is likely that the melted volume solidifies as amorphous Si which has a density which is 1.8% lower than that of crystalline Si (see Table 6). Hence, the local amorphous volumes or the pixels require 1.8% more volume than the surrounding crystalline Si and thus induce stress in the Si crystal.

The generation of local volumes in which the melting point is surpassed requires very or ultra-short laser pulse. Only by applying one or more ultra-short laser pulses a heating of a small Si volume can be generated which is fast enough so that the generated heat cannot significantly dissipate in a volume surrounding the focus spot of the laser pulse. The authors P. L. Liu, R. Ren and N, Bloembergen report in the article "Picosecond laser-induced melting and morphology on Si", Appl. Phys. Lett., vol. 34, pp. 864-66, 1979 that heating and cooling rates of up to $10^{14}$ K/s could be achieved for picosecond pulses. This means that in 1 ps the Si crystal may heat and cool up to 100 K. Therefore, a laser system is needed which can at least generate laser pulses having a pulse duration of less than 1 ps.

Figure 37:
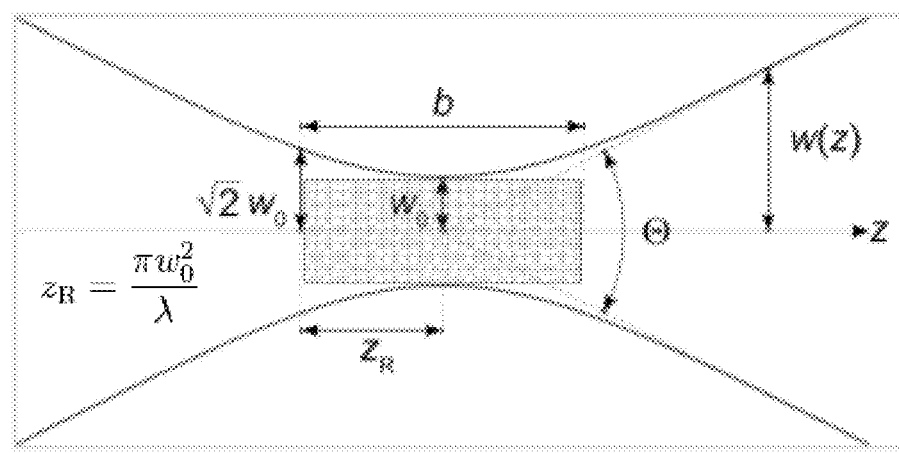
FIG. 37 illustrates the focus range of a Gaussian beam and represents a cylinder in this range.

In the following laser parameters will be estimated which induce a local melting of a small volume within a Si crystal or Si wafer. It is assumed that a small volume is locally heated in a focus of a laser pulse having a Gaussian beam. FIG. 37 illustrates this situation. It is assumed that a cylinder of radius $w_0$ and length b is heated to a temperature above the melting point of Si, wherein $w_0$ is the beam waist and b is the depth of focus. For a Gaussian beam the beam waist is determined by $$w_0 = \frac{\lambda}{\pi \cdot \alpha} = \frac{\lambda_0}{\pi \cdot n \cdot \sin\alpha} = \frac{\lambda_0}{\pi \cdot NA}, \quad (64)$$

wherein the wavelength $\lambda$ within the silicon crystal is replaced by the vacuum wavelength or the wavelength in the air $\lambda_0$ and the refractive index of silicon n. NA denotes the numerical aperture of the optical system used to focus the laser pulses into the cylinder of FIG. 37. Further, the approximation is used that for small angles $\sin\alpha \approx \alpha$. The angle $\alpha$ is half of the total angle spread $\Theta$ of the Gaussian beam.

As can be seen from FIG. 37, the depth of focus is two times the Raleigh range $z_R$, wherein the Raleigh range or length is given by:

$$z_R = \frac{\pi \cdot w_0^2}{\lambda}. \quad (65)$$

Thus the length b of the cylinder is:

$$b = 2 \cdot z_R = 2 \cdot \frac{\pi \cdot w_0^2}{\lambda} = 2 \cdot \frac{\pi \cdot n \cdot w_0^2}{\lambda_0} = 2 \cdot n \cdot \frac{\lambda_0}{\pi \cdot (NA)^2} \quad (66)$$

wherein equation (64) is used for the last transformation.

The cylinder with length b and radius $w_0$ has a volume:

$$V = \pi \cdot w_0^2 \cdot b = \pi \cdot \frac{\lambda_0^2}{\pi^2 \cdot (NA)^2} \cdot 2 \cdot n \cdot \frac{\lambda_0}{\pi \cdot (NA)^2} = 2 \cdot n \cdot \frac{\lambda_0^3}{\pi^2 \cdot (NA)^4} \quad (67)$$

The specific heat capacity is given by:

$$c = \frac{W}{m \cdot \Delta T}, \quad (68)$$

wherein $\Delta T = 1683K - 293K = 1390K$ when the heating process starts from room temperature. The energy which is necessary to locally melt a small volume V of the Si crystal $$\left(\rho = \frac{m}{V}\right)$$

can be estimated from equations (67) and (68):

$$W = c \cdot \rho \cdot V \cdot \Delta T = 2 \cdot n \cdot c \cdot \rho \cdot V \cdot \Delta T \cdot \frac{\lambda_0^3}{\pi^2 \cdot (NA)^4}. \quad (69)$$

Figure 38:
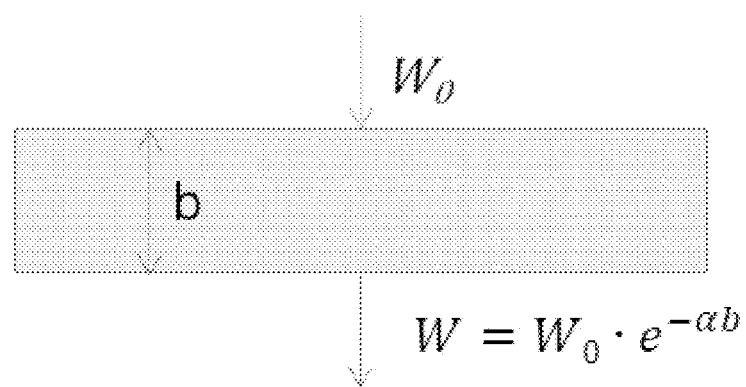
FIG. 38 depicts the energy deposited by a laser pulse in the cylinder of FIG. 37 in the Gaussian beam focus.

The energy absorbed within the Gaussian focus, i.e. the length b of the cylinder is approximated by the Lambert-Beer law. FIG. 38 schematically depicts the intensity loss I(z) within the Gaussian focus:

$$I(z) = I_0 \cdot e^{-\alpha \cdot z} \quad (70)$$

wherein a denotes the absorption coefficient of the Si crystal which is represented in FIG. 36. The intensity loss is equivalent to the energy loss of the Gaussian beam within its focus:

$$W(b) = W_0 \cdot e^{-a \cdot b} \quad (71)$$

wherein $W_0$ is the energy arriving at the Gaussian focus and W(b) is the energy leaving the focus or the cylinder of length b. It is now assumed that the product $a \cdot b < 1$, i.e. only a portion of energy of a laser pulse is absorbed in the cylinder in the Gaussian beam focus so that $$\Delta W = W_0 - W(b) = W_0(1 - e^{-a \cdot b}) \approx W_0(1 - (1 - a \cdot b)) = W_0 \cdot a \cdot b \quad (72)$$

Figure 39:
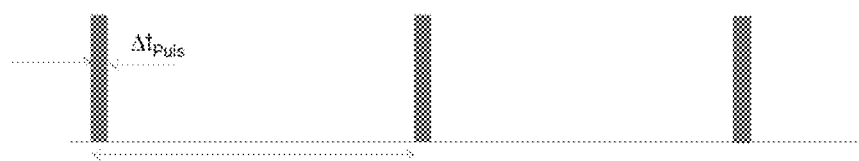
FIG. 39 represents a regular pulse train, wherein the individual pulses have a pulse width $\Delta t_{Pulse}$ and period $\Delta T$.

FIG. 39 illustrates a pulse train of a laser system which has pulses of a pulse length or a pulse width $\Delta t_{Pulse}$. The time period $\Delta T$ between two laser pulses is uniform between two pulses as indicated by the arrow. Therefore, the periodic pulse train linked is with the frequency as: $\Delta T = 1/f$.

The mean power emitted by the laser system in the pulse train of FIG. 39 is given by:

$$\overline{P} = \frac{1}{\Delta T} \cdot \int_0^{\Delta T} P(t) \cdot dt \approx \frac{1}{\Delta T} \cdot P_{Pulse} \cdot \Delta t_{Pulse} = f \cdot P_{Pulse} \cdot \Delta t_{Pulse}, \quad (73)$$

wherein $P_{Pulse}$ is the pulse power. Thus, the pulse power can be expressed as a function of the mean power of the laser system, its frequency and the pulse width of the individual pulses:

$$P_{Pulse} = \frac{\overline{P}}{f \cdot \Delta t_{Pulse}}. \quad (74)$$

The pulse energy $W_0$ of an incident laser pulse can be expressed using pulse power and the pulse width:

$$W_0 = P_{Pulse} \cdot \Delta t_{Pulse}. \quad (75)$$

It is now assumed that the energy loss of a laser beam as given in equation (72) in the Gaussian focus is absorbed by the Si crystal within the focus:

$$W_{absorbed} = \Delta W = W_0 \cdot a \cdot b = P_{Pulse} \cdot \Delta t_{Pulse} \cdot a \cdot b = \frac{\overline{P}}{f} \cdot a \cdot b = \quad (76)$$
$$= \frac{\overline{P}}{f} \cdot a \cdot 2 \cdot n \frac{\lambda_0}{\pi \cdot (NA)^2} = \frac{2 \cdot n \cdot a \cdot \overline{P} \cdot \lambda_0}{\pi \cdot f \cdot (NA)^2},$$

wherein equation (75) has been used.

Equation (69) describes the power required to increase the temperature within the Gaussian focus at least by the temperature difference $\Delta T$. Equation (76) expresses the energy provided by a laser pulse. Equating equation (69) with equation (76) leads to:

$$2 \cdot n \cdot c \cdot \rho \cdot \Delta T \cdot \frac{\lambda_0^3}{\pi^2 (NA)^2} = \frac{\overline{P}}{f} \cdot a \cdot 2 \cdot n \frac{\lambda_0}{\pi \cdot (NA)^2} = \frac{2 \cdot n \cdot a \cdot \overline{P} \cdot \lambda_0}{\pi \cdot f \cdot (NA)^2}. \quad (77)$$

From equation (77) the temperature difference $\Delta T$ can be expressed as a function of the mean pulse energy $\frac{\overline{P}}{f}$:

$$\Delta T = \frac{a(\lambda_0) \cdot \pi \cdot (NA)^2}{c \cdot \rho \cdot \lambda_0^2} \cdot \frac{\overline{P}}{f}. \quad (78)$$

Further, the required mean power of a laser required to locally melt a Si crystal in the Gaussian focus can be estimated from the required temperature difference $\Delta T$:

$$\overline{P} = \frac{\Delta T \cdot c \cdot \rho \cdot \lambda_0^2 \cdot f}{a(\lambda_0) \cdot \pi \cdot (NA)^2}. \quad (79)$$

In equations (78) and (79) it is indicated that the absorption coefficient of Si strongly depends on the wavelength of the laser system applied to introduce pixels into the Si crystal, as it can be seen from FIG. 36. Apart from the material parameters $\alpha(\lambda_0)$ and $\rho$ of the silicon crystal, equations (78) and (79) further contain the parameter NA of the optical system and the frequency f of the laser system. It is assumed for the following considerations that the focusing optic fulfils: NA=0.8. In order to confine the high energy area, i.e. the Gaussian focus in the z-direction, which is the propagation direction as can be seen from FIG. 37, a focusing optic can be utilized using a solid immersion lens (SIL) which would allow the NA to exceed 2.

Figure 40:
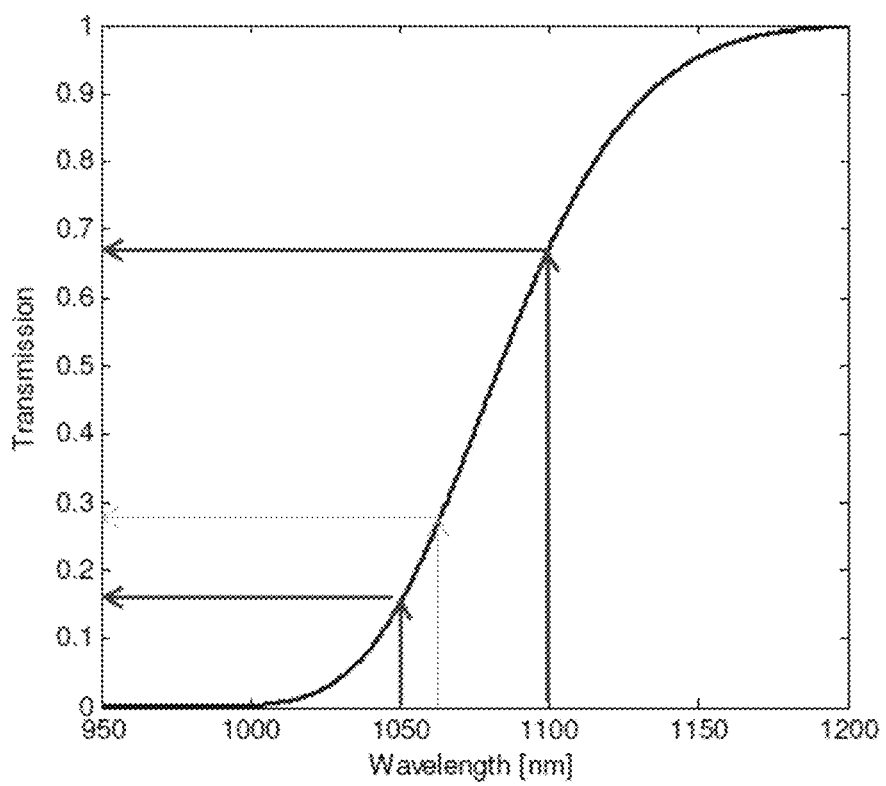
FIG. 40 shows the transmission of Si in the band edge range, i.e. in the wavelength range from 950 nm to 1200 nm.

FIG. 40 shows the variation of the internal optical transmission of a pure Si wafer having a thickness of 775 µm in the range of its band edge. A wavelength of the laser pulses used to write pixels in the Si wafer has to be selected which on the one hand low enough so that the photons of the laser pulses are absorbed in the Si wafer and in particular in the Gaussian beam focus. On the other hand, the wavelength of the laser pulses has to be high enough in order to have a reasonable transmission through the whole wafer thickness so that pixels can be placed at predetermined locations.

Figure 41:
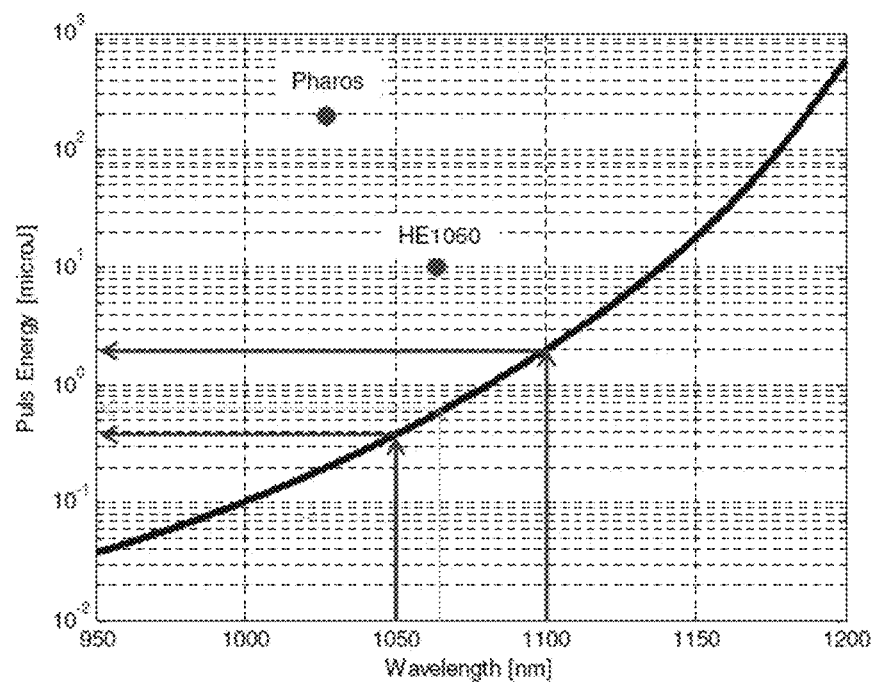
FIG. 41 presents the pulse energy estimated to heat up the Gaussian beam focus of FIG. 37 to a temperature exceeding the melting point of Si.

FIG. 41 represents the pulse energy as a function of the wavelength around the band edge of a pure Si crystal. The pulse energy amounts 0.4 µJ as can be taken from FIG. 41 for a wavelength of 1050 nm. The pulse energy rises to approximately 1 µJ for a laser pulse having a wavelength of about 1100 nm. Thus, the estimated energy range for writing pixels in a Si crystal is similar to the one for introducing pixel in a substrate of a photolithographic mask, as is indicated in Table 1. The two dots in FIG. 41 indicate that laser systems are available which are able to supply enough pulse energy to locally melt a silicon crystal.

The HE1060 of FIG. 41 is an Nd-YAG laser system which emits laser pulses at 1064 µm. It can supply sufficient energy to locally melt a Si crystal within a wafer within a Gaussian beam focus. The melted Si volume within a wafer will solidify as amorphous silicon which has a mass density which is 1.8% smaller than that of crystalline silicon (see Table 6). Hence, the pixels will induce stress in the surrounding Si crystal which can be used to alter the surface contour of a Si wafer.

The assessment for the laser parameters given above is only a rough estimation. A more accurate estimation of the laser parameters to write pixels into a Si wafer can be obtained by performing a finite element calculation of how incoming laser pulses propagate through the Si wafer, and in particular how the temperature within the Gaussian focus dynamically changes the optical properties of the Si crystal. For example, as can be seen in FIG. 35, the absorption in silicon increases as a function of the temperature of the Si crystal. Further, a more accurate estimation also considers how the energy deposited in the Gaussian beam focus dissipates into the surrounding crystal material. Thus, the estimation presented above is a very first order approximation that shows that arrangements of pixels can also be written in a defined manner into a Si crystal or more generally in a semiconductor crystal.

Figure 42:
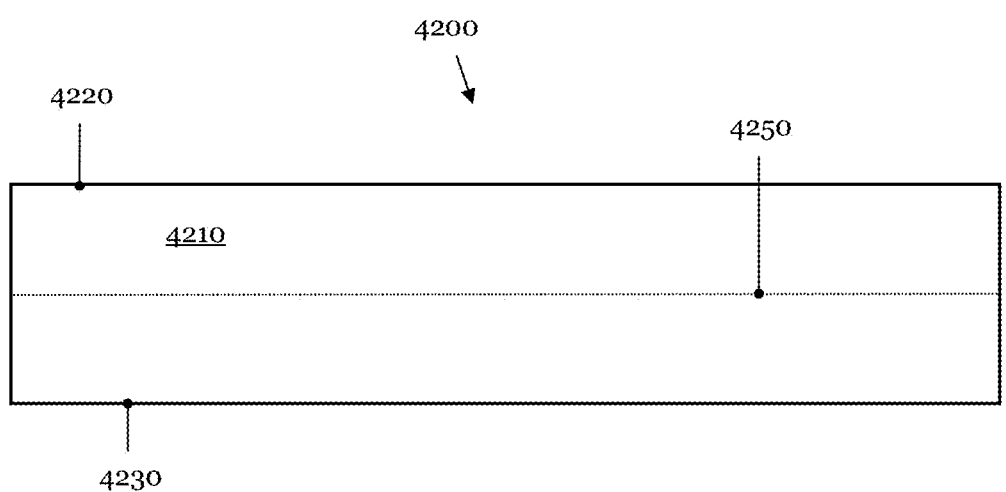
FIG. 42 shows a schematic cross-section through a wafer prior to the beginning of a process to fabricate integrated circuits on the front surface of the wafer.

In the following, the bending of a wafer and its correction is discussed. The diagram 4200 of FIG. 42 schematically depicts a cross-section through a wafer 4210 at the beginning of a process to fabricate integrated circuits on the front surface 4220 of the wafer. The dotted line 4250 indicates the half of the depth of the wafer 4210 and is also called neutral plane. The wafer 4210 is fixed with a chuck, for example a vacuum chuck, on its rear surface 4230. In the example illustrated in FIG. 42, the wafer 4210 is a silicon wafer.

Figure 43:
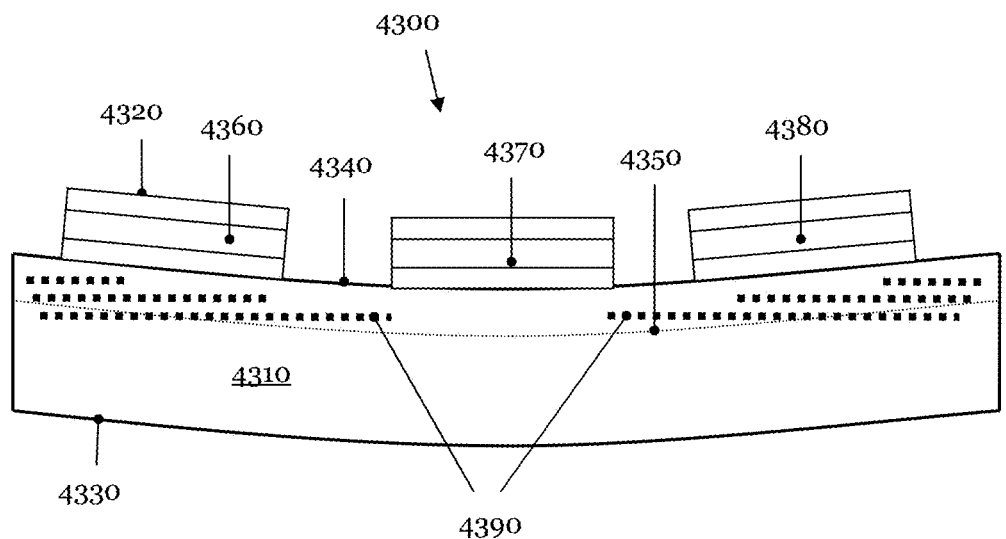
FIG. 43 schematically presents the wafer of FIG. 34 after some or all of the processing steps have been performed and indicates the locations of two three-dimensional (3D) arrangements of laser pulses to be introduced into the processed wafer.

FIG. 42 shows that the wafer 4210 is essentially plan prior the start of the processing steps to fabricate one or more integrated circuits (ICs) on its front surface 4220. FIG. 43 schematically illustrates the situation after some processing steps have been performed in order to generate the ICs 4360, 4370 and 4380. The processing of the front surface 4320 has induced stress in the wafer 4310 which results in a bending of the wafer 4310.

In the example illustrated in FIG. 43, ICs are fabricated on the front surface 4320 of the wafer 4310. The person skilled in the art will appreciate that any kind of ICs can be fabricated on the wafer 4310. Moreover, the method defined in this application can be applied to any manufacturing process which causes stress in the wafer 4310.

The magnitude of the bending depends on the wafer, its dimensions and the IC(s) to be fabricated on the wafer. The bending may be in the range of up to 100 µm and may be even larger for unfavorable conditions. The bending effect tends to increase with advanced storage technologies, as for example 3D NAND.

The apparatus 400 of FIG. 4 can be used to measure the amount of bending of the wafer 4310. It is preferred to use the front surface 4320 of the wafer 4310 to determine the amount of wafer bending. This allows measuring the wafer 4310 as it is fixed to the chuck. In an alternative approach, the rear surface 4330 of the wafer 4310 which has no profile or topography due various processing steps can also be used to determine the bending effect of the wafer 4310.

In the next step, three-dimensional (3D) arrangements of laser pulses are calculated using the measured bending data as input data. This step is described in more detail in the context of the discussion of the apparatus 500 of FIG. 5.

Finally, the calculated 3D arrangements of laser pulses are written into the upper part of the wafer 4310 which generates 3D arrangements of pixels in the wafer 4310 which are indicated by the dots 4390. As can be seen from FIG. 43, the calculated 3D arrangements of laser pulses take into account the symmetry of the problem, i.e. the bending of the wafer 4310.

Figure 44:
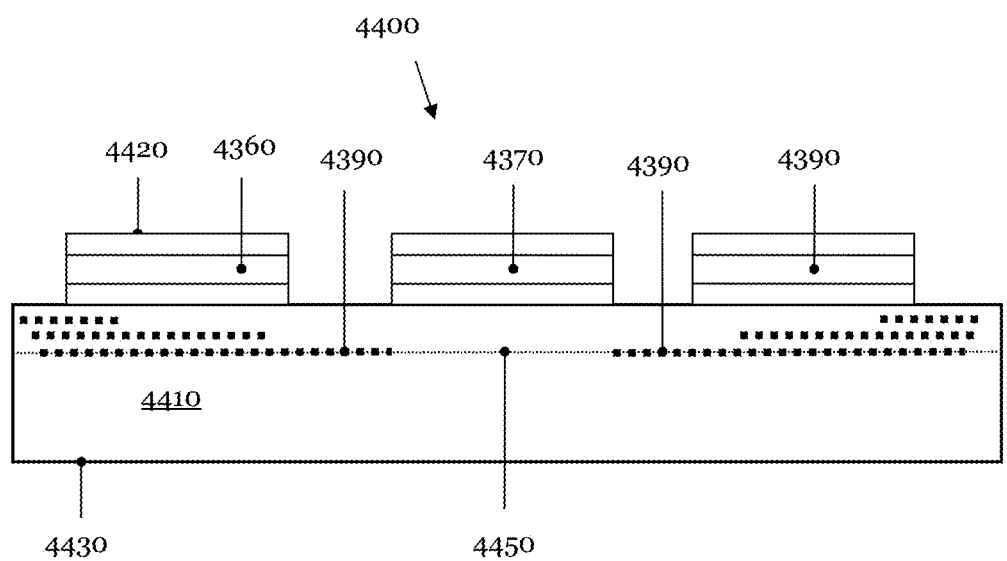
FIG. 44 schematically depicts the processed wafer of FIG. 35 after the two 3D arrangements of laser pulses have been introduced into the processed wafer.

FIG. 44 schematically represents the wafer 4410 after finalization of the pixel writing process. The bending of the wafer 4310 of FIG. 43 is essentially removed for the wafer 4410. In the example illustrated in FIGS. 43 and 44, a laser system can be used for generating the ultra-short laser pulses which emits at a wavelength of around 2 μm. Laser which emits in this wavelength range are for example Ho-YAG and Tm-YAG laser systems. As it is estimated above, it is also possible to use Nd-YAG laser systems emitting at a wavelength of 1064 nm which are presently used to cut dies from a wafer. This is beneficial as an already available laser system can be applied for the introduction of the 3D arrangements of laser pulses in the wafer 4310.

The parameters of the laser pulses and the 3D arrangements of laser pulses are selected so that the pixels locally induce stress into the Si crystal which reduces the mass density of the wafer 4410 in order to counteract the stress introduced by various processing steps and leading to the bending effect.

It is preferred to introduce the laser pulses through the front surface 4320 of the wafer 4310 as this can be performed with a minimum handling effort of the wafer 4310. In doing so, it has to be taken into account that the processing steps may change, i.e. reduce the band gap of the materials of the ICs 4360, 4370 and 4380 with respect to the pure silicon wafer 4310. This means that it is necessary to select a wavelength for the laser pulses so that the radiation can essentially transmit through the ICs 4360, 4370 and 4380 without any absorption. In an alternative approach, it is also possible to introduce the 3D arrangements of laser pulses through the rear substrate surface 4330. As can be seen from FIGS. 42 and 43, the 3D arrangements of pixels are arranged in the substrate of the ICs 4360, 4370 and 4380 but not in their functional layers. Therefore, the pixel writing process does not induce any damages to the ICs 4360, 4370 and 4380.

FIG. 45 depicts a flow chart 4500 of an embodiment of the inventive method. The method begins at block 4510. In a first step 4520, an existing 3D contour of an optical component or a wafer is measured. For example, the metrology tool 400 depicted in FIG. 4 can perform this step. In a second step 4530, a deviation of the existing 3D contour from a predetermined 3D contour is determined. This method step can for example be executed by the computer 560 or the computer system 560 of FIG. 5. Then in step 4540, a 3D arrangement of laser pulses is calculated from the deviation determined in step 4530. By way of example, the computer 560 can again perform this calculation. In step 4550, the calculated 3D arrangement of laser pulses is applied on the optical component. For example the laser system 500 of FIG. 5 can execute this method step.

The further steps of the flow chart of FIG. 45 are optional. In step 4560, the 3D contour generated by the application of the 3D arrangement of laser pulses is measured. Then in step 4570, a remaining deviation of the generated 3D contour from the predetermined 3D contour is determined. At decision block 4580 it is decided if the remaining deviation between the generated and the predetermined 3D contour is smaller than or equal to a predefined threshold. If this is the case, the method ends at block 4590. If the remaining deviation is still larger than the predefined threshold, the method proceeds to block 4540 and a new 3D arrangement of laser pulses is calculated which brings the generated 3D contour in closer accordance with the predetermined 3D contour.

Figure 46A:
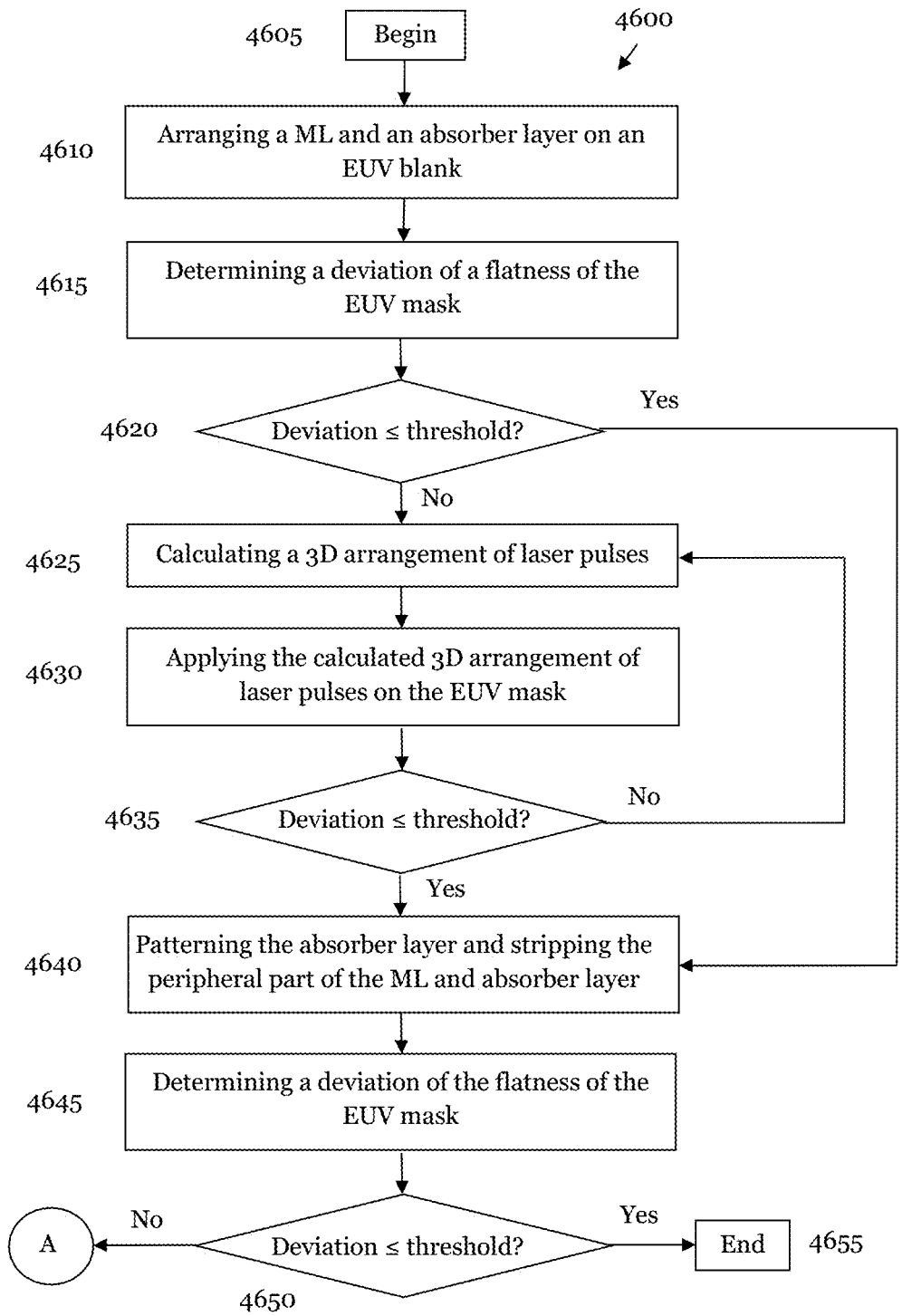
FIGS. 46A and 46B represent a flow chart of using the inventive method during the manufacturing process of an EUV mask in order to generate a predetermined 3D contour of the EUV mask.
Figure 46B:
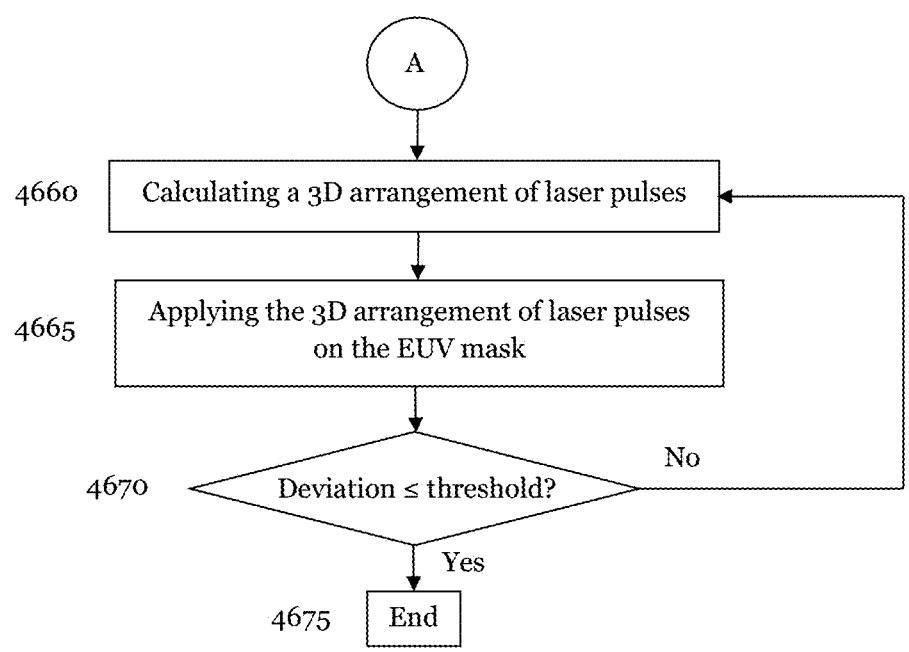

Finally, the flow chart 4600 of FIGS. 46A and 46B present, as an example, the application of the defined method during the manufacturing process of EUV masks. In a similar manner, the defined method can be applied to other optical components as well as to wafers during the manufacturing process of ICs on the wafers. An EUV mask blank and an EUV mask have to be ideally flat. If the rear surface of the EUV mask blank is not flat within a range of 1 μm it is differently gripped by a mechanical chuck during the manufacturing process of the EUV mask and/or by an electrostatic chuck of a scanner during the application of the EUV mask in an illumination process. The different surface profiles due to the different gripping of the EUV mask results in topographic errors which cannot be fully compensated if their shape is different for the two mounting principles. Furthermore, if an EUV mask is not perfectly flat, it is bended each time if it is mounted to a chuck which additionally might result in particle generation. It is therefore mandatory that an EUV mask blank is perfectly flat at the beginning of an EUV mask manufacturing process and is kept flat during the various steps of the manufacturing process. The flow chart 4600 of FIGS. 46A and 46B assume that a mask blank entering the manufacturing process is ideally flat.

The manufacturing process begins at block 4605 of FIG. 46A. In a first step 4610, the multilayer structure 255 of FIG. 2 is arranged on a mask blank or on a substrate 210. Then an absorber layer 290 is arranged on the multilayer structure 255. In step 4615, a deviation of the flatness of the rear substrate surface 225 caused by the manufacturing process steps of block 4610 is determined. At decision block 4620 it is decided if the deviation of the flatness of the rear substrate surface 225 is smaller than or equal to predefined threshold. If this is the case, the method proceeds to step 4640. If this condition is not fulfilled, the method proceeds to block 4625, where a 3D arrangement of laser pulses is calculated which flattens the rear substrate surface 225. In step 4630, the calculated 3D arrangement of laser pulses is applied to the substrate 210 of the EUV mask. At decision block 4635 it is checked whether the rear substrate surface 225 now meets the flatness requirement. If this is still not the case, steps 4625 and 4630 are repeated. Method steps 4625 and 4630 are repeated until the determined deviation of the EUV mask flatness is below a predetermined threshold. Then the method proceeds to block 4640.

In block 4640, the absorber layer is patterned and the peripheral part of the multilayer structure 255 is removed. Next, in step 4645, the deviation of the flatness caused by the processes of block 4640 is determined. It is of course also possible to determine the flatness variation individually caused by each of the processes of block 4640. At decision block 4645 it is decided if the flatness variation of a deviation of the flatness is smaller than or equal to the predefined threshold. If this condition is fulfilled, the method ends at block 4655. If this is not the case, at step 4660 of FIG. 46B, a second 3D arrangement of laser pulses is calculated to eliminate or to at least reduce the flatness variation caused by manufacturing steps of block 4640. Then, in step 4665, the calculated 3D arrangement of laser pulses are applied on the substrate 210 of the EUV mask 200. Moreover, at decision block 4670 it is checked if the deviation of the flatness of the rear substrate surface 225 is below the predetermined threshold. If this is true, the method ends at block 4675. If the condition is not fulfilled, the method proceeds to block 4660 and repeats steps 4660 and 4665. Steps 4660 and 4665 are repeated until the determined flatness of the rear substrate surface of an EUV mask is below a predetermined threshold.

Theoretical Background

In the following, some of the theoretical background is outlined underlying the discussion of different aspects of the inventive method presented in the preceding sections.

In order to generate a predetermined three-dimensional (3D) contour of an optical element or of a wafer different kinds of pixels arranged in different arrangements of pixels are used. The application of different kinds of pixels and different arrangements allows adjusting a measured or a determined 3D contour to a predetermined contour of the optical component and/or the wafer. The term 3D means a variation of lateral dimensions of the optical component or the wafer, i.e. in a plane perpendicular to incident laser pulses, which is defined by an x- and y-direction, as well as in the direction of a laser beam, which is the z-direction. For example, it is possible to introduce pixels of different kinds in the optical component and/or the wafer in order to predominantly cause a lateral variation or to predominantly vary the height of the optical element and/or the wafer. Both the lateral and the variation in z-direction can be performed as local and/or global variations. The terms optical component and optical element are used as synonyms in this application.

In general, as already outlined in the preceding section, pixels introduce stress into an optical element or a wafer by locally changing the density of the optical element material or wafer material. Expanding pixels and contracting pixels can be introduced into the optical element or can be written into the optical element by varying several parameters of the laser beam of the ultra-short laser source, such as the pulse duration and/or the pulse energy, and/or the beam shape, and/or repetition rate. By writing expanding pixels, the density of the optical element material or the wafer material is locally reduced, whereas by writing contracting pixels the density of the optical element material or the wafer material is locally increased.

The writing of pixels into an optical element or a wafer is characterized by two sets of parameters. (a) A first set defines the 3D dimensions of an individual pixel. (b) A second set defines an assembly of individual pixels in a 3D arrangement.

(a) Laser beam parameters or writing mode or writing mode signature: The writing of individual pixels into the optical element or the wafer with different physical conditions results in different kinds of pixels having different properties and/or different shapes. Parameters which characterize the 3D dimensions and the effects of an individual pixel are: (I) The pulse power of the light beam of the laser source which changes the size of a pixel. Reducing the laser pulse energy results in smaller pixels. Actually, for the pixel generation, the minimum pulse energy is limited by the breakdown threshold of the material of the optical element or the wafer. For pixelless writing there is no well-defined threshold. It is beneficial to use pulse energies just below the breakdown threshold in order to obtain a high efficient pixelless writing process. (II) The pulse duration of the laser beam pulses also influences the size of an individual pixel. (III) The number of laser pulses applied to a single location of the optical element also affects the pixel dimensions and thus the effects of an individual pixel. (IV) The polarization of the beam of ultra-short light pulses has an influence on the lateral effects of an individual pixel. (V) The NA (numerical aperture) of the light beam and/or the beam divergence affects the breakdown threshold of the material of the optical element or the wafer. Thus, the NA has to be controlled in combination with the pulse energy. Further, the NA has an essential influence on the size of an individual pixel in the beam direction (z-direction). (VI) The wavelength of the laser light pulses also affects the effects of an individual pixel with respect to a specific material of the optical element of the wafer. (VII) In case that a pixel is generated by a single laser pulse, the lateral shape of the light pulse induces the lateral form of the generated pixel, and thus influences the deformation induced by the pixel in the optical element or the wafer.

(b) 3D arrangement of pixels: Besides the individual pixels (determined by the laser beam parameters) the assembly of the pixels in the optical element or the wafer defines the change of the 3D contour generated by a 3D arrangement of pixels. Generally, a 3D arrangement of pixels is characterized by six parameters. Three parameters determine the dimensions of the pixel arrangement in the x-, y-, and z-direction. Further, three parameters specify the linear assembly and thus the linear pixel density in the x-, y-, and z-direction. The writing of a different linear pixel density in different directions parallel to the surface of the optical element or the wafer leads in particular in case of overlapping or partly overlapping pixels to a nonsymmetrical expansion of the optical element or the wafer.

For many applications, the size of a pixel is smaller than half of the distance to a neighboring pixel. On the other hand, pixels can also be written with a laser beam wherein a distance between neighboring pixels is much less than the individual pixel size. Thus, a quasi-continuous structure is written into the optical element. For this kind of pixels, preferably a very low laser pulse power is used. The advantage of using such a kind of pixels is that they do not cause light scattering, but only changes the optical transmission of the optical element. This structure having no visible pixels in the visible spectral range resembles more a layer in the bulk of the material of the optical element with different physical properties. If this layer is homogeneous enough, it less affects UV or DUV beam properties, no scattering occurs, and the layer does not introduce any artificial periodicity, and hence does not generate any diffraction effects. Directing the laser beam onto the optical element having such laser beam parameters is called pixel-less writing.

The two parameters sets of a writing mode and a writing mode density or simply writing density are not independent from each other. For example, the effect of smaller pixels can be compensated by increasing the pixel density. Further, it is possible that a pixel arrangement comprises pixels written with a single set of laser beam parameters or with a single writing mode. Moreover, a writing mode can also contain two or more pixels generated with two or more laser beam parameters. Finally, in order to bring a determined 3D contour of an optical element as close as possible to its predetermined 3D contour, two or more pixel arrangements can be introduced in the optical element. The various pixel arrangements can have different positions within the optical element, can partially overlap or can completely overlap.

In order to reliably generate a predetermined 3D contour of an optical element, the effects of ultra-short light pulses having different parameters onto the optical element has to be known. For this purpose, ultra-short light pulses having different parameters and/or writing modes have to be determined for the whole optical element. In order to perform further calculations, the volume of the optical element is partitioned into elementary volumes elements or elementary cells. Although the elementary volumes may be selected arbitrarily, it is preferred to use elementary volumes which have straight lines as edges and planes as faces or lateral surfaces. The corner points of the elementary volumes form 3D grid points across the volume of the optical element. Preferred elementary volumes are parallelepipeds, cuboids or tetrahedrons. Within one elementary volume pixels are written having a single writing mode and writing mode density.

The solution of the direct problem would compute the deformation of the elementary volumes from the action of the laser beam, i.e. it would compute the volume deformations of the elementary volumes as a function of the writing mode or the laser beam parameters and the writing mode density or the writing density. In order to determine the arrangement(s) of laser pulses to be applied, the inverse problem has to be solved. This means, it is the problem to compute a 3D map of writing modes or laser beam parameter and writing mode densities or writing densities that transform a determined 3D contour of an optical element to its predetermined 3D contour.

Optical elements are normally made of very rigid materials. For example, lenses of optical systems and photomasks for photolithographic illumination systems are preferably made of quartz. The deformations necessary for the correction of deviations from a predetermined 3D contour are very small in amplitude and typically do not exceed the elastic limit of the material of the optical element.

Three different groups of equations are important for the following approach: static equations, geometrical equations and physical equations. In static equations, state equilibrium of surface forces, bulk forces and stresses act at any elementary volume of the optical element, as for example, in static Newton's law. It is possible to derive the strain tensor from the displacement field by utilizing Cauchy formulas, which are geometrical equations. Since not every strain field can result from a displacement field, it is necessary to consider compatibility conditions. In thermal equilibrium and in an adiabatic approximation, the generalized Hooke's law (physical equation) states that for an elastic body there is a linear connection between the strain and the stress tensors.

As already mentioned above, without loss of generality, the complete optical element can be described as a system of cuboids, where every cuboid has a constant writing mode and writing mode density. Cuboids can be characterized by a new or modified equilibrium shape having new or modified physical parameters of the optical element such as Young's modulus, Poisson's ratio, etc. The changes induced in a cuboid are in good approximation proportional to the writing load, i.e. to the physical parameters of the optical element.

To compute the resulting displacement field as a function of the laser beam parameters and/or of the writing mode (i.e. the direct problem), one of the following two approaches could be used:
1. computation of the strain field that equalizes all the internal forces/stresses acting at the boundaries of the elementary volumes, or
2. computation of the strain field by finding a minimum of the potential energy for the overall optical element.

Both approaches give a linear dependence of the displacements on the writing mode densities at a given distribution of writing modes. Both approaches allow the computation of the modifications of the elementary volumes induced by the laser beam based on the knowledge of the writing modes and the writing mode densities.

The inverse problem can be formulated in a general case. 3D maps for writing modes have to be found that result in the target variation of the elementary volumes which brings the determined 3D contour of the optical element or the wafer in agreement with its predetermined 3D contour. In general, as defined above, a writing mode is a specific pixel generated by one or several overlapping or partly overlapping laser pulses, wherein the pixels are generated with a discrete parameter set of the laser beam and the problem has to be formulated as an optimization problem. A target functional has to be constructed that has a minimum (or a supremum) at the desired displacement field, which transforms the determined 3D contour of the optical element or the wafer to its predetermined 3D contour. Optimized writing modes or optimized laser beam parameters and writing mode densities produce the displacement field that minimizes the target functional and thus generates the predetermined 3D contour of the optical element or the wafer.

Possible ways to solve the inverse problem, i.e. to compute a 3D map of writing modes that gives the desired predefined 3D contour of an optical element or of a wafer are:
1. An optimization of writing modes can be performed using a MLS approach (Moving Least Squares); but a complete enumeration of the discrete writing mode map can be very difficult in case of small elementary cuboids.
2. The discrete parameters of a 3D mode map can be converted to a continuous analog with the assumption that one elementary cuboid can have a superposition of the different writing modes with different writing mode densities. In the case that all physical and shape property changes of the elementary cuboids are proportional to the contribution of the corresponding writing modes, the target functional is a square of the residual deviation of the determined 3D contour from its predetermined 3D contour. Then, the variational formalism will result in a linear problem.

In the following the second approach is used. The following approach is exemplified with elementary cuboids. However, it is not restricted to cuboids, for example tetrahedrons or parallelepipeds can also be used.

The generalized Hooke's law for an optical element or a wafer having a linear elasticity can be presented in a 3D form as:

$$\sigma_{ij}(x, y, z) = \sum_{k=1, l=1}^{3,3} H_{ijkl}(x, y, z)\varepsilon_{kl}(x, y, z) \quad (1)$$

where the 3D infinitesimal strain tensor $\varepsilon(x, y, z)$ has components $\varepsilon_{ij}(x, y, z)$ and the stress tensor $\sigma(x, y, z)$ having components $\sigma_{ij}(x, y, z)$. The elasticity tensor $H(x, y, z)$ is a $4^{th}$-order tensor field.

In order to simplify the following equations, engineering notations will be used for the components of the strain tensor $\varepsilon(x, y, z)$ by defining:

$$\varepsilon_0=\varepsilon_{xx}, \varepsilon_1=\varepsilon_{yy}, \varepsilon_2=\varepsilon_{zz}, \varepsilon_3=2\cdot\varepsilon_{xy}, \varepsilon_4=2\cdot\varepsilon_{xz}, \varepsilon_5=2\cdot\varepsilon_{yz}$$

The same is done for the stress tensor $\sigma(x, y, z)$:

$$\sigma_0=\sigma_{xx}, \sigma_1=\sigma_{yy}, \sigma_2=\sigma_{zz}, \sigma_3=2\cdot\sigma_{xy}, \sigma_4=2\cdot\sigma_{xz}, \sigma_5=2\cdot\sigma_{yz}$$

From a transformation point of view, $\varepsilon_i$ and $\sigma_i$ are no vectors. Using the defined notations Hooke's law for equation 1 can be rewritten in the form:

$$\sigma_i(x, y, z) = \sum_{k=0}^{5} H_{ik}(x, y, z)\varepsilon_k(x, y, z) \text{ or} \quad (2)$$

$$\sigma = H\varepsilon$$

The fourth order elasticity tensor $H(x, y, z)$ is thus reduced to a second order tensor $H_{ij}$.

For an isotropic material such as for example quartz lenses or substrates of photomasks, the elasticity tensor has only the two independent components $E(x, y, z)$ and $\mu(x, y, z)$, and is of the form:

$$H = \frac{E}{(1+\mu)(1-2\mu)} \begin{bmatrix} 1-\mu & \mu & \mu & 0 & 0 & 0 \\ \mu & 1-\mu & \mu & 0 & 0 & 0 \\ \mu & \mu & 1-\mu & 0 & 0 & 0 \\ 0 & 0 & 0 & \frac{1}{2}-\mu & 0 & 0 \\ 0 & 0 & 0 & 0 & \frac{1}{2}-\mu & 0 \\ 0 & 0 & 0 & 0 & 0 & \frac{1}{2}-\mu \end{bmatrix} \quad (3)$$

wherein $E(x, y, z)$ denotes Young's modulus and $\mu(x, y, z)$ is Poisson's ratio.

The displacement vector field in an optical element or a wafer induced by the writing of pixels into the optical element or the wafer is a vector field and can be represented as:

$$\vec{u}(\vec{x}) = \vec{u}(x, y, z) = \begin{bmatrix} \Delta x(x, y, z) \\ \Delta y(x, y, z) \\ \Delta z(x, y, z) \end{bmatrix} \quad (4)$$

In equation 4, $\Delta x(x, y, z)$ denotes a change of the x-coordinate of a point within the optical element or the wafer with respect to its position prior to the application of laser pulse(s).

The infinitesimal strain tensor field $\varepsilon_{ij}$ can be derived from the displacement vector field $\vec{u}(x, y, z)$ by using Cauchy formulas. The infinitesimal strain can then be written:

$$\vec{\varepsilon}(x,y,z) = A\vec{u}(x,y,z) \quad (5)$$

where the matrix operator A is constructed from partial derivative elements:

$$A = \begin{bmatrix} \partial/\partial x & 0 & 0 \\ 0 & \partial/\partial y & 0 \\ 0 & 0 & \partial/\partial z \\ \partial/\partial y & \partial/\partial x & 0 \\ \partial/\partial z & 0 & \partial/\partial x \\ 0 & \partial/\partial z & \partial/\partial y \end{bmatrix} \quad (6)$$

The infinitesimal strain is a second order tensor and only looks like a vector due to the used engineering notation.

As already indicated above, the Lagrange variational principle is used for the determination of the writing modes and the writing mode densities from the potential energy of the optical element or the wafer. The overall potential energy P of a deformation resulting from the introduction of pixels into the optical element or the wafer can be presented in the form of the volume integral of the potential energy density $P(x, y, z)$:

$$P = \int_V P(x,y,z) dV \quad (7)$$

The potential energy density resulting from the stress tensor field $\sigma_i(x, y, z)$ caused by a strain tensor field $\varepsilon_i(x, y, z)$ is proportional to the integral of the scalar product of the vector components both quantities. The potential energy density $P(x, y, z)$ caused by the stress vector field $\sigma_i(x, y, z)$ resulting from the strain vectors field $\varepsilon_i(x, y, z)$ is thus given by:

$$P(x,y,z) = 1/2(\sigma_0\varepsilon_0 + \sigma_1\varepsilon_1 + \sigma_2\varepsilon_2 + \sigma_3\varepsilon_3 + \sigma_4\varepsilon_4 + \sigma_5\varepsilon_5) = 1/2(\vec{\sigma}, \vec{\varepsilon}) \quad (8)$$

By substituting the strain tensor field $\sigma_i(x, y, z)$ using Hooke's law in the form of equation 2 and replacing the strain vector field $\varepsilon_i(x, y, z)$ by the displacement field of equation 5, the potential energy distribution or potential energy density has the form:

$$P(x,y,z) = 1/2(H\vec{\varepsilon}, \vec{\varepsilon}) = 1/2(H(x,y,z)A\vec{u}(x,y,z), A\vec{u}(x,y,z)) \quad (9)$$

An ideal (but not the only) way to define the displacement vector field $\vec{u}(x, y, z)$ satisfying the criteria of minimum of potential energy is a finite element like approach. Without loss of generality the overall optical element can be represented as a set of $K_x \cdot L_y \cdot M_z$ elementary volumes. As it facilitates the following calculations, it is preferred that the elementary volumes are parallelepipeds, cuboids or cubes or elementary tetrahedra. $K_x$ is the number of elementary volumes (as for example cuboids) in the x-direction, and $L_y$ and $M_z$ are the numbers of elementary volumes (or for example cuboids) in y- and in z-direction, respectively.

For the following exemplified calculation of the potential energy P, the optical element is split in $K_x \cdot L_y \cdot M_z$ elementary cuboids of identical size. The total potential energy P is the sum of the potential energies $P^\alpha$ of the individual cuboids $\alpha$.

$$P = \sum_{\alpha=1}^{K_x \cdot L_y \cdot M_z} P^\alpha \quad (10)$$

The potential energy $P^\alpha$ of an elementary volume or an elementary cuboid $\alpha$ is obtained by integrating the potential energy density across the volume $V^\alpha$ of the elementary cuboid $\alpha$:

$$P^\alpha = \int_{V^\alpha} P^\alpha(x,y,z) dV \quad (11)$$

The potential energy density $P^\alpha(x, y, z)$ is obtained from equation 9:

$$P^\alpha(x,y,z) = 1/2(H^\alpha A\vec{u}^\alpha(x,y,z), A\vec{u}^\alpha(x,y,z)) \quad (12)$$

The index $\alpha$ counts all the elementary cuboids $\alpha$ into which the optical element is separated. It is assumed that each cuboid or each elementary volume $\alpha$ is so small that the second order tensor field $H(x, y, z)$ of the elasticity tensor can be substituted by a constant tensor $H^\alpha$ within an individual elementary volume or cuboid $\alpha$.

Figure 47:
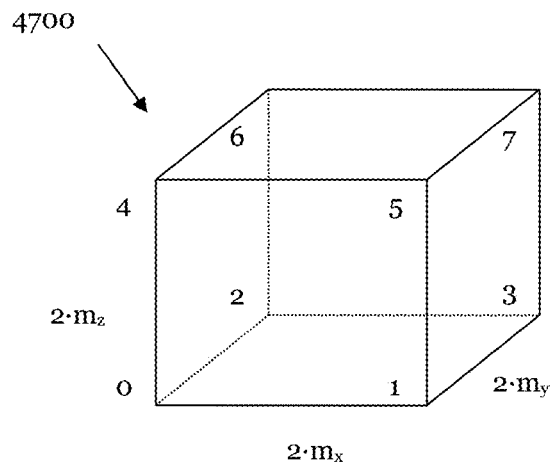
FIG. 47 schematically illustrates an elementary volume or an elementary cell of an optical component.

The diagram 4700 of FIG. 47 illustrates an elementary cuboid $\alpha$. The cuboid has 8 corner points numbered from 0 to 7. The side lengths of the cuboid in FIG. 47 are defined as $2 \cdot m_x$, $2 \cdot m_y$ and $2 \cdot m_z$, respectively.

By again utilizing the assumption that the elementary cuboids α are small compared to the dimensions of the optical element or the wafer, the vector field $\vec{u}(x, y, z)$ can be substituted by its linear approximation. For every elementary volume α the vector field $\vec{u}(x, y, z)$ is represented by a linear interpolation of the displacements of the corner points of the elementary volume.

$$\vec{u}(x, y, z) = \sum_{i=0}^{7} N_i^\alpha(x, y, z) \cdot \vec{u}_i^\alpha = \sum_{i=0}^{7} N_i^\alpha(x, y, z) \cdot \vec{u}_i^\alpha(x, y, z) \quad (13)$$

For this purpose, linear form functions of the corner points $N_i^\alpha$ with $i=0, \ldots, 7$ are introduced, wherein the index α denotes the elementary volume into which the optical element is separated. In the following, the index g denotes non-perturbed cube corner coordinates $N_i^\alpha$ or 3D grid nodes, i.e. locations prior to the application of light pulses or laser pulses into the optical element:

$$\begin{array}{llll} N_6^\alpha & N_7^\alpha & x_6^{g\alpha}, y_6^{g\alpha}, z_6^{g\alpha} & x_7^{g\alpha}, y_7^{g\alpha}, z_7^{g\alpha} \\ N_4^\alpha & N_5^\alpha & x_4^{g\alpha}, y_4^{g\alpha}, z_4^{g\alpha} & x_5^{g\alpha}, y_5^{g\alpha}, z_5^{g\alpha} \\ N_2^\alpha & N_3^\alpha & x_2^{g\alpha}, y_2^{g\alpha}, z_2^{g\alpha} & x_3^{g\alpha}, y_3^{g\alpha}, z_3^{g\alpha} \\ N_0^\alpha & N_1^\alpha & x_0^{g\alpha}, y_0^{g\alpha}, z_0^{g\alpha} & x_1^{g\alpha}, y_1^{g\alpha}, z_1^{g\alpha} \end{array} \quad (14)$$

with $$u_i^\alpha = u(x_i^{g\alpha}, y_i^{g\alpha}, z_i^{g\alpha}) \text{ and } i = (0, \ldots, 7) \quad (15)$$

The displacements of the coordinates of the corner points caused by writing of pixels into the optical element are defined by:

$$N_0^\alpha(x, y, z) = \frac{(x_1^{g\alpha} - x)}{(x_1^{g\alpha} - x_0^{g\alpha})} \frac{(y_1^{g\alpha} - y)}{(y_1^{g\alpha} - y_0^{g\alpha})} \frac{(z_1^{g\alpha} - z)}{(z_1^{g\alpha} - z_0^{g\alpha})} \quad (16)$$

$$N_1^\alpha(x, y, z) = \frac{(x - x_0^{g\alpha})}{(x_1^{g\alpha} - x_0^{g\alpha})} \frac{(y_1^{g\alpha} - y)}{(y_1^{g\alpha} - y_0^{g\alpha})} \frac{(z_1^{g\alpha} - z)}{(z_1^{g\alpha} - z_0^{g\alpha})}$$

$$N_2^\alpha(x, y, z) = \frac{(x_1^{g\alpha} - x)}{(x_1^{g\alpha} - x_0^{g\alpha})} \frac{(y - y_0^{g\alpha})}{(y_1^{g\alpha} - y_0^{g\alpha})} \frac{(z_1^{g\alpha} - z)}{(z_1^{g\alpha} - z_0^{g\alpha})}$$

$$N_3^\alpha(x, y, z) = \frac{(x - x_0^{g\alpha})}{(x_1^{g\alpha} - x_0^{g\alpha})} \frac{(y - y_0^{g\alpha})}{(y_1^{g\alpha} - y_0^{g\alpha})} \frac{(z_1^{g\alpha} - z)}{(z_1^{g\alpha} - z_0^{g\alpha})}$$

$$N_4^\alpha(x, y, z) = \frac{(x_1^{g\alpha} - x)}{(x_1^{g\alpha} - x_0^{g\alpha})} \frac{(y_1^{g\alpha} - y)}{(y_1^{g\alpha} - y_0^{g\alpha})} \frac{(z - z_0^{g\alpha})}{(z_1^{g\alpha} - z_0^{g\alpha})}$$

$$N_5^\alpha(x, y, z) = \frac{(x - x_0^{g\alpha})}{(x_1^{g\alpha} - x_0^{g\alpha})} \frac{(y_1^{g\alpha} - y)}{(y_1^{g\alpha} - y_0^{g\alpha})} \frac{(z - z_0^{g\alpha})}{(z_1^{g\alpha} - z_0^{g\alpha})}$$

$$N_6^\alpha(x, y, z) = \frac{(x_1^{g\alpha} - x)}{(x_1^{g\alpha} - x_0^{g\alpha})} \frac{(y - y_0^{g\alpha})}{(y_1^{g\alpha} - y_0^{g\alpha})} \frac{(z - z_0^{g\alpha})}{(z_1^{g\alpha} - z_0^{g\alpha})}$$

$$N_7^\alpha(x, y, z) = \frac{(x - x_0^{g\alpha})}{(x_1^{g\alpha} - x_0^{g\alpha})} \frac{(y - y_0^{g\alpha})}{(y_1^{g\alpha} - y_0^{g\alpha})} \frac{(z - z_0^{g\alpha})}{(z_1^{g\alpha} - z_0^{g\alpha})}$$

This approach leads to a good continuous approximation of the real displacement vector field $\vec{u}(x, y, z)$.

The potential energy $P^\alpha$ of the elementary volume α will be represented as a function of the corner displacements of the cuboid α. By substituting the displacement vector field $\vec{u}^\alpha(x, y, z)$ in the cuboid α in equation 12 by the approximation of equation 14, equation 12 within the cuboid α can be rewritten in:

$$P^\alpha(x, y, z) = \frac{1}{2}\left(H^\alpha \sum_{i=0}^{7} A N_i^\alpha(x, y, z) u_i^\alpha, \sum_{k=0}^{7} A N_k^\alpha(x, y, z) u_k^\alpha\right) \quad (17)$$

First derivatives of the form functions $N_i^\alpha$ with respect to Cartesian coordinates x, y, z are given by:

$$\frac{\partial N_0^\alpha}{\partial x} = -\frac{\partial N_1^\alpha}{\partial x} = -N^\alpha(y_1^{g\alpha} - y)(z_1^{g\alpha} - z) \quad (18)$$

$$\frac{\partial N_2^\alpha}{\partial x} = -\frac{\partial N_3^\alpha}{\partial x} = -N^\alpha(y - y_0^{g\alpha})(z_1^{g\alpha} - z)$$

$$\frac{\partial N_4^\alpha}{\partial x} = -\frac{\partial N_5^\alpha}{\partial x} = -N^\alpha(y_1^{g\alpha} - y)(z - z_0^{g\alpha})$$

$$\frac{\partial N_6^\alpha}{\partial x} = -\frac{\partial N_7^\alpha}{\partial x} = -N^\alpha(y - y_0^{g\alpha})(z - z_0^{g\alpha})$$

$$\frac{\partial N_0^\alpha}{\partial y} = -\frac{\partial N_2^\alpha}{\partial y} = -N^\alpha(x_1^{g\alpha} - x)(z_1^{g\alpha} - z)$$

$$\frac{\partial N_1^\alpha}{\partial y} = -\frac{\partial N_3^\alpha}{\partial y} = -N^\alpha(x - x_0^{g\alpha})(z_1^{g\alpha} - z)$$

$$\frac{\partial N_4^\alpha}{\partial y} = -\frac{\partial N_6^\alpha}{\partial y} = -N^\alpha(x_1^{g\alpha} - x)(z - z_0^{g\alpha})$$

$$\frac{\partial N_5^\alpha}{\partial x} = -\frac{\partial N_7^\alpha}{\partial x} = -N^\alpha(x - x_0^{g\alpha})(z - z_0^{g\alpha})$$

$$\frac{\partial N_0^\alpha}{\partial z} = -\frac{\partial N_4^\alpha}{\partial z} = -N^\alpha(x_1^{g\alpha} - x)(y_1^{g\alpha} - y)$$

$$\frac{\partial N_1^\alpha}{\partial z} = -\frac{\partial N_5^\alpha}{\partial z} = -N^\alpha(x - x_0^{g\alpha})(y_1^{g\alpha} - y)$$

$$\frac{\partial N_2^\alpha}{\partial z} = -\frac{\partial N_6^\alpha}{\partial z} = -N^\alpha(x_1^{g\alpha} - x)(y - y_0^{g\alpha})$$

$$\frac{\partial N_3^\alpha}{\partial z} = -\frac{\partial N_7^\alpha}{\partial z} = -N^\alpha(x - x_0^{g\alpha})(y - y_0^{g\alpha})$$

with $N^\alpha = 1/(8 \cdot m_x^\alpha \cdot m_y^\alpha \cdot m_z^\alpha)$, and wherein $m_l^\alpha$ is half of one of the side lengths x, y, or z (i.e. $l=(x, y, z)$) of the elementary volume α.

Now Cartesian coordinates are introduced for every elementary volume α, wherein the origin of the coordinate system is in the center of the elementary volume α, i.e.:

$$x^\alpha = x - (x_0^{g\alpha} + x_1^{g\alpha})/2$$

$$y^\alpha = y - (y_0^{g\alpha} + y_1^{g\alpha})/2$$

$$z^\alpha = z - (z_0^{g\alpha} + z_1^{g\alpha})/2 \quad (19)$$

Then the partial derivatives of equation 18 are transformed to:

$$\frac{\partial N_0^\alpha}{\partial x} = -\frac{\partial N_1^\alpha}{\partial x} = -N^\alpha(m_y^\alpha - y^\alpha)(m_z^\alpha - z^\alpha) \quad (20)$$

$$\frac{\partial N_2^\alpha}{\partial x} = -\frac{\partial N_3^\alpha}{\partial x} = -N^\alpha(m_y^\alpha + y^\alpha)(m_z^\alpha - z^\alpha)$$

$$\frac{\partial N_4^\alpha}{\partial x} = -\frac{\partial N_5^\alpha}{\partial x} = -N^\alpha(m_y^\alpha - y^\alpha)(m_z^\alpha + z^\alpha)$$

$$\frac{\partial N_6^\alpha}{\partial x} = -\frac{\partial N_7^\alpha}{\partial x} = -N^\alpha(m_y^\alpha + y^\alpha)(m_z^\alpha + z^\alpha)$$

-continued $$\frac{\partial N_o^\alpha}{\partial y} = -\frac{\partial N_2^\alpha}{\partial y} = -N^\alpha(m_x^\alpha - x^\alpha)(m_z^\alpha - z^\alpha)$$

$$\frac{\partial N_1^\alpha}{\partial x} = -\frac{\partial N_3^\alpha}{\partial x} = -N^\alpha(m_x^\alpha + x^\alpha)(m_z^\alpha - z^\alpha)$$

$$\frac{\partial N_4^\alpha}{\partial y} = -\frac{\partial N_6^\alpha}{\partial y} = -N^\alpha(m_x^\alpha - x^\alpha)(m_z^\alpha + z^\alpha)$$

$$\frac{\partial N_5^\alpha}{\partial y} = -\frac{\partial N_7^\alpha}{\partial y} = -N^\alpha(m_x^\alpha + x^\alpha)(m_z^\alpha + z^\alpha)$$

$$\frac{\partial N_o^\alpha}{\partial z} = -\frac{\partial N_4^\alpha}{\partial z} = -N^\alpha(m_x^\alpha - x^\alpha)(m_y^\alpha - y^\alpha)$$

$$\frac{\partial N_1^\alpha}{\partial z} = -\frac{\partial N_5^\alpha}{\partial z} = -N^\alpha(m_x^\alpha + x^\alpha)(m_y^\alpha - y^\alpha)$$

$$\frac{\partial N_2^\alpha}{\partial z} = -\frac{\partial N_6^\alpha}{\partial z} = -N^\alpha(m_x^\alpha - x^\alpha)(m_y^\alpha + y^\alpha)$$

$$\frac{\partial N_3^\alpha}{\partial z} = -\frac{\partial N_7^\alpha}{\partial z} = -N^\alpha(m_x^\alpha + x^\alpha)(m_y^\alpha + y^\alpha)$$

The application of the matrix operator A to the displacement vector field $\vec{u}(x, y, z)$ results in:

$$A\vec{u}^\alpha(x, y, z) = \sum_{k=0}^{7} \begin{bmatrix} \frac{\partial N_k^\alpha}{\partial x} u_{kx}^\alpha \\ \frac{\partial N_k^\alpha}{\partial y} u_{ky}^\alpha \\ \frac{\partial N_k^\alpha}{\partial z} u_{kz}^\alpha \\ \frac{\partial N_k^\alpha}{\partial y} u_{kx}^\alpha + \frac{\partial N_k^\alpha}{\partial x} u_{ky}^\alpha \\ \frac{\partial N_k^\alpha}{\partial z} u_{kx}^\alpha + \frac{\partial N_k^\alpha}{\partial x} u_{kz}^\alpha \\ \frac{\partial N_k^\alpha}{\partial z} u_{ky}^\alpha + \frac{\partial N_k^\alpha}{\partial y} u_{kz}^\alpha \end{bmatrix} \quad (21)$$

The multiplication of equation 21 with the elasticity tensor H of equation 3 results in equation 22:

$$HA\vec{u}^\alpha = \frac{E}{(1+\mu)(1-2\mu)} \sum_{k=0}^{7} \begin{bmatrix} (1-\mu)\frac{\partial N_k^\alpha}{\partial x} u_{kx}^\alpha + \mu\frac{\partial N_k^\alpha}{\partial y} u_{ky}^\alpha + \mu\frac{\partial N_k^\alpha}{\partial z} u_{kz}^\alpha \\ \mu\frac{\partial N_k^\alpha}{\partial x} u_{kx}^\alpha + (1-\mu)\frac{\partial N_k^\alpha}{\partial y} u_{ky}^\alpha + \mu\frac{\partial N_k^\alpha}{\partial z} u_{kz}^\alpha \\ \mu\frac{\partial N_k^\alpha}{\partial x} u_{kx}^\alpha + \mu\frac{\partial N_k^\alpha}{\partial y} u_{ky}^\alpha + (1-\mu)\frac{\partial N_k^\alpha}{\partial z} u_{kz}^\alpha \\ (1/2-\mu)\left(\frac{\partial N_k^\alpha}{\partial y} u_{kx}^\alpha + \frac{\partial N_k^\alpha}{\partial x} u_{ky}^\alpha\right) \\ (1/2-\mu)\left(\frac{\partial N_k^\alpha}{\partial z} u_{kx}^\alpha + \frac{\partial N_k^\alpha}{\partial x} u_{kz}^\alpha\right) \\ (1/2-\mu)\left(\frac{\partial N_k^\alpha}{\partial z} u_{ky}^\alpha + \frac{\partial N_k^\alpha}{\partial y} u_{kz}^\alpha\right) \end{bmatrix}$$

Now the following abbreviations are introduced:

$$\frac{\partial N_k^\alpha}{\partial s} = N_{ks}^\alpha \quad (23)$$

$$N_{ks}^\alpha = q_k^s N^\alpha \frac{(m_x^\alpha + q_k^x x^\alpha)(m_y^\alpha + q_k^y y^\alpha)(m_z^\alpha + q_k^z z^\alpha)}{(m_s^\alpha + q_k^s s^\alpha)}$$

$$q_k^x = q(k/1);$$

$$q_k^y = q(k/2);$$

$$q_k^z = q(k/4);$$

$$q(x) = (-1)^{\lfloor x \rfloor + 1};$$

Then equations 21 and 22, respectively, are:

$$A\vec{u}^\alpha(x, y, z) = \sum_{k=0}^{7} \begin{bmatrix} N_{kx}^\alpha u_{kx}^\alpha \\ N_{ky}^\alpha u_{ky}^\alpha \\ N_{kz}^\alpha u_{kz}^\alpha \\ N_{ky}^\alpha u_{kx}^\alpha + N_{kx}^\alpha u_{ky}^\alpha \\ N_{kz}^\alpha u_{kx}^\alpha + N_{kx}^\alpha u_{kz}^\alpha \\ N_{kz}^\alpha u_{ky}^\alpha + N_{ky}^\alpha u_{kz}^\alpha \end{bmatrix} \quad (24)$$

and $$HA\vec{u}^\alpha(\vec{x}) = \frac{E}{(1+\mu)(1-2\mu)} \sum_{k=0}^{7} \begin{bmatrix} (1-\mu)N_{kx}^\alpha u_{kx}^\alpha + \mu N_{ky}^\alpha u_{ky}^\alpha + \mu N_{kz}^\alpha u_{kz}^\alpha \\ \mu N_{kx}^\alpha u_{kx}^\alpha + (1-\mu)N_{ky}^\alpha u_{ky}^\alpha + \mu N_{kz}^\alpha u_{kz}^\alpha \\ \mu N_{kx}^\alpha u_{kx}^\alpha + \mu N_{ky}^\alpha u_{ky}^\alpha + (1-\mu)N_{kz}^\alpha u_{kz}^\alpha \\ (1/2-\mu)(N_{ky}^\alpha u_{kx}^\alpha + N_{kx}^\alpha u_{ky}^\alpha) \\ (1/2-\mu)(N_{kz}^\alpha u_{kx}^\alpha + N_{kx}^\alpha u_{kz}^\alpha) \\ (1/2-\mu)(N_{kz}^\alpha u_{ky}^\alpha + N_{ky}^\alpha u_{kz}^\alpha) \end{bmatrix} \quad (25)$$

With equations 24 and 25 the potential energy density $P^\alpha(x, y, z)$ of the elementary volume α of equation 16 is of the form:

$$P^\alpha(x, y, z) = \frac{1}{2}(H^\alpha A\vec{u}(x, y, z), A\vec{u}(x, y, z)) = \quad (26)$$

$$= \frac{E}{2(1+\mu)(1-2\mu)} \sum_{k,l=0}^{7,7} \{$$

$$((1-\mu)N_{kx}^\alpha u_{kx}^\alpha + \mu N_{ky}^\alpha u_{ky}^\alpha + \mu N_{kz}^\alpha u_{kz}^\alpha)N_{lx}^\alpha u_{lx}^\alpha +$$

$$(\mu N_{kx}^\alpha u_{kx}^\alpha + (1-\mu)N_{ky}^\alpha u_{ky}^\alpha + \mu N_{kz}^\alpha u_{kz}^\alpha)N_{ly}^\alpha u_{ly}^\alpha +$$

$$(\mu N_{kx}^\alpha u_{kx}^\alpha + \mu N_{ky}^\alpha u_{ky}^\alpha + (1-\mu)N_{kz}^\alpha u_{kz}^\alpha)N_{lz}^\alpha u_{lz}^\alpha +$$

$$(1/2-\mu)(N_{ky}^\alpha u_{kx}^\alpha + N_{kx}^\alpha u_{ky}^\alpha)(N_{ly}^\alpha u_{lx}^\alpha + N_{lx}^\alpha u_{ly}^\alpha) +$$

$$(1/2-\mu)(N_{kz}^\alpha u_{kx}^\alpha + N_{kx}^\alpha u_{kz}^\alpha)(N_{lz}^\alpha u_{lx}^\alpha + N_{lx}^\alpha u_{lz}^\alpha) +$$

$$(1/2-\mu)(N_{kz}^\alpha u_{ky}^\alpha + N_{ky}^\alpha u_{kz}^\alpha)(N_{lz}^\alpha u_{ly}^\alpha + N_{ly}^\alpha u_{lz}^\alpha)\}$$

The continuous potential energy density $P^\alpha(x, y, z)$ of the elementary volume α is now approximated by displacements of the corner points $p_{k,l}^\alpha$ of the elementary volume α in order to simplify equation 26:

$$P^\alpha(x, y, z) = \sum_{k,l=0}^{7,7} \sum_{s,t=0}^{2,2} u_{ks}^\alpha p_{ks,lt}^{g,\alpha} u_{lt}^\alpha \quad (27)$$

wherein the indices s=(0, 1, 2) and t=(0, 1, 2) are Cartesians coordinates x, y and z. The components of the potential energy matrix $P_{k,l}^\alpha$ have the following matrix form (equation 28):

$$p_{kl}^{g,\alpha} = \frac{E}{2(1+\mu)(1-2\mu)}.$$

-continued $$\begin{bmatrix} \mu_1 N_{kx}^{\alpha} N_{lx}^{\alpha} + \mu_2 N_{ky}^{\alpha} N_{ly}^{\alpha} + \mu_2 N_{kz}^{\alpha} N_{lz}^{\alpha} & \mu_2 N_{ky}^{\alpha} N_{lx}^{\alpha} + \mu_2 N_{kx}^{\alpha} N_{ly}^{\alpha} & \mu N_{kz}^{\alpha} N_{lx}^{\alpha} + \mu_2 N_{kx}^{\alpha} N_{lz}^{\alpha} \\ \mu N_{kx}^{\alpha} N_{ly}^{\alpha} + \mu_2 N_{ky}^{\alpha} N_{lx}^{\alpha} & \mu_2 N_{kx}^{\alpha} N_{lx}^{\alpha} + \mu_1 N_{ky}^{\alpha} N_{ly}^{\alpha} + \mu_2 N_{kz}^{\alpha} N_{lz}^{\alpha} & \mu N_{ky}^{\alpha} N_{lz}^{\alpha} + \mu_2 N_{kz}^{\alpha} N_{ly}^{\alpha} \\ \mu N_{kx}^{\alpha} N_{lz}^{\alpha} + \mu_2 N_{kz}^{\alpha} N_{lx}^{\alpha} & \mu N_{ky}^{\alpha} N_{lz}^{\alpha} + \mu_2 N_{kz}^{\alpha} N_{ly}^{\alpha} & \mu_2 N_{kx}^{\alpha} N_{lx}^{\alpha} + \mu_2 N_{ky}^{\alpha} N_{ly}^{\alpha} + \mu_1 N_{kz}^{\alpha} N_{lz}^{\alpha} \end{bmatrix}$$

with $\mu_1 = (1 - \mu)$ and $\mu_2 = (1/2 - \mu)$.

Every summand in the matrix of equation 28 contains a product of the form $N_{ks}^{\alpha} N_{lt}^{\alpha}$. Using equations 23, integrals of these terms along one edge of the cuboid $\alpha$ can be expressed as:

$$\int_{-m_s}^{m_s^{\alpha}} (m_s^{\alpha} + q_k^s s^{\alpha}) ds^{\alpha} = 2 m_s^{\alpha^2} \tag{29}$$

$$\int_{-m_s}^{m_s^{\alpha}} (m_s^{\alpha} + q_k^s s^{\alpha})(m_s^{\alpha} + q_l^s s^{\alpha}) ds^{\alpha} = 2 m_s^{\alpha^3} (1 + q_k^s q_l^s / 3) = 2 m_s^{\alpha^3} q_{kl}^s \tag{30}$$

with $$q_{kl} = q_{kl}^x q_{kl}^y q_{kl}^z \tag{31}$$

and $$q_{kl}^s = (1 + q_k^s q_l^s / 3) \tag{32}$$

Equations 29 to 32 result in an integration of the partial derivatives of the coordinates of the corner points over the volume of an elementary volume $\alpha$ for the case s=t (equation 33):

$$\int_{V^{\alpha}} N_{ks}^{\alpha} N_{ls}^{\alpha} dx^{\alpha} dy^{\alpha} dz^{\alpha} = 8N^{\alpha 2} q_k^s q_l^s \frac{(m_x^{\alpha} m_y^{\alpha} m_z^{\alpha})^3}{m_s^{\alpha 2}} \frac{q_{kl}}{q_{kl}^s} = \frac{m_x^{\alpha} m_y^{\alpha} m_z^{\alpha}}{8 m_s^{\alpha 2}} q_k^s q_l^s \frac{q_{kl}}{q_{kl}^s}$$

and for s≠t (equation 34):

$$\int_{V^{\alpha}} N_{ks}^{\alpha} N_{lt}^{\alpha} dx^{\alpha} dy^{\alpha} dz^{\alpha} =$$

$$8N^{\alpha 2} q_k^s q_l^t \frac{(m_x^{\alpha} m_y^{\alpha} m_z^{\alpha})^3}{m_s^{\alpha} m_t^{\alpha}} \frac{q_{kl}}{q_{kl}^s q_{kl}^t} = \frac{m_x^{\alpha} m_y^{\alpha} m_z^{\alpha}}{8 m_s^{\alpha} m_t^{\alpha}} q_k^s q_l^t \frac{q_{kl}}{q_{kl}^s q_{kl}^t}$$

It is now assumed that the volume occupied by pixels written in the elementary volume $\alpha$ can be neglected and that the pixels do not significantly affect the rigidity of the optical element or the wafer. Hence, Young's modulus $E(x, y, z)$ and Poisson's ratio $\mu(x, y, z)$ do not depend on the location within the elementary volume $\alpha$. The potential energy distribution after the introduction of pixels in the optical element or the wafer can be presented as a square form over the displacement values of the corner points of the elementary volume $\alpha$. The integration over the potential energy distribution over the elementary volume $\alpha$ using equations 29 to 34 results in equation 34:

$$P_{ks,lt}^{g,\alpha} = \frac{E m_x^{\alpha} m_y^{\alpha} m_z^{\alpha} q_{kl}}{16(1+\mu)(1-2\mu)} \cdot \left( \mu_2 \left( \frac{q_k^s q_l^s}{m_x^{\alpha} m_x^{\alpha} q_{kl}^x} + \frac{q_k^y q_l^y}{m_y^{\alpha} m_y^{\alpha} q_{kl}^y} + \frac{q_k^z q_l^z}{m_z^{\alpha} m_z^{\alpha} q_{kl}^z} \right) \delta_{st} + \right.$$

$$\left. \frac{q_k^s q_l^t}{m_s^{\alpha} m_t^{\alpha}} \left( (\mu_1 - \mu_2) \delta_{st} + \frac{(\mu + \mu_2)}{q_{kl}^s} (1 - \delta_{st}) \right) \right)$$

According to the assumption mentioned above, the elements of the potential matrix $m_{ks,lt}^{g,\alpha}$ do not depend on the amount and the type of writing pixels in the elementary volume $\alpha$.

It is now assumed that every elementary volume $\alpha$ alone has a new equilibrium state after pixel(s) have been written in the optical element or the wafer. This assumption is a key statement of the simplified approach presented in this application. Equations 16 and 27 are derived on the supposition that the deformation of the elementary volume $\alpha$ starts from an undisturbed state. The equilibrium coordinates of the corner points of the elementary volume $\alpha$ after the introduction of pixels in the optical element or wafer are called $w_{ki}^{\alpha}$. From symmetry reasons it is obvious that a change of the potential energy resulting from a deformation from an original or not deformed state of an elementary volume $\alpha$ to the new equilibrium state $w_{ki}^{\alpha}$ expressed by the volume deformation $u_{ki}^{\alpha}$ is opposite to a modification due to a deformation from the new equilibrium state $w_{ki}^{\alpha}$ back to the original or not deformed state.

Due to the fact that every elementary volume $\alpha$ has a new equilibrium shape after writing pixels into the optical element, it is necessary to count the volume deformation of the elementary volume $\alpha$ from the original or not deformed state in the expression for the potential energy. The definition of the deformation from the original or not deformed state to the new equilibrium position, or vice versa, equation 27 of the potential energy density is converted to:

$$P^{\alpha}(x, y, z) = \sum_{k,l=0}^{7,7} \sum_{s,t=0}^{2,2} (u_{ks}^{\alpha} - w_{ks}^{\alpha}) P_{ks,lt}^{g,\alpha} (u_{lt}^{\alpha} - w_{lt}^{\alpha}) \tag{35}$$

The potential energy of the overall optical element is the sum over all elementary volumes $\alpha$:

$$P = \sum_{\alpha=1}^{K_x \cdot L_y \cdot M_z} P^{\alpha}(x, y, z) = \tag{36}$$

$$= \sum_{\alpha=1}^{K_x \cdot L_y \cdot M_z} \sum_{k=0,l=0}^{7,7} \sum_{s=0,t=0}^{2,2} (u_{ks}^{\alpha} - w_{ks}^{\alpha}) P_{ks,lt}^{g,\alpha} (u_{lt}^{\alpha} - w_{lt}^{\alpha})$$

The Lagrange variational principle states that in an equilibrium position of a body its potential energy is minimum. Furthermore, any partial variation over every displacement is equal to zero. This results for equation 36 in a system of linear equations:

$$\delta P / \delta \xi_i = 0 \tag{37}$$

For all coordinates of the nodes $\xi_i$. According to equation 12 each internal node coordinate $\xi_i$ is presented eight times in the components for all the adjacent nodes. In the following, the nodes are enumerated from left to right (x-direction), then in rows from bottom to top (y-direction) and finally in planes from bottom to top (z-direction). Further, the counting of the coordinates of the corner points of the elementary volumes $\alpha$ is done in a way:

$$\xi_{3\alpha+0} = u_{0_x}^{\alpha}, \xi_{3\alpha+1} = u_{0_y}^{\alpha}, \xi_{3\alpha+2} = u_{0_z}^{\alpha} \tag{38}$$

and the following equation is presenting a node identity or a stitching condition. Equation 39:

$$u_{0x}^{\alpha} = -u_{1x}^{\alpha-1} = u_{2x}^{\alpha-K_x} = -u_{3x}^{\alpha-K_x-1} = u_{4x}^{\alpha-K_x \cdot M_y} = -u_{5x}^{\alpha-K_x L_y - 1} = u_{6x}^{\alpha-K_x L_y - L_x} = -u_{7x}^{\alpha-K_x L_y - K_x - 1}$$

$$u_{0y}^{\alpha} = -u_{1y}^{\alpha-1} = -u_{2y}^{\alpha-L_y} = -u_{3y}^{\alpha-L_y-1} = u_{4y}^{\alpha-L_y M_z} = u_{5y}^{\alpha-L_y M_z - 1} = -u_{6y}^{\alpha-L_y M_z - L_y} = -u_{7y}^{\alpha-L_y M_z - L_y - 1}$$

$$u_{0z}^{\alpha} = -u_{1z}^{\alpha-1} = u_{2z}^{\alpha-M_z} = -u_{3z}^{\alpha-M_z-1} = u_{4z}^{\alpha-M_z K_x} = -u_{5z}^{\alpha-M_z K_x - 1} = u_{6z}^{\alpha-M_z K_x - M_z} = -u_{7z}^{\alpha-M_z K_x - M_z - 1}$$

$K_x$, $L_y$, and $M_z$ are the maximum number of elementary volumes α in the optical element in the x-direction (rows), the y-direction (columns) and the z-direction (planes), respectively.

An enumeration matrix $Q_{ks,i}^{\alpha}$ is introduced which connects the coordinates of the internal nodes $\xi_i$ with the displacement of the corner points of the elementary volume α:

$$u_{ks}^{\alpha} = \sum_{i=1}^{3 \cdot (K_x+1) \cdot (L_y+1) \cdot (M_z+1)} Q_{ks,i}^{\alpha} \xi_i \quad (40)$$

Using the enumeration of equation 40, all the components of the linear system of equation 36 can be expressed:

$$\sum_{m}^{3 \cdot (K_x+1) \cdot (L_y+1) \cdot (M_z+1)} P_{nm}^g \xi_m - \sum_{\alpha=1}^{K_x \cdot L_y \cdot M_z} \sum_{l=0}^{7} \sum_{t=0}^{2} P_{nlt\alpha}^w w_{lt}^{\alpha} = 0 \quad (41)$$

wherein the $P_{nm}^g$ is:

$$P_{nm}^g = \sum_{k=0,l=0}^{7,7} \sum_{s=0,t=0}^{2,2} \sum_{\alpha=1}^{K_x \cdot L_y \cdot M_z} Q_{ks,n}^{\alpha} P_{ks,lt}^{g,\alpha} Q_{lt,m}^{\alpha} \quad (42)$$

and a part of the potential matrix which is associated with the new cell equilibrium positions $P_{nlt\alpha}^w$ is:

$$P_{nlt\alpha}^w = \sum_{k=0}^{7} \sum_{s=0}^{2} Q_{ks,n}^{\alpha} P_{ks,lt}^{g,\alpha} \quad (43)$$

Equation 41 is the starting point for the description of all the different aspects of the inventive principle discussed in the preceding section. It is important to note that the determinant of the matrix $P_{ij}^g$ is zero due to the invariance of the potential energy of the overall optical element or the wafer versus a rotation and a translational movement. This condition is always automatically fulfilled by adding a condition with respect to the resulting translational movement and the rotation of the optical element or the wafer. This means that it is always possible to calculate the inverse matrix (second order tensor) $(P_{ij}^g)^{-1}$ of the normalized matrix $P_{ij}^g$. Thus, equation 41 allows the computation of the deformations resulting from locally directing the laser beam into a portion of the optical element or a wafer for known equilibrium deformations of the elementary volume α. The relation is expressed by:

$$\xi = (P^g)^{-1} P^w W \quad (44)$$

In order to link the resulting deformations with the causative laser beam, or to be more precisely with the laser beam parameters and with the writing mode of the laser beam, the resulting volume deformations are expressed in an accurate terminology for the writing mode signature (or the laser beam parameter) and the writing mode density. A uniform writing means that the writing density is constant in each of the x-, y-, and z-direction in the elementary volume α. As already mentioned above, the writing density comprises three linear densities which can individually be modified.

The writing density in the elementary volume α is also called writing mode density $a^{\alpha}$. A change of the coordinates of the corner points of the elementary volume α for a unity writing density is denoted as $e_{lt}^{\alpha}$. It is now assumed that one single writing mode is used for every elementary volume α of the optical element and only varying the writing density $a^{\alpha}$. This means that the same laser beam parameters are used for every elementary volume α and that only the writing density or pixel density is modified. Equation 44 can be rewritten in a form:

$$\xi_n = \sum_{m=0, l=0, t=0, \alpha=1}^{8 \cdot K_x \cdot L_y \cdot M_z, 7, 2, K_x \cdot L_y \cdot M_z} (P_{nm}^g)^{-1} P_{ml t\alpha}^w a^{\alpha} e_{lt} \quad (45)$$

wherein $e_{lt}^{\alpha}$ denotes the 24 displacements of the eight corner points of the elementary volume α.

By performing the summation over l and t and by denoting $$A_{n\alpha} = \sum_{l=0, t=0}^{7,2} P_{nlt\alpha}^w e_{lt},$$

equation 45 is of the form:

$$\xi_n = \sum_{m=0}^{8 \cdot K_x \cdot L_y \cdot M_z} \sum_{\alpha=1}^{K_x \cdot L_y \cdot M_z} (P_{nm}^g)^{-1} A_{m\alpha} a^{\alpha} \quad (46)$$

This equation states that the deformation at the internal node $\xi_i$ is a linear combination of the writing density $a^{\alpha}$ of every elementary volume α for a fixed writing mode.

Equation 46 supposes that the writing of the laser beam is performed with a fixed writing mode or a fixed set of laser beam parameters and with a fixed writing mode density $a^{\alpha}$. The deformation property of the writing mode is coded in equilibrium volume deformations $e_{lt}$ for unity writing, i.e. for a single writing density $a^{\alpha}$. Actually the 24 components of the volume deformations at the eight corner points of an elementary volume α are functions of 18 independent ones. Three virtual translations of an elementary volume α of the optical element as well as three rotations of the elementary volume α of the optical element around three independent coordinates do not contribute to the potential energy. Using the 18 independent components, it is possible to construct an orthonormal set of 18 unity vectors $n^i$ from the 24 equilibrium volume deformations $e_{lt}$.

$$n^i = \sum_{j=1}^{24} N_{ij}^{-1} e^j N_{ij}^{-1} e^j \quad (47)$$

wherein $$e^j = \{e_k^j\}, e_k^j = \delta_{kj} \quad (48)$$

and where $N_{ij}^{-1} = (n^i, e^j)$ is a matrix which converts the basis $e^j$ to the basis $n^i$. The orthonormal set of unity vectors $n^i$ fulfills the following equations:

$$(n^i, n^j) = \delta_{ij} \quad (49)$$

$$\left(n^i, \sum_{k=0}^{7} e^{3 \cdot k}\right) = 0, \left(n^i, \sum_{k=0}^{7} e^{3 \cdot k+1}\right) = 0, \left(n^i, \sum_{k=0}^{7} e^{3 \cdot k+2}\right) = 0,$$

$$\left(n^i, \sum_{k=0}^{7} (e^{3 \cdot k+1} - e^{3 \cdot k+2})\right) = 0, \left(n^i, \sum_{k=0}^{7} (e^{3 \cdot k} - e^{3 \cdot k+2})\right) = 0,$$

$$\left(n^i, \sum_{k=0}^{7} (e^{3 \cdot k+1} - e^{3 \cdot k})\right) = 0 \quad (50)$$

Projections to this set of unity vectors will be used as a representation of the writing mode which is denoted as a writing mode signature and is abbreviated as MS. The writing mode signature represents a property of the writing tool or of the laser system for a selected type of the writing and for a set of laser beam parameters having a predefined set of physical and geometrical properties. Using the notation of equations 37 to 50 and the equation $$e_{ks} = \sum_{i=0}^{17} \eta_{3 \cdot k+s,i} MS_i, \quad (51)$$

equation 45 can be rewritten:

$$\xi_n = \sum_{o=0}^{8 \cdot K_x \cdot L_y \cdot M_z} \sum_{k=0}^{7} \sum_{s=0}^{2} \sum_{\alpha=1}^{K_x \cdot L_y \cdot M_z} \sum_{i=0}^{17} (P_{no}^g)^{-1} P_{oks\alpha}^w a^\alpha \eta_{3 \cdot k+s,i} MS_i = \quad (52)$$

$$= \sum_{o=0}^{8 \cdot K_x \cdot L_y \cdot M_z} \sum_{i=0}^{17} (P_{no}^g)^{-1} E_{oi} MS_i$$

wherein $E_{oi}$ is:

$$E_{oi} = \sum_{k=0}^{7} \sum_{s=0}^{2} \sum_{\alpha=1}^{K_x \cdot L_y \cdot M_z} P_{oks\alpha}^w a^\alpha \eta_{3 \cdot k+s,i} \quad (53)$$

Equation 52 provides a clear instruction how to determine the mode signature $MS_i$ from experimental data: Pixels are written in the optical element having a selected writing mode or a parameter set of the laser beam. Then the resulting displacements $\xi_n$ are determined. Finally, the inverse matrix of equation 53 is multiplied with the determined displacements $\xi_n$. The following equation expresses the last step:

$$MS_i = \sum_{o=0}^{8 \cdot K_x \cdot L_y \cdot M_z} \sum_{n=1}^{17} (E_{io})^{-1} P_{on}^g \xi_n \quad (54)$$

This section provides an explanation of the theoretic concept. Further, it also explains the theory or the concept of the determination of writing mode signatures and the writing densities from experimental data.

However, presently displacements $\xi_n$ can only be determined with a limited accuracy. This makes the multiplication of the inverse matrix $(E_{oi})^{-1}$ problematic due to zero eigenvalues of the matrix $E_{oi}$. Therefore, presently a modified approach for the determination of the writing modes and the writing mode densities is used. This is not a fundamental limitation of the theory presented above, but a temporal experimental restriction.

During the derivation of the concept it has been assumed that the volume deformations introduced in the elementary volume $\alpha$ of the optical element by different writes modes are additive. Thus, different selected writing modes are introduced in an optical element or a wafer and their combined displacements $\xi_n$ are determined. The resulting displacements or deformations $\xi_n$ are derived from equation 46 as a summation of the used writing modes m:

$$\xi_n = \sum_{o=1, \alpha=1, m=1}^{8 \cdot K_x \cdot L_y \cdot M_z, K_x \cdot L_y \cdot M_z, R} (P_{no}^g)^{-1} A_{o\alpha} a_m^\alpha \quad (55)$$

where R is the number of different writing modes which are considered in equation 55.

Thus, equation 55 allows the determination of the displacements $\xi_n$ which results for any set of writing maps or writing densities $\alpha_m^\alpha$ if the mode signature $MS_i$ is known for all writing modes.

It is now assumed that a 3D contour of an optical element $\varphi_j^{d\ et.}$ is determined at a set of locations $X_j$, $Y_j$, $Z_j$, $j=1, \ldots, L$. For example, the 3D contour can be measured at the set of locations. Deviations $\Delta\varphi_j$ of the set of locations from predetermined $\varphi_j^{predet.}$ locations of the optical element can be determined according to:

$$\Delta\varphi_j = \varphi_j^{pred\ et.} - \varphi_j^{det.} \quad (56)$$

The deviations $\Delta\varphi_j$ have to be corrected by locally directing a laser beam onto the optical element. In the approximation discussed above the volume deformations introduced in the elementary volume $\alpha$ in the optical element are additive to all deviations $\Delta\varphi_j$ However, the displacements are only known at the nodes $\xi_i$ of the elementary volumes $\alpha$ of the optical element. Using the assumptions that the deformations inside the elementary volumes $\alpha$ show a linear behavior, a matrix can be generated which transforms the magnitudes of the displacements at the nodes $\xi_i$ to the magnitude at the desired location $\zeta_i$ of the 3D contour of the optical element. This transformation can be executed by using the equation 40:

$$\zeta_i = \sum_{j=1}^{3 \cdot (K_x+1) \cdot (L_y+1) \cdot (M_z+1)} M_{ij} \xi_j \quad (57)$$

Here $\zeta_i$ is the result of a linear interpolation or of a linear combination of computed displacements $\xi_i$ at locations $X_i$, $Y_i$, $Z_i$. The matrix $M_{ij}$ has a dimension of $L \times 3 \cdot (K_x+1) \cdot (L_y+1) \cdot (M_z+1)$. Actually this matrix has only 24 diagonal elements because every location is interpolated by using only eight corners points of the elementary volume α as has already been discussed.

Hence, the resulting 3D contour at a selected location i in the optical element or the wafer after the application of ultra-short laser pulses is:

$$\Delta \varphi_i + \zeta_i \qquad (58)$$

In order to bring the determined locations $\varphi_j^{d\ et.}$ of the optical element or the wafer in accordance with the predetermined locations $\varphi_j^{pred\ et.}$, the parameters of the writing mode(s) are selected and the writing mode density/densities in the elementary volume α are identified which minimize the target functional Φ, i.e. it has to be solved:

$$\min\{\Phi(\Delta\varphi+\zeta)\} \qquad (59)$$

In order to minimize the target functional Φ the displacements $\zeta_i$ are varied in order to bring the determining 3D contour $\varphi_i^{d\ et}$ in accordance with the predetermined 3D contour $\varphi_i^{pred\ et}$ of the optical element.

From a computational point of view, it is convenient to select the target functional as a mean square of the residual displacements which transforms equation 59 to:

$$\min\left\{\sum_{i=1}^{L} (\Delta\varphi_i + \zeta_i)^2 + \sum_{m=1, j=1}^{R, K_x \cdot L_y \cdot M_z} \lambda_m^a a_j^{m^2}\right\} \qquad (60)$$

A Tikhonov regularization has been added to the target functional (last term in equation 60) to make sure that the result will define a physically reasonable solution. The regularization coefficients λ have to be selected to be small enough, so that they do not introduce a significant change to the solution.

What is claimed is:

1. A method for generating a predetermined three-dimensional contour in a volume of at least a portion of an optical component and/or a wafer, the method comprising:
   a. partitioning the volume into elementary volumes;
   b. for each of the elementary volumes, determining a deviation of an existing three-dimensional contour of the elementary volume from the predetermined three-dimensional contour;
   c. determining, for each elementary volume, deformations that will be induced in the elementary volume if predefined three-dimensional arrangements of laser pulses are applied to the elementary volume;
   d. calculating at least one three-dimensional arrangement of laser pulses having one or more parameter sets defining the laser pulses for correcting the determined deviation of the existing three-dimensional contour of the elementary volumes from the predetermined three-dimensional contour based on the determined deformations that will be induced in the elementary volumes if the predefined three-dimensional arrangements of laser pulses are applied to the elementary volumes; and
   e. applying the calculated at least one three-dimensional arrangement of laser pulses on the optical component and/or the wafer for generating the predetermined three-dimensional contour, wherein the determined deviation of the existing three-dimensional contour of the elementary volumes from the predetermined three-dimensional contour is corrected taking into account of the determined deformations induced in the elementary volumes by the predefined three-dimensional arrangements of laser pulses.

2. The method of claim 1, wherein determining, for each elementary volume, deformations that will be induced in the elementary volume comprises determining deformations that will be induced in the elementary volume if predefined three-dimensional arrangements of laser pulses having predefined parameter sets and/or having predefined distances of laser pulses in three directions in the arrangements of laser pulses are applied to the elementary volume, wherein the three directions are not within a plane.

3. The method of claim 1, wherein calculating the at least one three-dimensional arrangement of laser pulses comprises:
   d. setting up a target functional comprising deviations of the existing three-dimensional contour of the optical component and/or the wafer from the predetermined three-dimensional contour and volume deformations induced by the at least one three-dimensional arrangement of laser pulses; and
   e. minimizing the target functional by varying the at least one three-dimensional arrangement of laser pulses.

4. The method of claim 3, further comprising using a Lagrange variational principle for minimizing the target functional.

5. The method according to claim 1, wherein the parameter set defining the laser pulses comprises: an energy of the laser beam, a pulse length, a repetition rate, a number of pulses directed onto one location of the optical component and/or the wafer, a beam polarization, a numerical aperture, a focus size, a beam shape, and/or an astigmatism.

6. The method according to claim 1, wherein parameters of the at least one three-dimensional arrangement of laser pulses comprise a size of the arrangement in three directions and a distance between two or more incident laser pulses in three dimensions.

7. The method according to claim 1, further comprising modifying a mass density and/or an optical transmission of the optical component and/or the wafer by a stress distribution induced by a strain distribution caused by laser pulses, and wherein the stress distribution and the strain distribution are connected by Hooke's law.

8. The method according to claim 1, further comprising introducing a three-dimensional grid with nodes $N_i$ penetrating the optical component and/or the wafer, the three-dimensional grid nodes $N_i$ defining elementary volumes α.

9. The method according to claim 8, wherein a displacement $\xi_i$ of the three-dimensional grid node $N_i$ is a function of the parameter set of the laser pulses and/or the parameters of the at least one arrangement of laser pulses.

10. The method according to claim 9, further comprising determining at least one three-dimensional writing density $\alpha^\alpha$ and a plurality of writing mode signatures $MS_i^m$, wherein $MS_i$ denotes components of a single writing mode signature and m counts the plurality of writing mode signatures.

11. The method according to claim 10, wherein the three-dimensional writing density $\alpha^\alpha$ in an elementary volume α and the writing mode signature $MS_i$ introduce a displacement $\xi_n$ given by $$\xi_n = \sum_{o=0}^{8 \cdot K_x \cdot L_y \cdot M_z} \sum_{k=0}^{7} \sum_{s=0}^{2} \sum_{\alpha=1}^{K_x \cdot L_y \cdot M_z} \sum_{i=0}^{17} (P_{no}^g)^{-1} P_{oksa}^w a^\alpha \eta_{(3k+s)i} MS_i,$$

wherein the tensor $(P_{no}^g)^{-1}$ is the inverse tensor of a potential operating in a displacement space, and $P_{oks\alpha}^w$ is an element of the tensor operating in a space of normal elementary volume deformation modes, both tensors comprise material parameters of the optical component and/or the wafer, and wherein $$\sum_{J=0}^{17} \eta_{ij} MS_j$$

are projections of equilibrium deformation displacements for unity writing to the writing mode signature $MS_i$.

12. The method of claim 11, wherein the at least one writing density of the laser beam is below a damage threshold of the optical component and/or the wafer.

13. The method of claim 9, further comprising determining the displacement $\xi_n$ of the three-dimensional grid $N_n$ of an elementary volume $\alpha$ of the optical component and/or the wafer without interactions of the elementary volume $\alpha$ with other elementary volumes of the optical component and/or the wafer.

14. The method of claim 13, further comprising determining a total deformation of the optical component and/or the wafer by combining the elementary volumes of the optical component and/or the wafer and minimizing an accumulated potential energy of the combined elementary volumes.

15. The method according to claim 8, wherein a three-dimensional writing density $\alpha^\alpha$ of an arrangement of laser pulses across the optical component and/or the wafer induces a displacement $\xi_n$ of the grid node $N_n$ in an elementary volume $\alpha$ of the optical component and/or the wafer given by $$\xi_n = \sum_{0=1, \alpha=1}^{8 \cdot K_x \cdot L_y \cdot M_z, K_x \cdot L_y \cdot M_z} (P_{no}^g)^{-1} A_{o\alpha} a^\alpha,$$

wherein the tensor $(P_{no}^g)^{-1}$ is the inverse tensor of a potential operating in the displacement space, and $$A_{n\alpha} = \sum_{l=0, t=0}^{7,2} P_{nlt\alpha}^w e_{lt},$$

wherein $P_{nlt\alpha}^w$ is an element of the tensor describing the potential operating in the space of normal elementary volume deformation modes, both tensors comprise material parameters of the optical component and/or the wafer, and wherein $e_{lt}$ are equilibrium deformation displacements of the grid nodes $N_l$ of the elementary volume $\alpha$ for a unity writing density.

16. The method according to claim 8, wherein the three-dimensional writing densities $\alpha_m^\alpha$ of R arrangements of laser pulses across the optical component and/or the wafer superimposed in an elementary volume $\alpha$ introduce a displacement $\xi_n$ given by $$\xi_n = \sum_{0=1, \alpha=1, m=1}^{8 \cdot K_x \cdot L_y \cdot M_z, K_x \cdot L_y \cdot M_z, R} (P_{no}^g)^{-1} A_{o\alpha} a_m^\alpha.$$

17. The method of claim 8, wherein step a. further comprises: measuring the existing three-dimensional contour of the optical component and/or the wafer.

18. The method of claim 17, wherein measuring the existing three-dimensional contour comprises: using a contact profilometer, a pseudo-contact profilometer, a non-contact profilometer, an interferometer, a white light interferometer, a confocal microscope, a photomask metrology tool, a scanning electron microscope and/or a combination of these devices.

19. The method of claim 8, wherein step a. further comprises:
determining deviations $\Delta\varphi_i$ of the three-dimensional contour of the optical component and/or the wafer at positions i from the difference of determined existing locations $\varphi_i^{det.}$ and predetermined locations $\varphi_i^{pred.\ et.}$.

20. The method of claim 19, wherein step b. further comprises: minimizing a target functional $$\min\left\{\sum_{i=1}^{L} (\Delta\varphi_i + \zeta_i)^2 + \sum_{m=1, j=1}^{R, K_x \cdot L_y \cdot M_z} \lambda_m^a a_j^{m^2}\right\},$$

wherein $\zeta_i$ is the displacement at the position i generated by R writing densities $\alpha_j^m$, and wherein the last term is a Tikhonow regularization with the regulation coefficients $\lambda$.

21. The method according to claim 8, further comprising applying laser pulses to the optical component and/or the wafer which can essentially transmit the optical component and/or the wafer.

22. The method according to claim 8, further comprising selecting a wavelength of the laser pulses so that a photon energy of the laser pulses is lower than a band gap energy of the optical component and/or the wafer.

23. The method according to claim 8, wherein the photon energy of the laser pulses is lower than 0.95 the band gap energy of the optical component and/or the wafer.

24. The method according to claim 1, wherein the photon energy of the laser pulses is lower than 0.95 the band gap energy of a material of a processed wafer having the lowest band gap energy, and wherein the processed wafer comprises one or more integrated circuits or at least a part of one or more integrated circuits.

25. The method according to claim 1, wherein the component comprises an optical component for extreme ultraviolet wavelength radiation.

26. The method according to claim 25, wherein the optical component for extreme ultraviolet wavelength radiation comprises a transparent conductive coating on a rear surface which is opposite to a front surface having a multilayer structure, and wherein the transparent conductive layer is optically transparent in the near infrared, the visible, and/or the near ultraviolet wavelength range.

27. The method according to claim 26, wherein the transparent conductive coating comprises tin oxide, indium tin oxide, antimony tin oxide, aluminium zinc oxide, or a combination of these materials.

28. The method according to claim 26, wherein step a. comprises: determining a flatness deviation of the rear surface of the optical component for extreme ultraviolet radiation, and step c. comprises: applying the calculated at least one three-dimensional arrangement of laser pulses for flattening the rear surface of the optical component for extreme ultraviolet radiation.

29. The method according to claim 26, wherein step a. comprises: determining the flatness deviation of the rear surface of a photolithographic mask for extreme ultraviolet radiation after arranging the multilayer structure and an absorber layer on the front surface, but before patterning the absorber layer, and step c. comprises: applying the calculated at least one three-dimensional arrangement of laser pulses for flattening the rear surface of the photolithographic mask for extreme ultraviolet radiation.

30. The method according to claim 26, wherein step a. comprises: determining the flatness deviation of the rear surface of the optical component for extreme ultraviolet radiation after removing the multilayer structure from a peripheral area of the front surface, and step c. comprises: applying the calculated at least one three-dimensional arrangement of laser pulses for flattening the rear surface of the optical component for extreme ultraviolet radiation.

31. The method according to claim 26, wherein step a. comprises: determining the flatness deviation of the multilayer structure of the optical component for extreme ultraviolet radiation from a predetermined flatness of the multilayer structure, and step c. comprises: applying the calculated at least one three-dimensional arrangement of laser pulses for generating the predetermined flatness of the multilayer structure of the optical component for extreme ultraviolet radiation.

32. The method according to claim 1, wherein step a. comprises: determining the deviation of pattern elements of a transmissive photolithographic mask from a predetermined pattern, and step c. comprises: applying the calculated at least one three-dimensional arrangement of laser pulses for generating the predetermined pattern.

33. The method according to claim 1, wherein step a. comprises: determining the deviation of an optical transmission across a transmissive photolithographic mask from a predetermined optical transmission, and step c. comprises: applying the calculated at least one three-dimensional arrangement of laser pulses for generating the predetermined optical transmission.

34. The method according to claim 1, wherein step a. comprises: determining the deviation of pattern elements and the optical transmission across a transmissive photolithographic mask from the predetermined pattern and the predetermined optical transmission, and step c. comprises: applying the calculated at least one three-dimensional arrangement of laser pulses for simultaneously generating the predetermined pattern and the predetermined optical transmission across the transmissive photolithographic mask.

35. The method according to claim 1, wherein step a. comprises: determining the deviation of a flat optical component from a predetermined three-dimensional optical contour, and step c. comprises: applying the calculated at least one three-dimensional arrangement of laser pulses for generating the predetermined three-dimensional optical contour of the originally flat optical component.

36. The method according to claim 1, wherein step a. comprises: determining the deviation of a spherical contour of an optical component from a predetermined aspherical contour, and step c. comprises: applying the calculated at least one three-dimensional arrangement of laser pulses for generating the predetermined aspherical contour of the optical component.

37. The method according to claim 1, wherein step a. comprises: determining the deviation of a contact surface of a frustrated total internal reflection shutter from a predetermined contact surface of the frustrated total internal reflection shutter, and step c. comprises: applying the calculated at least one three-dimensional arrangement of laser pulses for generating the predetermined contact surface of the frustrated total internal reflection shutter.

38. The method according to claim 1, wherein step a. comprises: determining the deviation of the three-dimensional contour of a nanoimprint lithography template from the predetermined three-dimensional contour of the nanoimprint lithography template, and step c. comprises: applying the calculated at least one three-dimensional arrangement of laser pulses for generating the predetermined three-dimensional contour of the nanoimprint lithography template.

39. The method according to claim 1, wherein the wafer comprises a semiconductor material or wherein the wafer comprises compound semiconductor material.

40. The method according to claim 39, wherein the semiconductor material comprises silicon.

41. The method according to claim 39, wherein the wafer comprises at least a portion of one or more integrated circuits.

42. The method according to claim 39, wherein the wafer comprises silicon and the wavelength of the laser pulses is in the range of 1.0 μm-8.0 μm.

43. The method according to claim 39, wherein introducing the calculated at least one three-dimensional arrangement of laser pulses into the wafer bends the wafer.

44. The method according to claim 39, wherein introducing the calculated at least one three-dimensional arrangement of laser pulses into the wafer compensates a bending of the wafer occurring during processing the wafer.

45. The method according to claim 39, wherein the at least one three-dimensional arrangement of laser pulses is asymmetrically introduced into the wafer with respect to the depth of the wafer.

46. The method according to claim 39, wherein the wafer comprises a micro-electromechanical system (MEMS) and/or a photonic integrated circuit.

47. The method according to claim 39, further comprising:
    f. determining a remaining deviation of a generated three-dimensional contour of the optical component and/or the wafer from the predetermined three-dimensional contour;
    g. ending the method if the remaining deviation is smaller than a predetermined threshold; and
    h. repeating steps b. and c. if the remaining deviation is larger or equal than the predetermined threshold.

48. The method according to claim 39, wherein the optical component and/or the wafer is optically transparent in the near infrared, the visible, and/or the near ultraviolet wavelength range.

49. The method of claim 1 in which partitioning the volume into elementary volumes comprises partitioning the volume into at least one of parallelepipeds, cuboids, or tetrahedrons.

50. An apparatus for generating a predetermined three-dimensional contour in a volume of at least a portion of an optical component and/or a wafer, the apparatus comprising:
    a. a metrology tool operable to partition the volume into elementary volumes, and for each of the elementary volumes, determine a deviation of an existing three-dimensional contour of the elementary volume from the predetermined three-dimensional contour;
    b. a computing unit operable to determine, for each elementary volume, deformations that will be induced in the elementary volume if predefined three-dimensional arrangements of laser pulses are applied to the elementary volume, and calculate at least one three-dimensional arrangement of laser pulses having one or more parameter sets defining the laser pulses for correcting the determined deviation of the existing three-dimensional contour of the elementary volumes from the predetermined three-dimensional contour based on the determined deformations that will be induced in the elementary volumes if the predefined three-dimensional arrangements of laser pulses are applied to the elementary volumes; and c. a light source operable to apply the calculated at least one three-dimensional arrangement of laser pulses for generating the predetermined three-dimensional contour of the optical component and/or the wafer, wherein the determined deviation of the existing three-dimensional contour of the elementary volumes from the predetermined three-dimensional contour is corrected taking into account of the determined deformations induced in the elementary volumes by the predefined three-dimensional arrangements of laser pulses.

51. The apparatus of claim 50, wherein the metrology tool comprises a contact profilometer, a pseudo-contact profilometer, a non-contact profilometer, an interferometer, a white light interferometer, a confocal microscope, photomask metrology tool, and/or a scanning electron microscope.

52. The apparatus of claim 50, wherein the computing unit comprises a microprocessor, a general purpose processor, a special purpose processor, a central processing unit and/or a combination thereof.

53. The apparatus of claim 50, wherein the light source comprises a laser source operable to generate a beam of ultra-short laser pulses and a scanning means operable to generate the at least one arrangement of laser pulses.

54. The apparatus of claim 53, wherein the laser source comprises a Ti: sapphire laser system and/or a YAG laser system doped with at least one element of the group which comprises: neodymium (Nd), thulium (Tm), holmium (Ho), and erbium (Er).

55. The apparatus of claim 50, wherein the apparatus is adapted to be integrated in a semiconductor manufacturing equipment in a semiconductor factory.

56. A method for generating a predetermined three-dimensional contour in a volume of at least a portion of an optical component and/or a wafer, the method comprising:
 a. partitioning the volume into elementary volumes;
 b. for each of the elementary volumes, determining a deviation of an existing three-dimensional contour of the elementary volume from the predetermined three-dimensional contour;
 c. determining, for each elementary volume, a first volume deformation that will be induced in the elementary volume if predefined three-dimensional arrangements of laser pulses are applied to the elementary volume;
 d. determining, for each elementary volume, a second volume deformation that will be induced in the elementary volume due to effects from predefined three-dimensional arrangements of laser pulses applied to the elementary volume and effects from predefined three-dimensional arrangements of laser pulses applied to other elementary volumes, in which the predefined three-dimensional arrangements of laser pulses applied to different elementary volumes can be the same or different;
 e. calculating at least one three-dimensional arrangement of laser pulses having one or more parameter sets defining the laser pulses for correcting the determined deviation of the existing three-dimensional contour from the predetermined three-dimensional contour based on the determined second volume deformations that will be induced in the elementary volumes by applying the predefined three-dimensional arrangements of laser pulses; and
 f. applying the calculated at least one three-dimensional arrangement of laser pulses on the optical component and/or the wafer for generating the predetermined three-dimensional contour, wherein the determined deviation of the existing three-dimensional contour of the elementary volumes from the predetermined three-dimensional contour is corrected taking into account of the determined second volume deformations induced in the elementary volumes by the predefined three-dimensional arrangements of laser pulses.

57. The method of claim 56 in which partitioning the volume into elementary volumes comprises partitioning the volume into at least one of parallelepipeds, cuboids, or tetrahedrons.

58. A method for generating a predetermined three-dimensional contour in a volume of at least a portion of an optical component and/or a wafer, the method comprising:
 partitioning the volume into elementary volumes;
 for each of the elementary volumes, determining a deviation of an existing three-dimensional contour of the elementary volume from the predetermined three-dimensional contour;
 calculating, for each of the elementary volumes, at least one three-dimensional arrangement of laser pulses having one or more parameter sets defining the laser pulses for correcting the determined deviation of the existing three-dimensional contour of the elementary volume from the predetermined three-dimensional contour, comprising:
  setting up a target functional comprising a linear combination of components, in which each component includes a first sub-component representing a deviation of the existing three-dimensional contour of one of the elementary volumes from the predetermined three-dimensional contour, and a second sub-component representing a volume deformation induced in the one of the elementary volumes by at least one three-dimensional arrangement of laser pulses, and
  minimizing the target functional by varying the at least one three-dimensional arrangement of laser pulses; and
 for each of the elementary volumes, applying the calculated at least one three-dimensional arrangement of laser pulses to the elementary volume for generating the predetermined three-dimensional contour, wherein the determined deviation of the existing three-dimensional contour of the elementary volumes from the predetermined three-dimensional contour is corrected in such a way so as to minimize the target functional comprising the linear combination of components, in which each component includes the first sub-component representing the deviation of the existing three-dimensional contour of one of the elementary volumes from the predetermined three-dimensional contour, and the second sub-component representing the volume deformation induced in the one of the elementary volumes by the at least one three-dimensional arrangement of laser pulses.

* * * * *

UNITED STATES PATENT AND TRADEMARK OFFICE
CERTIFICATE OF CORRECTION

PATENT NO.        : 10,353,295 B2
APPLICATION NO.   : 15/272936
DATED             : July 16, 2019
INVENTOR(S)       : Vladimir Dmitriev and Bernd Geh It is certified that error appears in the above-identified patent and that said Letters Patent is hereby corrected as shown below:

On the Title Page

Page 2
Column 2 item (56), (Other Publications), Line 8, delete "crystallin" and insert -- crystalline --

In the Specification

Column 6
Line 64, delete "Tikhonow" and insert -- Tikhonov --

Column 26
Line 17 (approx.), delete "$F(x, y) = \alpha \cdot x^2 + b \cdot x \cdot y + c \cdot y^2$" and insert -- $F(x, y) = a \cdot x^2 + b \cdot x \cdot y + c \cdot y^2$ --
Line 20 (approx.), delete "$\alpha = -1.6 \cdot 10^{-10}$" and insert -- $a = -1.6 \cdot 10^{-10}$ --

Column 30
Line 3, delete "μ//m" and insert -- μm --
Line 26, delete "$\alpha = 100 \, cm^{-1}$" and insert -- $a = 100 \, cm^{-1}$ --
Line 27, delete "$\alpha = 0.02 \, cm^{-1}$" and insert -- $a = 0.02 \, cm^{-1}$ --

Column 32
Line 10, after "$I(z) = I_0 \cdot e^{-a \cdot z}$" and insert -- , --
Line 16 (approx.), after "$W(b) = W_0 \cdot e^{-a \cdot b}$" insert -- , --

Line 23 (approx.), after "$\Delta W = W_0 - W(b) = W_0 \left(1 - e^{-a \cdot b}\right) \approx W_0 \left(1 - (1 - a \cdot b)\right) = W_0 \cdot a \cdot b$" insert -- . --

Signed and Sealed this
Eighth Day of October, 2019

Andrei Iancu
*Director of the United States Patent and Trademark Office*

In the Claims

Column 54
Line 54, in Claim 10, delete "$\alpha^a$" and insert -- $a^\alpha$ --
Line 58, in Claim 11, delete "$\alpha^a$" and insert -- $a^\alpha$ --
Line 64 (approx.), in Claim 11, delete "$$\xi_n = \sum_{o=0}^{8 \cdot K_x \cdot L_y \cdot M_z} \sum_{k=0}^{7} \sum_{s=0}^{2} \sum_{\alpha=1}^{K_x \cdot L_y \cdot M_z} \sum_{i=0}^{17} \left(P_{no}^{g}\right)^{-1} P_{oks\alpha}^{w} \alpha^{\alpha} \eta_{(3k+s)i} MS_i$$" and insert -- $$\xi_n = \sum_{o=0}^{8 \cdot K_x \cdot L_y \cdot M_z} \sum_{k=0}^{7} \sum_{s=0}^{2} \sum_{\alpha=1}^{K_x \cdot L_y \cdot M_z} \sum_{i=0}^{17} \left(P_{no}^{g}\right)^{-1} P_{oks\alpha}^{w} a^{\alpha} \eta_{(3k+s)i} MS_i$$ --

Column 56
Line 17 (approx.), in Claim 19, delete "$\varphi_i^{det.}$" and insert -- $\varphi_i^{det.}$ --
Line 17 (approx.), in Claim 19, delete "$\varphi_i^{pred\,et.}$" and insert -- $\varphi_i^{predet.}$ --
Line 27 (approx.), in Claim 20, delete "writing densities $\alpha_j^m$" and insert -- writing densities $a_j^m$ --
Line 28 (approx.), in Claim 20, delete "Tikhonow" and insert -- Tikhonov --